(12) United States Patent
Lugthart et al.

(10) Patent No.: US 10,148,414 B2
(45) Date of Patent: Dec. 4, 2018

(54) DESKEW IN A HIGH SPEED LINK

(71) Applicant: INPHI CORPORATION, Santa Clara, CA (US)

(72) Inventors: Marcel Louis Lugthart, Laguna Hills, CA (US); Jeffrey Zachan, Newport Beach, CA (US); Linghsiao Jerry Wang, Irvine, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/639,741

(22) Filed: Jun. 30, 2017

(65) Prior Publication Data

US 2017/0302431 A1 Oct. 19, 2017

Related U.S. Application Data

(63) Continuation of application No. 15/172,595, filed on Jun. 3, 2016, now Pat. No. 9,742,550, which is a
(Continued)

(51) Int. Cl.
*H04L 7/00* (2006.01)
*H04L 7/033* (2006.01)
(Continued)

(52) U.S. Cl.
CPC ............ *H04L 7/0037* (2013.01); *H03M 5/12* (2013.01); *H04B 1/40* (2013.01); *H04L 5/14* (2013.01); *H04L 7/0016* (2013.01); *H04L 7/0054* (2013.01); *H04L 7/0062* (2013.01); *H04L 7/0087* (2013.01); *H04L 7/033* (2013.01); *H04L 25/03* (2013.01); *H04L 25/03006* (2013.01);
(Continued)

(58) Field of Classification Search
CPC ..... H04L 7/0016; H04L 7/0054; H04L 25/14; H04L 7/0062
See application file for complete search history.

(56) References Cited

U.S. PATENT DOCUMENTS 6,215,793 B1 4/2001 Gultekin et al.
6,603,754 B1 8/2003 Park
(Continued)

FOREIGN PATENT DOCUMENTS

KR 10-2011-0094839 8/2011

OTHER PUBLICATIONS

Sakurai et al. Development of High-Speed 10-Gb/s Interface Cable "Thunderbolt Cable", SEI Technical Review, Oct. 2012, No. 75, pp. 120-124.
(Continued)

*Primary Examiner* — Jean B Corrielus
(74) *Attorney, Agent, or Firm* — Richard T. Ogawa; Ogawa P.C.

(57) ABSTRACT

Systems and methods for high speed communications are described herein. In certain aspects, the systems and methods include innovative transceiver architectures and techniques for re-timing, multiplexing, de-multiplexing and transmitting data. The systems and methods can be used to achieve reliable high-speed point-to-point communication between different electronic devices, computing devices, storage devices and peripheral devices.

20 Claims, 24 Drawing Sheets

Related U.S. Application Data continuation of application No. 14/581,979, filed on Dec. 23, 2014, now Pat. No. 9,379,878.

(60) Provisional application No. 61/982,233, filed on Apr. 21, 2014, provisional application No. 61/927,404, filed on Jan. 14, 2014, provisional application No. 61/921,360, filed on Dec. 27, 2013.

(51) Int. Cl.

| | |
|---|---|
| H04L 25/03 | (2006.01) |
| H04L 25/14 | (2006.01) |
| H04B 1/40 | (2015.01) |
| H04L 5/14 | (2006.01) |
| H04L 27/38 | (2006.01) |
| H03M 5/12 | (2006.01) |
| H04L 27/02 | (2006.01) |
| H04L 12/911 | (2013.01) |
| H04L 7/02 | (2006.01) |

(52) U.S. Cl.
CPC ............. *H04L 25/14* (2013.01); *H04L 27/02* (2013.01); *H04L 27/38* (2013.01); *H04L 47/70* (2013.01); *H04L 7/02* (2013.01)

(56) References Cited

U.S. PATENT DOCUMENTS

| | | | | |
|---|---|---|---|---|
| 6,791,370 | B1 * | 9/2004 | Morzano | H03K 5/151 |
| | | | | 327/55 |
| 7,095,803 | B2 | 8/2006 | Gazsi et al. | |
| 7,650,526 | B2 | 1/2010 | Alon et al. | |
| 8,013,653 | B2 | 9/2011 | Huang | |
| 8,108,710 | B2 | 1/2012 | Zabinski | |
| 8,335,291 | B2 * | 12/2012 | Bae | H03K 19/0966 |
| | | | | 375/219 |
| 8,351,559 | B1 | 1/2013 | Thomas | |
| 8,451,883 | B1 | 5/2013 | Ding et al. | |
| 8,494,038 | B2 | 7/2013 | Gruendler et al. | |
| 8,532,139 | B2 | 9/2013 | Diab et al. | |
| 8,736,321 | B2 | 5/2014 | Nishiyama et al. | |
| 8,855,179 | B1 | 10/2014 | Saed | |
| 9,337,993 | B1 | 5/2016 | Lugthart et al. | |
| 9,379,878 | B1 | 6/2016 | Lugthart et al. | |
| 9,571,308 | B1 | 2/2017 | Lugthart et al. | |
| 2003/0048858 | A1 | 3/2003 | Gazsi et al. | |
| 2004/0139220 | A1 | 7/2004 | Conley et al. | |
| 2006/0023825 | A1 * | 2/2006 | Kato | G06F 13/4273 |
| | | | | 375/372 |
| 2006/0244505 | A1 | 11/2006 | Fung et al. | |
| 2007/0006053 | A1 * | 1/2007 | Otto | H04L 25/14 |
| | | | | 714/700 |
| 2007/0046335 | A1 | 3/2007 | Becker et al. | |
| 2007/0136621 | A1 * | 6/2007 | Alon | G06F 1/10 |
| | | | | 713/503 |
| 2007/0157048 | A1 * | 7/2007 | Levin | G06F 13/4077 |
| | | | | 713/400 |
| 2007/0195911 | A1 | 8/2007 | Ochi | |
| 2007/0252631 | A1 | 11/2007 | Kaviani et al. | |
| 2008/0175586 | A1 | 7/2008 | Perkins et al. | |
| 2008/0304608 | A1 | 12/2008 | Ishida | |
| 2009/0154467 | A1 | 6/2009 | Diab | |
| 2009/0184743 | A1 * | 7/2009 | Kim | G06F 1/10 |
| | | | | 327/161 |
| 2010/0060496 | A1 * | 3/2010 | Madisetti | H03M 1/0624 |
| | | | | 341/118 |
| 2010/0258952 | A1 | 10/2010 | Fjelstad | |
| 2011/0293041 | A1 * | 12/2011 | Luo | H04L 5/20 |
| | | | | 375/316 |
| 2011/0299858 | A1 | 12/2011 | Mazzini et al. | |
| 2012/0082466 | A1 | 4/2012 | Wu et al. | |
| 2012/1015552 | | 6/2012 | Gruendler et al. | |
| 2013/0229211 | A1 | 9/2013 | Nishiyama et al. | |
| 2014/0043079 | A1 | 2/2014 | Ebuchi et al. | |
| 2014/0176208 | A1 * | 6/2014 | Yamaguchi | H04L 7/00 |
| | | | | 327/158 |
| 2014/0191788 | A1 | 7/2014 | Song et al. | |
| 2014/0362869 | A1 | 12/2014 | Pan et al. | |
| 2015/0028929 | A1 | 1/2015 | Farmer et al. | |
| 2015/0071651 | A1 | 3/2015 | Asmanis et al. | |

OTHER PUBLICATIONS

Futamata et al. Micro Coaxial Cable Assembly, Fujikura Technical Review, 2002, pp. 1-6.

Palermo, Lecture 9: Modulation Schemes, Spring 2010, Analog & Mixed-Signal Center, Texas A&M University in 18 pages.

\* cited by examiner

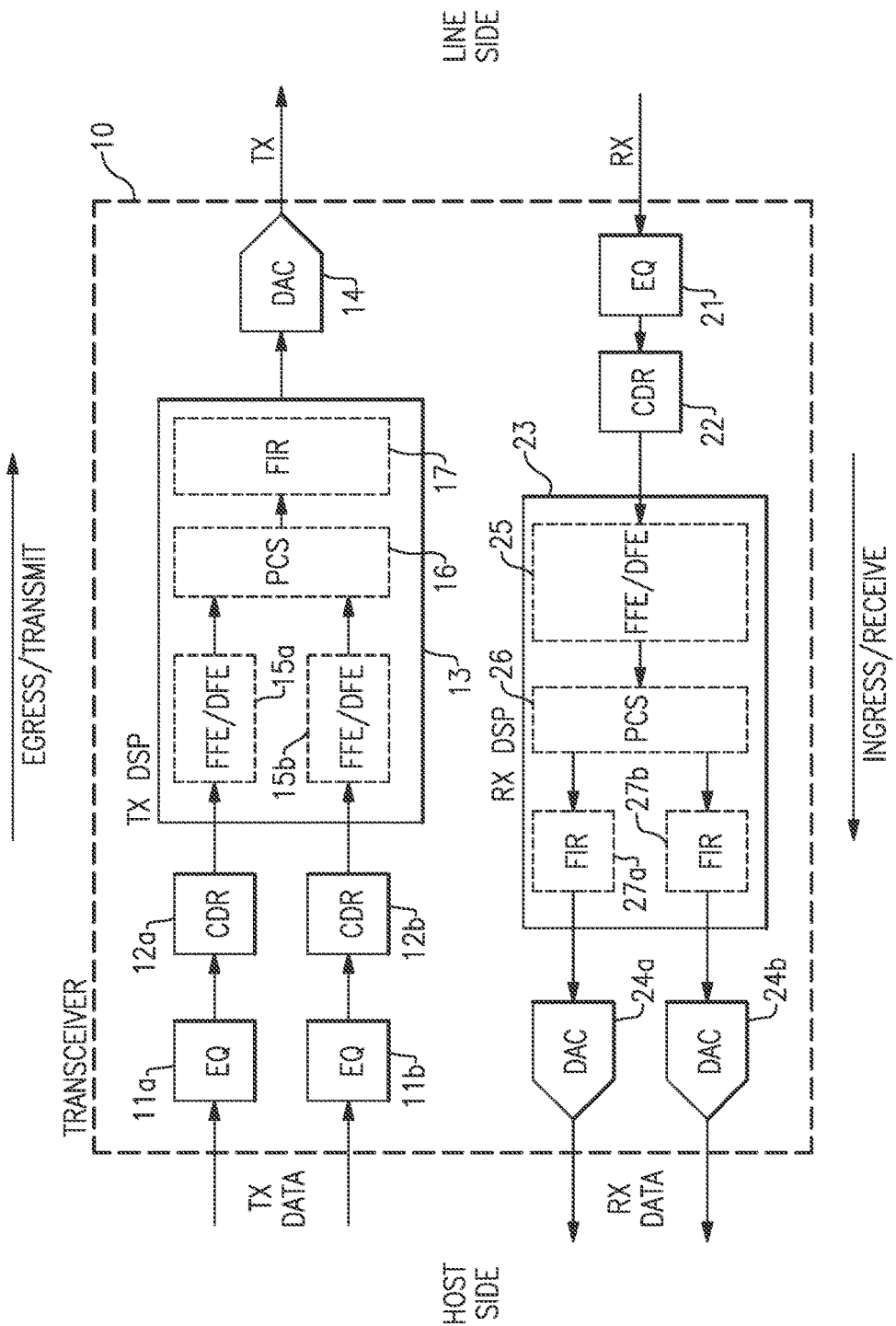

DESKEW IN A HIGH SPEED LINK

PRIORITY

This application is a continuation of U.S. patent application Ser. No. 15/172,595, filed Jun. 3, 2016, and now issued as U.S. Pat. No. 9,742,550, entitled "DESKEW IN A HIGH SPEED LINK," which is a continuation of U.S. patent application Ser. No. 14/581,979, filed Dec. 23, 2014, and now issued as U.S. Pat. No. 9,379,878, entitled "DESKEW IN A HIGH SPEED LINK," which claims the benefit of priority under 35 U.S.C. § 119(e) of U.S. Provisional Application No. 61/921,360 filed Dec. 27, 2013, U.S. Provisional Application No. 61/927,404 filed Jan. 14, 2014, and U.S. Provisional Application No. 61/982,233 filed Apr. 21, 2014. The entire contents of each of the foregoing applications are hereby incorporated by reference.

CROSS-REFERENCE TO RELATED APPLICATIONS

Additionally, this application relates to the following U.S. patent applications, the disclosures of which are incorporated in their entirety by reference herein:

| App. No. | Filing Date | Title | Attorney Docket |
|---|---|---|---|
| 14/581,879 | Dec. 23, 2014 | CHANNEL NEGOTIATION FOR A HIGH SPEED LINK | A929KB-044500US |
| 14/581,930 | Dec. 23, 2014 | TIMING RECOVERY IN A HIGH SPEED LINK | A929KB-043700US |
| 14/581,934 | Dec. 23, 2014 | HIGH SPEED TRANSCEIVER | A929KB-043900US |

BACKGROUND

Field

This disclosure relates to methods and systems for high-speed point-to-point communications.

Description of the Related Art

There has been widespread adoption of personal electronic devices including smart phones, tablets, notebooks, laptops, digital camera, video recorders, gaming systems, etc. These devices are being used to communicate ever-increasing quantities of data, such as between different personal electronic devices, between personal electronic devices and peripheral devices (e.g., display devices, external storage devices, etc.), and the like.

Enormous data communication demands are also present in a variety of other contexts. For example, data centers are communicating ever-increasing amounts of data, and also require fast and reliable data communication between devices. The various methods and systems disclosed herein provide various improvements and benefits vis-à-vis existing high-speed communication technologies.

SUMMARY

The systems, methods and devices of the disclosure each have several innovative aspects, no single one of which is solely responsible for the desirable attributes disclosed herein.

In one aspect, a clock and data recovery (CDR) circuit is provided comprising a data recovery analog-to-digital converter (ADC) configured to receive an input signal and to generate a first digital output signal. The CDR circuit can include a clock recovery ADC configured to receive the input signal and to generate a second digital output signal. The data recovery ADC can have a higher resolution than the clock recovery ADC. The CDR circuit can further include a timing control circuit configured to receive the second digital output signal and to generate a clock control signal based on the second digital output signal. The CDR circuit can further include a clock generation unit configured to control a timing of the data recovery ADC and a timing of the clock recovery ADC based on the clock control signal. The first digital output signal comprises at least 3 bits, and wherein the second digital output signal comprises at least 2 bits.

According to another aspect, a transceiver is provided comprising an equalizer configured to receive a data signal and to generate a clock and data recovery (CDR) input signal based on equalizing the data signal. The transceiver can include a CDR circuit comprising a data recovery analog-to-digital converter (ADC) configured to receive the CDR input signal and to generate a first digital output signal. The transceiver can further include a clock recovery ADC configured to receive the CDR input signal and to generate a second digital output signal. The data recovery ADC has a higher resolution than the clock recovery ADC according to certain embodiments. The CDR circuit can further include a timing control circuit configured to receive the second digital output signal and to generate a clock control signal based on the second digital output signal. The CDR circuit can also include a clock generation unit configured to control a timing of the data recovery ADC and a timing of the clock recovery ADC based on the clock control signal.

According to certain aspects, a method of clock and data recovery is provided. The method includes generating a first digital output signal based on an input signal using a data recovery analog-to-digital converter (ADC). The method can further include generating a second digital output signal based on the input signal using a clock recovery ADC. The data recovery ADC can have a higher resolution than the clock recovery ADC. The method can additionally include generating a clock control signal based on the second digital output signal using a timing control circuit. The method can further include controlling a timing of the data recovery ADC and a timing of the clock recovery ADC based on the clock control signal.

According to an additional aspect, a communication system is provided comprising a first transceiver. The first transceiver can include a differential transmitter configured to generate a differential signal. The differential transmitter can include a first transmitter configured to generate a non-inverted component of the differential signal and a second transmitter configured to generate an inverted component of the differential signal. The communication system can further include a skew adjustment circuit configured to control a timing of transmissions of the first transmitter relative to a timing of transmissions of the second transmitter. The communication system can additionally include a skew control circuit configured to receive a skew indication signal indicating a skew of the differential signal. The skew control circuit may be configured to control an amount of skew adjustment provided by the skew adjustment circuit based on the skew indication signal.

According to additional aspects, a method of correcting for skew in a communication system is provided. The method can include transmitting a differential signal over a cable using a differential transmitter of a first transceiver. The step of transmitting the differential signal can include generating a non-inverted component of the differential signal using a first transmitter of the differential transmitter and generating an inverted component of the differential signal using a second transmitter of the differential transmitter. The method can further include receiving a skew indication signal as an input to a skew control circuit of the first transceiver. The method can additionally include controlling an amount of skew adjustment provided by a skew adjustment circuit of the first transceiver using the skew control circuit, wherein controlling the amount of skew adjustment comprises controlling a timing of transmissions of the first transmitter relative to a timing of transmissions of the second transmitter.

An apparatus is provided according to a further aspect. The apparatus can include a cable and a first electronic device, where the first electronic device can include a differential transmitter configured to transmit a differential signal over the cable. The first electronic device can additionally include a skew adjustment circuit configured to adjust a skew of the differential transmitter by controlling a timing of a transmission of a first component of the differential signal relative to a timing of a transmission of a second component of the differential signal. The first electronic device an further include a skew control circuit configured to receive a skew indication signal and to control an amount of skew adjustment provided by the skew adjustment circuit based on the skew indication signal. The apparatus can also include a second electronic device comprising a differential receiver configured to receive the differential signal over the cable, wherein the differential receiver comprises a skew detector configured to generate the skew indication signal.

According to an additional aspect, a communication device includes a host interface including at least two inputs for receiving signals from a host device at a total data rate of at least 40 Gbit/s. The communication device can further include host-side analog-to-digital converter (ADC) circuitry configured to digitize the received signals to generate at least two digital data channels each having a first data rate. The device can also include a digital signal processor configured to digitally condition the at least two digital data channels and multi-level encode the at least two digital data channels to generate a reduced number of one or more multiplexed digital data channels that each have a second data rate higher than the first data rate. The device may also include line-side digital-to-analog converter (DAC) circuitry configured to convert the multiplexed one or more digital data channels into one or more differential output signals. In addition, the device can include a line interface comprising one or more differential outputs each configured to transmit a corresponding one of the differential output signals onto corresponding paired differential cables. The egress path may be configured to deliver the one or more differential output signals onto the paired differential cables such that the line interface operates at a total data rate of at least 40 Gbit/s.

In a further aspect, a method of electronic communication includes receiving a first plurality of host-side signals from a host device, wherein each of the first plurality of host-side signals has a first data rate. The method can further include converting the first plurality of host-side signals into a plurality of digitized egress signals using host-side analog-to-digital converter (ADC) circuitry. The method may also include processing the plurality of digitized egress signals to generate one or more multiplexed signals using a first digital signal processor. The step of processing the plurality of digitized egress signals can include digitally conditioning the plurality of digitized egress signals and encoding the one or more multiplexed signals with a multi-level encoding. The method can additionally include converting the one or more multiplexed signals into one or more differential output signals using line-side digital-to-analog converter (DAC) circuitry. Each of the one or more differential output signals can have a second data rate greater than the first data rate. In addition, the method can include transmitting the one or more differential output signals over one or more paired differential conductors of a cable at a data rate of at least 40 Gbit/s.

According to yet another aspect, an active cable comprises a first cable comprising a first pair of conductors including a first pluggable module. The first pluggable module can include a first transceiver including host-side analog-to-digital converter (ADC) circuitry configured to receive a first plurality of host-side signals and to generate a plurality of digitized egress signals. A first host-side signal of the first plurality of host-side signals can have a first data rate. The first transceiver can further include a first digital signal processor (DSP) configured to generate one or more multiplexed signals based on multiplexing the plurality of digitized egress signals. The one or more multiplexed signals can have a multi-level encoding. The transceiver can further include line-side digital-to-analog converter (DAC) circuitry configured to convert the one or more multiplexed signals into one or more differential output signals including a first differential output signal. The line-side DAC circuitry can be configured to transmit the first differential output signal over the first pair of conductors at a second data rate that is greater than the first data rate.

According to an additional aspect, a method of negotiating a communication channel between transceivers includes, as part of a first stage of a channel negotiation between a first transceiver and a second transceiver, exchanging information between the first and second transceiver over the communication channel in a reduced speed mode. The method can further include, as part of a second stage of the channel negotiation subsequent to the first stage, adaptively acquiring one or more parameters associated with the communication channel. The method can additionally include exchanging information between the first and second transceivers for use in the channel negotiation. In addition, the method can include, as part of a third stage of the channel negotiation subsequent to the second stage, entering a full functional mode in which information is exchanged between the first and second transceivers using multi-level modulation.

A communication system according to another aspect includes a communication channel, a first transceiver, and a second transceiver coupled to the first transceiver over the communication channel. The first and second transceivers may be configured to exchange information over the communication channel in a reduced speed mode during a first stage of a channel negotiation. The first and second transceivers can be further configured to adaptively acquire one or more parameters associated with the communication channel during a second stage of the channel negotiation subsequent to the first stage. In addition, the first and second transceivers can be configured to enter a full functional mode in which information is exchanged between the first and second transceivers using multi-level modulation during a third stage of the channel negotiation subsequent to the second stage.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Example implementations disclosed herein are illustrated in the accompanying schematic drawings, which are for illustrative purposes only.

FIG. 1A is a schematic diagram of one embodiment of a transceiver.

Like reference numbers and designations in the various drawings may indicate like elements.

DETAILED DESCRIPTION

Figure 1B:
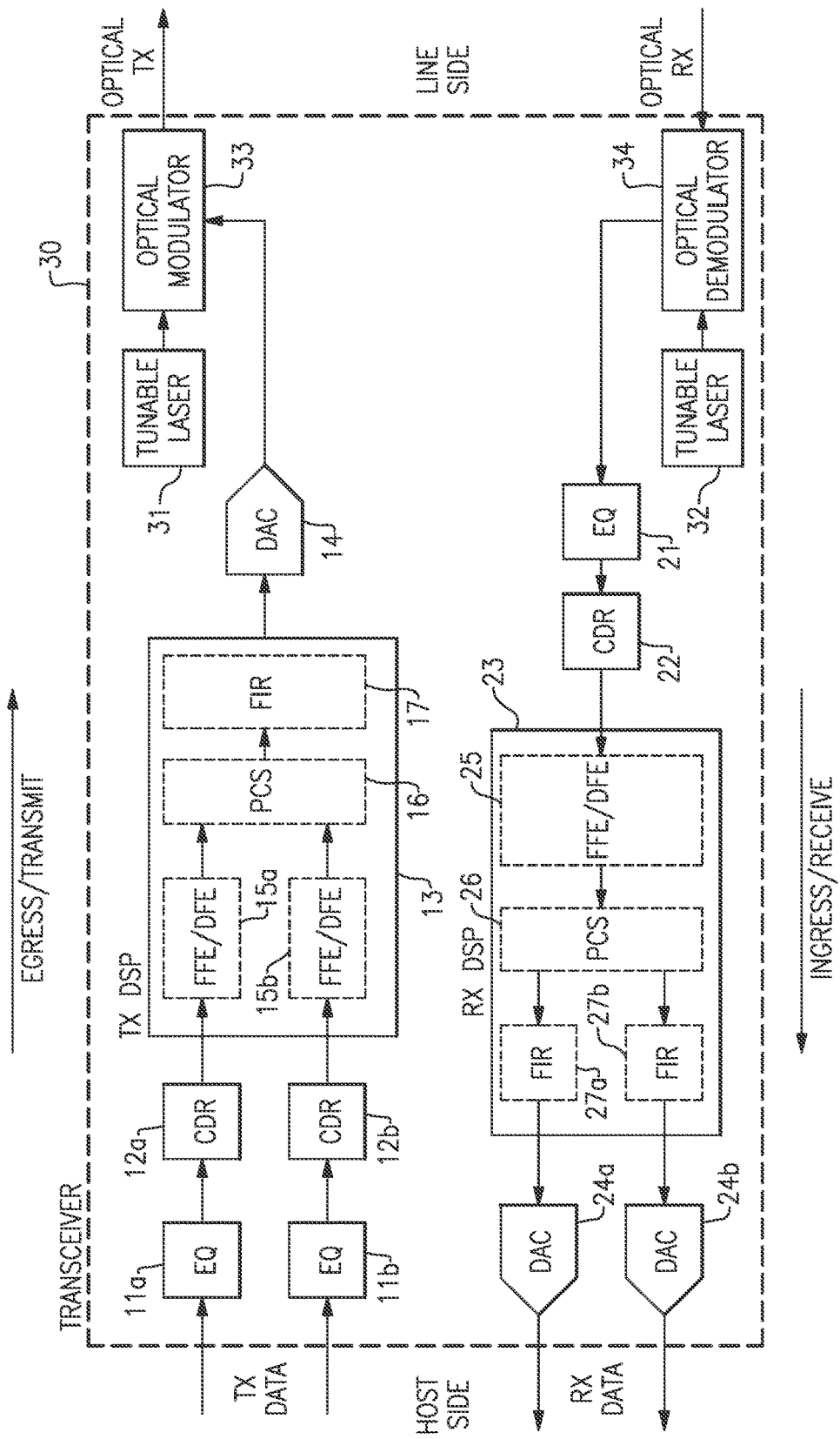
FIG. 1B is a schematic diagram of another embodiment of a transceiver.

The following detailed description is directed to certain implementations for the purposes of describing the innovative aspects. However, the teachings herein can be applied in a multitude of different ways. As will be apparent from the following description, the innovative aspects may be implemented in any high-speed communication system that is configured to transmit and receive data between electronic devices which can include laptops, notebooks, tablets, desktop computers, data centers, gaming devices, data storage systems, input/output peripheral devices, display devices, etc. The innovative aspects may be implemented in or associated with data transport networks, storage area networks, enterprise networks, private networks, secure networks, financial networks, etc. Other uses are also possible.

There are a number of interface standards that can support data transfer between different electronic, computing, storage and peripheral devices. For example, speeds of between about 480 Mbits/s and about 10 Gbit/s have been achieved with systems that implement Thunderbolt Gen1/Gen2, USB 2.0/3.0 and/or IEEE 1394b. The performance of communication systems is limited, however, by factors including intersymbol interference (ISI) and other characteristics of associated with the cable including loss, noise, dispersion and non-linear response.

ISI is a form of signal distortion in which a symbol in a digital data stream interferes with subsequent symbols. At lower data rates the effects of ISI are not as problematic since the time interval between two successive symbols is large (e.g., 1.0 ns at 10 Gbit/s). However, as data rates increase (e.g., at data rates greater than 10 Gbit/s), the effects of ISI can increase the errors in the received digital data since the time interval between two successive symbols is reduced (e.g., 0.5 ns at 20 Gbit/s and 0.25 ns at 40 Gbit/s). ISI can be reduced by reducing the loss, noise, dispersion and/or non-linearity of the channel or by designing the transceivers to compensate for or reduce the effects of ISI.

Systems and methods described herein include innovative transceiver architectures and novel ways of re-timing, multiplexing, de-multiplexing and transmitting data to achieve reliable high-speed point-to-point communication between different electronic devices, computing devices, storage devices and peripheral devices in the presence of ISI and/or other interference or noise.

A high-speed communication link can include a cable and a pair of transceivers provided at respective ends of the cable. The cable can be implemented in a wide variety of ways. For example, in certain configurations, the cable can correspond to an electrical cable including one or more pairs of differential micro coaxial cables or conductors. However, other configurations are possible, such as implementations in which the cable is implemented as an optical cable.

In certain configurations, the transceivers can implement a serializer/deserializer (SerDes) function. For example, in certain implementations each transceiver can be a full duplex multiplexer and re-timer capable of receiving multiple (e.g., 2, 4, or more) signals from a host via a host-side interface. The transceiver multiplexes the received signals for transmission via a line-side interface over the cable utilizing a reduced number of channels. The multiplexing reduces cabling cost and complexity, and can be achieved via multi-level modulation encoding, for example. In one non-limiting embodiment, each transceiver is capable of receiving dual 20 Gbit/s non-return-to-zero (NRZ) signals and multiplexing these signals into a single 40 Gbit/s signal via four level pulse amplitude modulation (PAM-4) for transmission over the cable.

The transceiver can also be configurable in different operational modes. For instance, depending on the mode, the transceiver can handle different numbers of host-side data streams having variable data rates. In one embodiment, the transceiver operates in a first operational mode to translate two host-side 20 Gbit/s NRZ data streams into a single PAM-4 40 Gbit/s stream on the line side, and vice versa. In a second operational mode, the transceiver translates four host-side 10 Gbps NRZ data streams into a single PAM-4 40 Gbit/s stream on the line-side, and vice versa. Such flexibility allows the transceiver to be employed in a variety of different contexts, such as in both consumer and data center contexts.

The transceiver in some embodiments includes a timing recovery circuit including a digital clock recovery path having a dedicated, relatively low latency and/or low power analog-to-digital converter (ADC). The data path can include a separate ADC having more bits than the ADC included in the clock recovery path. Different filtering can be used in the clock and data paths. Moreover, the digital output from the clock recovery path can be used to drive a digitally controlled oscillator (DCO) rather than implementing an analog phase-locked loop (PLL), further reducing latency.

A de-skew function can additionally be included in the transceiver to reduce or eliminate skew between signals in parallel conducting lines, e.g., between differential signals travelling over paired micro coaxial lines in the cable. Moreover, the de-skew function can be implemented in the line-side transmitter via a feedback mechanism, rather than in the line-side receiver, significantly reducing cost or complexity and/or enhancing performance.

A negotiation process is implemented according to certain aspects in order to establish the link between transceivers on either end of the line. The negotiation process can include a variety of steps including, without limitation, de-skew, operating mode negotiation, clock recovery, transmit pulse shaping, equalization, and the like. Negotiation can involve different stages that can include, for example, a reduced speed start-up mode, an NRZ training mode, and a functional training mode. Moreover, the transceivers in some embodiments advantageously insert an in-band communication channel into to the user data stream for negotiation purposes.

Examples of Transceivers, Point-to-Point Communication Systems, and Cables

FIG. 1A is a schematic diagram of one example of a transceiver 10. The transceiver 10 includes a first transmit path equalizer 11a, a second transmit path equalizer 11b, a first transmit path clock and data recovery (CDR) circuit 12a, a second transmit path CDR circuit 12b, a transmit path digital signal processor (DSP) 13, a transmit path DAC 14, a receive path equalizer 21, a receive path CDR circuit 22, a receive path DSP 23, a first receive path DAC 24a, and a second receive path DAC 24b.

The transceiver 10 of FIG. 1A illustrates one example of a transceiver which can include one or more of the features disclosed herein. However, the teachings herein are applicable to other systems or apparatus, including, for example, other configurations of transceivers.

As shown in FIG. 1A, the first and second transmit path equalizers 11a, 11b include inputs that receive host side transmit data (TX DATA) and outputs electrically connected to inputs of the first and second transmit path CDR circuits 12a, 12b, respectively. The first and second transmit path CDR circuits 12a, 12b further include outputs electrically connected to inputs of the transmit path DSP 13. The transmit path DAC 14 includes an input electrically connected to an output of the transmit path DSP 13 and an output that generates a line side transmit signal (TX). The receive path equalizer 21 includes an input that receives a line side receive signal (RX), and an output electrically connected to an input of the receive path CDR circuit 22. The receive path CDR circuit 22 further includes an output electrically connected to an input of the receive path DSP 23. The receive path DSP 23 further includes outputs electrically connected to inputs of the first and second receive path DACs 24a, 24b. The first and second receive path DACs 24a, 24b further include outputs that generate host side receive data (RX DATA).

The transceiver 10 can be used to support data transfer between various electronic devices, such as computing devices, storage devices, and/or peripheral devices. For example, the transceiver 10 can communicate with one or more additional transceivers using a wide variety of communications interface standards, including, for example, Thunderbolt Gen1/Gen2, USB 2.0/3.0, or IEEE 1394b.

In certain configurations, the transceiver 10 can implement a serializer/deserializer (SerDes) function or operation. For example, in one embodiment, the transceiver 10 can operate as a full duplex multiplexer and re-timer capable of receiving multiple (for example, 2, 4, or more) signals from a host via a host-side interface. Additionally, the transceiver 10 can multiplex the received host-side transmit signals for transmission via a line-side interface over a cable utilizing a reduced number of channels. The multiplexing reduces cabling cost and complexity, and can be achieved, for example, via multi-level modulation encoding. In one non-limiting example, an egress/transmit path of the transceiver 10 is capable of receiving dual 20 Gbit/s non-return-to-zero (NRZ) signals on the host side and multiplexing these signals into a single 40 Gbit/s signal via four level pulse amplitude modulation (PAM-4) for transmission to the line side over the cable. Conversely, an ingress/receive path of the transceiver in such an example is capable of receiving a single 40 Gbit/s PAM-4 signal on the line side and de-multiplexing this signal into dual 20 Gbit/s NRZ signals for communication to the host side.

FIG. 1A illustrates the host side transmit data as including two signals and the line side transmit data as including one signal (e.g., via a multiplexing operation), and illustrates the line side receive data as including one signal and the host side receive data as including two signals (via a de-multiplexing operation). However, other configurations are possible, including configurations with additional signals on the host side and/or line side. For example, the first and second receive path DACs 24a, 24b can be replicated in parallel to include, for instance, 10, 20, or 40 or more DACs to provide wider RX DATA bandwidth. Similarly, the first and second transmit path equalizers 11a, 11b and the first and second transmit path CDR circuits 12a, 12b can be replicated in provide wider TX DATA bandwidth. In such configurations, different multiplexing, de-multiplexing, and/or modulation formats can be employed, as appropriate.

The receive path equalizer 21 can be used to provide signal equalization to compensate for transmission line losses on the line side, and the first and second transmit path equalizers 11a, 11b can be used to provide signal equalization to compensate for transmission line losses on the host side. For example, in certain implementations, an equalizer can be used to compensate for high-frequency signal loss by boosting high frequency components of a signal relative to low frequency components of the signal, thereby improving signal fidelity. In certain configurations, an equalizer can also be used for balancing amplitude and/or frequency characteristics associated with non-inverted and inverted components of a differential signal. In one embodiment, the transmit path equalizers 11a, 11b and/or the receive path equalizer 21 are implemented as continuous-time linear equalizers (CTLEs).

The receive path CDR circuit 22 and the first and second transmit CDR circuits 12a, 12b can be used to perform clock and data recovery operations. For example, the receive path CDR circuit 22 can receive a data stream from the receive path equalizer 21, and can sample the data stream using a sampling clock signal. Additionally, the receive path CDR circuit 22 can control the sampling clock signal's frequency and phase to align the sampling clock signal relative to transitions in the data stream. Similarly, the first and second transmit path CDR circuits 12a, 12b can recover data in data streams generated by the first and second transmit path equalizers 11a, 11b, respectively.

The receive path DSP 23 can be used to process the data recovered by the receive path CDR circuit 22, and the transmit path DSP 13 can be used to process the data recovered by the first and second transmit path CDR circuits 12a, 12b. In the illustrated configuration, the receive path DSP 23 includes a feed-forward equalizer and/or decision feedback equalizer (FFE/DFE) block 25, a physical coding sublayer (PCS) block 26, a first finite impulse response (FIR) filter 27a, and a second FIR filter 27b. Additionally, the transmit path DSP 13 includes a first FFE/DFE block 15a, a second FFE/DFE block 15b, a PCS block 16, and a FIR filter 17. Although one example of DSP blocks for receive path and transmit path DSPs has been provided, other configurations are possible.

The illustrated receive path and transmit path DSPs can aid in conditioning and recovering received signals and in processing and generating signals associated with various communication interface standards or signaling protocols. For example, the transmit path DSP 13 can be used to filter and/or otherwise condition received signals, and to process and combine multiple recovered data streams to generate a serialized or multiplexed output signal having a desired modulation format. For example, in one embodiment, transmit path DSP 13 can filter or otherwise recover and condition the received signal, and to process the received signal to output a digital signal of a desired format or encoding, such as PAM-4, NRZ, duobinary, differential phase-shift keying (DPSK), and/or phase-shift keying (PSK). Additionally, the receive path DSP 23 can be used to process (for example, filter or otherwise recover and condition) data recovered by the receive path CDR circuit 22, and to deserialize the data to generate output signals having a desired modulation format for host side transmission.

In the illustrated configuration, the transmit path DAC 14 and the first and second receive path DACs 24a, 24b can be used to transmit signals generated by the transceiver 10 over transmission lines (which can include, for example, cables) to other circuitry, such as other transceivers and/or receivers. For example, the transmit path DAC 14 can be used to convert a digital output signal generated by the transmit path DSP 13 into an analog output signal, which can be provided to another transceiver electrically coupled to the transceiver 10 on the line side by a cable. Depending on the environment, the transmission line can include, for example, cables, printed circuit board (PCB) trace, backplane trace, and/or other electrical interconnect associated with the transmission line. Similarly, the first and second receive path DACs 24a, 24b can be used to convert digital output signals generated by the receive path DSP 23 into analog output signals that can be provided to one or more additional transceivers electrically coupled to the transceiver 10 on the host side via transmission lines.

Although FIG. 1A illustrates one example of a transceiver that can include one or more features disclosed herein, the teachings herein can be employed in a wide variety of other electronic systems, including for example, other configurations of transceivers.

FIG. 1B is a schematic diagram of another embodiment of a transceiver 30. The transceiver 30 of FIG. 1B is similar to the transceiver 20 of FIG. 1A, except that the transceiver 30 further includes a transmit path tunable laser 31, a receive path tunable laser 32, an optical modulator 33, and an optical demodulator 34.

The illustrated transceiver 30 can be used to communicate over an optical cable on the line side, such as a fiber-optic cable.

For example, the transmit path tunable laser 31 can be used to generate an optical carrier signal for the optical modulator 33. Additionally, the DAC 14 can be used to provide a transmit signal, which the optical modulator 33 can modulate with the optical carrier signal to generate an optical transmit signal (OPTICAL TX) that can be transmitted over an optical cable connected on the line side. In certain configurations, the DAC 14 can be used to output data representing in-phase and quadrature phase (I/Q) components of horizontal and vertical polarizations of the optical transmit signal. As shown in FIG. 1B, the optical demodulator 34 can receive an optical receive signal (OPTICAL RX) over the optical cable. The optical demodulator can 34 can further receive an optical carrier signal from the receive path tunable laser 32, which the optical demodulator 34 can use to demodulate the optical receive signal. The demodulated signal can be provided to the receive path equalizer 21 for equalization.

Although FIG. 1B illustrates one example of an optical transceiver, the teachings herein are applicable to a wide variety of optical transceivers.

Additional details of the transceiver 30 can be similar to those described earlier.

Figure 1C:
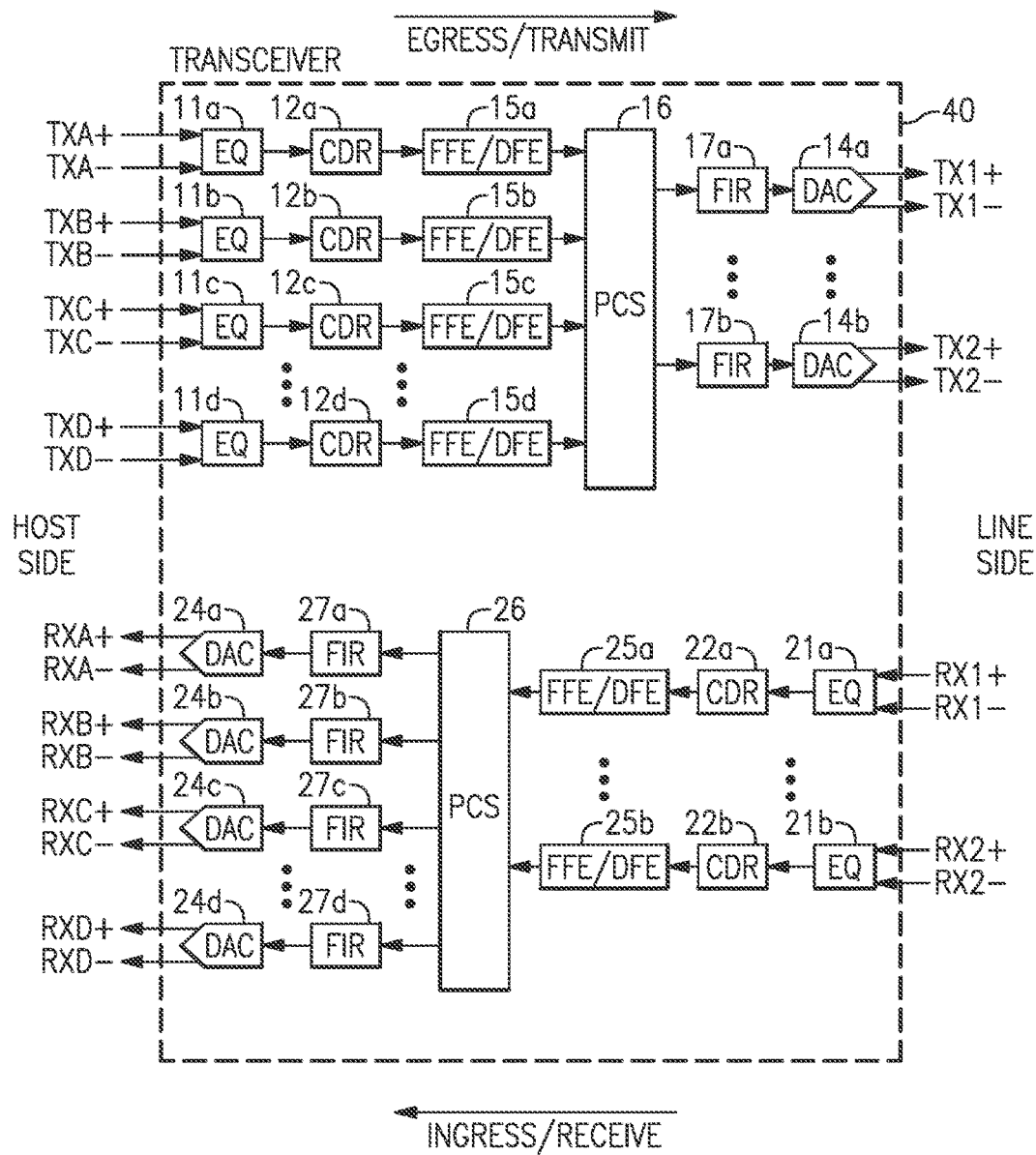
FIG. 1C is a schematic diagram of another embodiment of a transceiver.

FIG. 1C is a schematic diagram of another embodiment of a transceiver 40. The transceiver 40 includes a first transmit path equalizer 11a, a second transmit path equalizer 11b, a third transmit path equalizer 11c, a fourth transmit path equalizer 11*d*, a first transmit path CDR circuit 12*a*, a second transmit path CDR circuit 12*b*, a third transmit path CDR circuit 12*c*, a fourth transmit path CDR circuit 12*d*, a first transmit path FFE/DFE block 15*a*, a second transmit path FFE/DFE block 15*b*, a third transmit path FFE/DFE block 15*c*, a fourth transmit path FFE/DFE block 15*d*, a transmit path PCS block 16, a first transmit path FIR 17*a*, a second transmit path FIR 17*b*, a first transmit path DAC 14*a*, a second transmit path DAC 14*b*, a first receive path equalizer 21*a*, a second receive path equalizer 21*b*, a first receive path CDR circuit 22*a*, a second receive path CDR circuit 22*b*, a first receive path FFE/DFE block 25*a*, a second receive path FFE/DFE block 25*b*, a receive path PCS block 26, a first receive path FIR 27*a*, a second receive path FIR 27*b*, a third receive path FIR 27*c*, a fourth receive path FIR 27*d*, a first receive path DAC 24*a*, a second receive path DAC 24*b*, a third receive path DAC 24*c*, and a fourth receive path DAC 24*d*.

In the illustrated configuration, the transceiver 40 receives four differential transmit signals on the host side. For example, the first transmit path equalizer 11*a* receives a first host side differential transmit signal TXA+, TXA−, the second transmit path equalizer 11*b* receives a second differential transmit signal TXB+, TXB−, the third transmit path equalizer 11*c* receives a third differential transmit signal TXC+, TXC−, and the fourth transmit path equalizer 11*d* receives a fourth differential transmit signal TXD+, TXD−. Additionally, the illustrated transceiver 40 generates two differential transmit signals on the line side. For example, the first transmit path DAC 14*a* generates a first differential transmit signal TX1+, TX1−, and the second transmit path DAC 14*b* generates a second differential transmit signal TX2+, TX2−.

Accordingly, the illustrated configuration provides a 4:2 multiplexing or parallel-to-serial SerDes operation of the transmit data. Although the illustrated embodiment provides a 4:2 multiplexing operation, the transceiver 40 can receive more or fewer host side transmit signals and/or generate more or fewer line side transmit signals.

Additionally, in the illustrated configuration, the transceiver 40 receives two differential receive signals on the line side. For example, the first receive path equalizer 21*a* receives a first line side differential receive signal RX1+, RX1−, and the second receive path equalizer 21*b* receives a second line side differential receive signal RX2+, RX2−. Additionally, the illustrated transceiver 40 generates four differential receive signals on the host side. For example, the first receive path DAC 24*a* generates a first differential receive signal RXA+, RXA−, the second receive path DAC 24*b* generates a second differential receive signal RXB+, RXB−, the third receive path DAC 24*c* generates a third differential receive signal RXC+, RXC−, and the fourth receive path DAC 24*d* generates a fourth differential receive signal RXD+, RXD−.

Accordingly, the illustrated configuration provides a 2:4 de-multiplexing or serial-to-parallel SerDes operation of the receive data. Although the illustrated embodiment provides a 2:4 de-multiplexing operation, the transceiver 40 can receive more or fewer line side receive signals and/or generate more or fewer host side receive signals.

In certain configurations, a transceiver provides multiplexing and/or de-multiplexing operations that are configurable or programmable. For example, in certain implementations, the transceiver 40 can operate using a flexible host-side interface that can be configured between 4:1, 4:2, 2×2:1 (dual 2:1), or 2:2 modes of operation. Configuring a transceiver in this manner can aid in achieving, for instance, flexible NRZ signaling at data rates in the range of 5 Gbps to 28 Gbps. Although one example of configurability has been described, other configurations are possible.

The transceiver 40 can operate using a wide variety of signaling protocols. In one example, both the host side and line sides can operate using NRZ signaling. In another example, the host side can operate using NRZ signaling and the line side can operate using PAM-4 signaling. However, other configurations are possible.

The illustrated configuration operates using differential signaling on the host and line sides. Using differential signaling can improve performance in a variety of ways, including, for example, enhancing performance in the presence of common-mode noise and/or systematic offsets or errors. In certain configurations, a particular differential signal is transmitted or received over a pair of differential micro coaxial cables or conductors. In certain configurations, two or more pairs of differential micro coaxial conductors can be housed in a shared cable. Various examples of such cables will be described in detail further below with reference to FIGS. 3A-3C. Although various examples of cabling have been described, other configurations are possible, including, for example, other implementations of electrical cables and/or implementations using optical cables.

Additional details of the transceiver 40 can be similar to those described earlier.

Figure 1D:
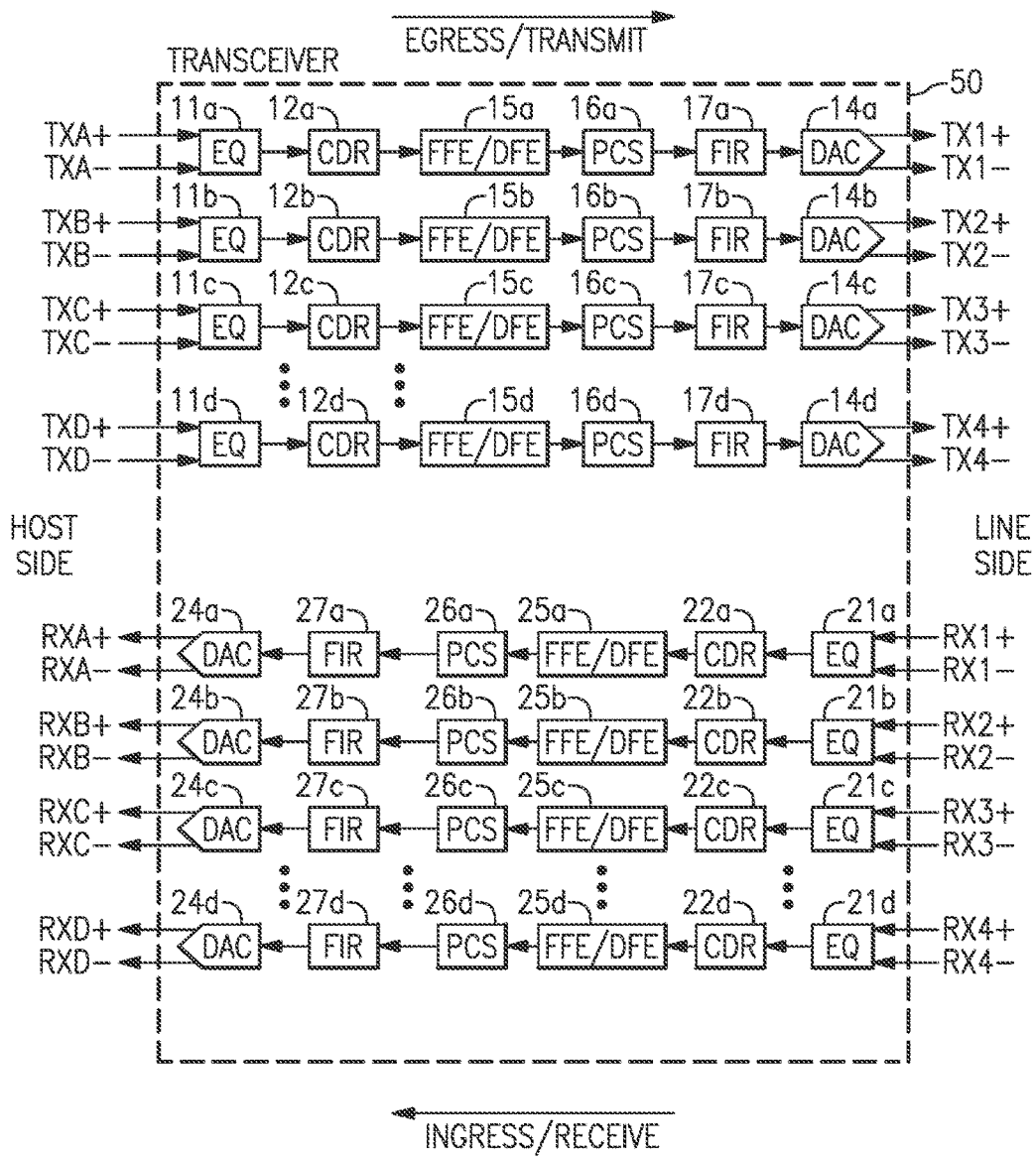
FIG. 1D is a schematic diagram of another embodiment of a transceiver.

FIG. 1D is a schematic diagram of another embodiment of a transceiver 50. The transceiver 50 includes a first transmit path equalizer 11*a*, a second transmit path equalizer 11*b*, a third transmit path equalizer 11*c*, a fourth transmit path equalizer 11*d*, a first transmit path CDR circuit 12*a*, a second transmit path CDR circuit 12*b*, a third transmit path CDR circuit 12*c*, a fourth transmit path CDR circuit 12*d*, a first transmit path FFE/DFE block 15*a*, a second transmit path FFE/DFE block 15*b*, a third transmit path FFE/DFE block 15*c*, a fourth transmit path FFE/DFE block 15*d*, a first transmit path PCS block 16*a*, a second transmit path PCS block 16*b*, a third transmit path PCS block 16*c*, a fourth transmit path PCS block 16*d*, a first transmit path FIR 17*a*, a second transmit path FIR 17*b*, a third transmit path FIR 17*c*, a fourth transmit path FIR 17*d*, a first transmit path DAC 14*a*, a second transmit path DAC 14*b*, a third transmit path DAC 14*c*, a fourth transmit path DAC 14*d*, a first receive path equalizer 21*a*, a second receive path equalizer 21*b*, a third receive path equalizer 21*c*, a fourth receive path equalizer 21*d*, a first receive path CDR circuit 22*a*, a second receive path CDR circuit 22*b*, a third receive path CDR circuit 22*c*, a fourth receive path CDR circuit 22*d*, a first receive path FFE/DFE block 25*a*, a second receive path FFE/DFE block 25*b*, a third receive path FFE/DFE block 25*c*, a fourth receive path FFE/DFE block 25*d*, a first receive path PCS block 26*a*, a second receive path PCS block 26*b*, a third receive path PCS block 26*c*, a fourth receive path PCS block 26*d*, a first receive path FIR 27*a*, a second receive path FIR 27*b*, a third receive path FIR 27*c*, a fourth receive path FIR 27*d*, a first receive path DAC 24*a*, a second receive path DAC 24*b*, a third receive path DAC 24*c*, and a fourth receive path DAC 24*d*.

The illustrated transceiver 50 operates as a re-timer. For example, the transceiver 50 can retime one or more transmit signals received on the host side to generate one or more transmit signals on the line side. Similarly, the transceiver 50 can re-time one or more receive signals received on the line side to generate one or more receive signals on the host side. Re-timing signals on the host and/or line signals can reduce or remove high-frequency jitter in the signals, thereby improving signal fidelity and/or permitting communication over longer distances.

In the illustrated configuration, the transceiver 50 receives four host side differential transit signals, which are retimed to generate four line side differential transmit signals. Additionally, the illustrated transceiver 50 receives four line side differential receive signals, which are retimed to generate four host side differential receive signals. Although the transceiver 50 is illustrated as retiming four transmit signals and four receive signals, the teachings herein are applicable to configurations in which a transceiver retimes more or fewer transmits signals and/or more or fewer receive signals.

Additional details of the transceiver 50 can be similar to those described earlier.

Although FIGS. 1A-1D illustrate various examples of transceivers, the teachings herein are applicable to other systems or apparatus, including, for example, other configurations of transceivers. A wide variety of electrical and optical transceiver configurations supporting different data rates are possible. Here are some non-limiting examples:

- A 40 Gbit/s re-timer that re-times four host-side 10 Gbit/s NRZ lanes into four re-timed line-side 10 Gbit/s NRZ lanes.
- A 40 Gbit/s transceiver that multiplexes four host-side 10 Gbit/s NRZ lanes into a single 40 Gbit/s PAM-4 line-side lane.
- A 50 Gbit/s transceiver that multiplexes two 25 Gbit/s host-side NRZ lanes into a single PAM-4 50 Gbit/s line-side lane.
- A 100 Gbit/s transceiver that multiplexes four host-side 25 Gbit/s NRZ lanes into two 50 Gbit/s PAM-4 line-side lanes.
- A 100 Gbit/s transceiver that multiplexes four host-side 25 Gbit/s NRZ lanes into two 50 Gbit/s PAM-4 line-side lanes.
- A 100 Gbit/s transceiver that multiplexes four host-side 25 Gbit/s NRZ lanes into a single 100 Gbit/s PAM-4 line-side lanes.
- A 200 Gbit/s re-timer that re-times eight host-side 25 Gbit/s NRZ lanes into eight re-timed line-side 25 Gbit/s NRZ lanes.
- A 200 Gbit/s transceiver that multiplexes eight host-side 25 Gbit/s NRZ lanes into four 50 Gbit/s line-side PAM-4 lanes.
- A 400 Gbit/s transceiver that multiplexes sixteen 25 Gbit/s host-side NRZ lanes into eight 50 Gbit/s PAM-4 line-side lanes.
- A 400 Gbit/s transceiver that converts eight 50 Gbit/s PAM-4 host-side lanes into four 100 Gbit/s PAM-4 line-side lanes.

While only the egress/transmit direction of data transmission is referred to in the above examples, it will be appreciated that the transceivers have both egress/transmit and ingress/receive paths. For instance, each of the transceivers described above as implementing a multiplexing function in the egress/transmit direction will be capable of performing a corresponding demultiplexing function in the ingress/receive direction to generate the appropriate number of host-side lanes, as described herein. Any of the above transceivers can be used to support either optical or electrical signal transmission. While the above examples are provided for the purposes of illustration, a wide variety of other configurations including those supporting additional data rates are possible. For instance, various implementations can be capable of operation at one or more of 20 Gbit/s, 25 Gbit/s, 28 Gbit/s, 32 Gbit/s, 40 Gbit/s, 50 Gbit/s, 56 Gbit/s, 64 Gbit/s, 100 Gbit/s, 112 Gbit/s, 128 Gbit/s, 200 Gbit/s, 224 Gbit/s, 256 Gbit/s, 400 Gbit/s, and 448 Gbit/s, and/or be capable of operation at data rates greater than any of these amounts, or rates between any of the foregoing rates. Listed data rates in some cases may correspond to effective payload data rates, not including certain overhead. For instance, a device with a listed data rate of 50 Gbit/s may actually be capable of a total data rate of 56 Gbit/s including 6 Gbit/s of overhead.

Figure 2A:
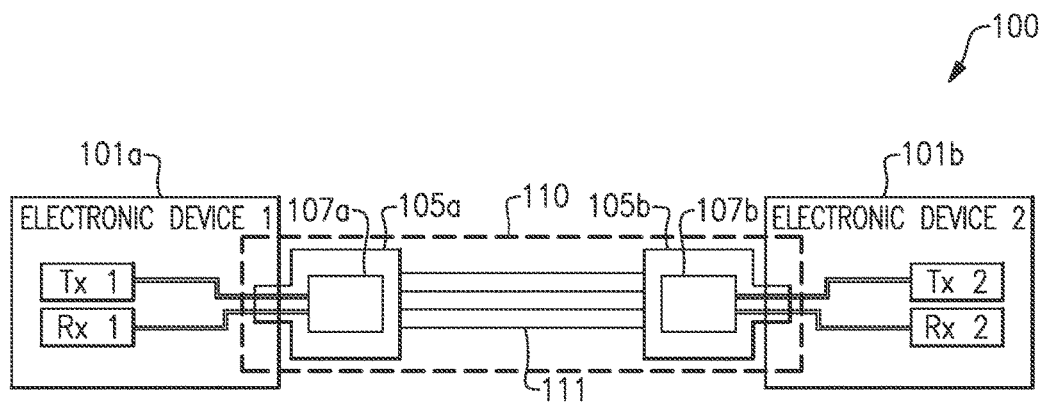
FIG. 2A is a schematic diagram of a high-speed point-to-point communication system according to one embodiment.

FIG. 2A is a schematic diagram of a high-speed point-to-point communication system 100 according to one embodiment. The communication system 100 includes a first electronic device 101a and a second electronic device 101b electrically connected to one another via a cable 110.

The communication system 100 of FIG. 2A illustrates an implementation of a high-speed communication link between first and second electronic devices 101a, 101b, which can also be referred to herein as host devices. In various implementations, the first and second electronic devices 101a and 101b can include one or more of a mobile computing device (e.g., a smart phone or a tablet), a personal computing device (e.g., a laptop, a desktop, a notebook), a workstation, a supercomputer, a peripheral device (e.g., a mouse, a keyboard, a joystick, a digital camera, a video camera, a webcam, a monitor, a display device, a speaker, a microphone, a printer, a scanner, a gaming system, an internet router, a hub, a network router, a port expansion device, an electronic switching device, a printed circuit board, a storage device (e.g., an external hard drive), an input/output interface device (e.g., read/write device, DVD player), a voice-over-IP device, etc.

FIG. 2A illustrates an embodiment in which the cable 110 is an active cable including actively powered componentry for improving performance of the cable 110. Thus, the cable 110 shown in FIG. 2A includes one or more conductive lines 111 as well as first and second transceiver assemblies 105a, 105b positioned at either end of the conductive lines 111. For example, the first transceiver assembly 105a includes a host side that is electrically connected to the first electronic device 101a and a line side that is electrically connected to a first end of the conductive lines 111. Additionally, the second transceiver assembly 105b includes a host side that is electrically connected to the second electronic device 101b and a line side that is electrically connected to a second end of the conductive lines 111.

Although FIG. 2A illustrates a configuration including the conductive lines 111, in other configurations the conductive lines 111 can be omitted in favor of communication using an optical cable.

The first and second transceiver assemblies 105a, 105b can be implemented in a variety of ways. For example, the first and second transceiver assemblies include first and second transceivers 107a, 107b, respectively, which can be implemented using, for example, any of the embodiments of transceivers described earlier with respective to FIGS. 1A-1D.

Figure 2B:
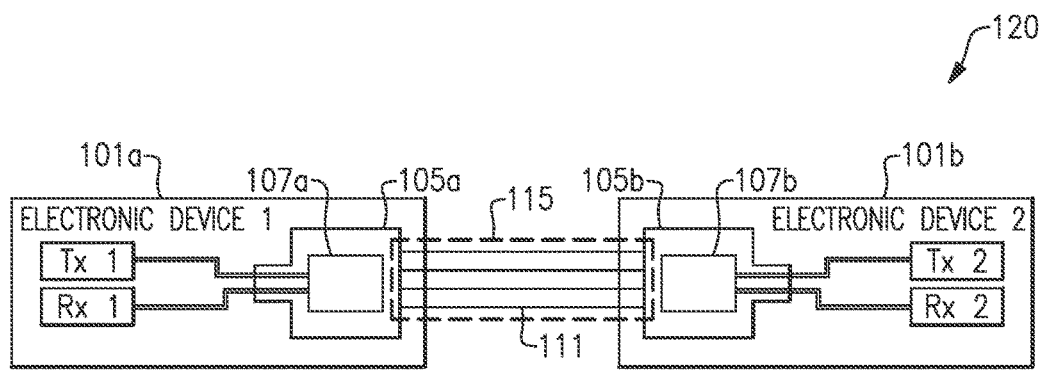
FIG. 2B is a schematic diagram of a high-speed point-to-point communication system according to another embodiment.

FIG. 2B is a schematic diagram of a high-speed point-to-point communication system 120 according to another embodiment.

In contrast to the communication system 100 shown in FIG. 2A which includes an active cable 110, the communication system 120 of FIG. 2B includes a passive cable 115. As shown in FIG. 2B, active componentry including the transceivers 107a, 107b is situated externally to the cable 115. For example, the first transceiver assembly 105a can be included in the first electronic device 101a, and the second transceiver assembly 105b can be included in the second electronic device 101b.

Accordingly, the illustrated configuration includes transceivers that are external to a cable. Thus, the teachings herein are applicable both to configurations in which one or more transceivers are integrated into a cable and to configurations in which one or more transceivers are located external to a cable.

Integrating transceivers into a cable can achieve a wide variety of advantages. For example, at a given bit rate, an active cable can permit communication over longer distance and/or with a thinner cable relative to a passive cable. Additionally, using an active cable can decrease jitter, noise, and/or ISI relative to a configuration using a passive cable. However, certain applications can use passive cables, for instance, to lower cable cost. For example, some passive cable configurations can be used in backplane applications.

Although FIGS. 2A and 2B illustrate two embodiments of high-speed communication links using cables, the teachings herein are also applicable to configurations in which point-to-point communications occur in other ways. In such configurations, the conductive lines 111 may be formed or otherwise included on a printed circuit board or other appropriate substrate instead of a cable. Thus, in such configurations, the conductive lines 111 can represent, for example, circuit board microstrip trace, PCB trace, and/or backplane trace, such as a conductive trace on FR-4 material.

In the embodiments shown in FIGS. 2A and 2B, each of the transceiver assemblies 105a and 105b includes a transceiver. For example, the first transceiver assembly 105a includes the first transceiver 107a, and the second transceiver assembly 105b includes the second transceiver 107b. In certain configurations, the first and second transceivers 107a, 107b are enclosed in a packaging. In certain configurations, each of the transceivers can be a monolithic device including analog and digital components included in a single integrated circuit (IC), for example, or may instead include multiple integrated circuits, depending on the embodiment.

In various implementations, the packaging can have a design and a form factor similar to the packaging defined by an existing interface standard (e.g., Thunderbolt Gen1/Gen2 or USB 2.0/3.0), although the packaging can have some other form factor. The packaging can comprise materials suitable for electronic and computer interfaces, such as plastic, metal or a composite material. Each of the transceiver assemblies 105a and 105b has an input port that is configured to mechanically and electrically connect, e.g., in a releasable fashion, to a corresponding port or other interface on the respective electronic device 101a, 101b, and an output port that is connected to the cable. The input port can include a connector similar to connectors of existing interface standards, including, but not limited to, Thunderbolt, USB 2.0/3.0, small form-factor pluggable (SFP), enhanced small form-factor pluggable (SFP+), and/or quad small form-factor pluggable (QSFP).

More than two electronic devices (e.g., 3, 4, 5, 6, or more devices) can be daisy chained together in some cases through the use of additional cables and transceivers. In one such example, the first electronic device 101a is a laptop or other personal computer, the second electronic device 101b is a television or other display device, and a third electronic device is a disk drive or other storage device. The television has a second port (not shown) configured to accept a connector of a third transceiver (not shown). The third transceiver is connected via a second cable (not shown) to a port on the hard disk drive.

In certain embodiments, the transceiver assemblies 105a and 105b implement an egress path by: (a) receiving at least two differential signals from a host device; (b) digitally re-timing, conditioning, and multiplexing the received differential signals; and (c) transmitting the multiplexed signal as a multi-level modulated signal (e.g., PAM-4) over the cable.

In certain embodiments, the transceiver assemblies are further configured to implement an ingress path by: (a) receiving a multi-level modulated signal (e.g., PAM-4) from the cable; (b) digitally conditioning and de-multiplexing the received multi-level modulated signal; and (c) transmitting the de-multiplexed signals as an analog signal to the host device.

In various implementations, the cable 110 of FIG. 2A and/or the cable 115 of FIG. 2B can include one or more electrical conducting lines 111 that can transport electrical signals between the first electronic device 101a and the second electronic device 101b. However, the teachings herein are also applicable to other configurations, such as configurations in which data is communicated optically between transceivers.

The conducting lines 111 can include metal (e.g., copper) conductors, for example. In some implementations, the conducting lines 111 can alternatively or additionally include one or more other types of conductors, such as one or more optical fibers that can transport optical signals. As indicated, the conducting lines 111 in alternative embodiments are not housed within a cable, and can instead reside on a PCB or other substrate.

The conducting lines 111 can include one or more sets of paired lines configured for differential signaling, which in some implementations include one or more sets of paired micro coaxial cables. However, other types of conducting lines 111 are possible. For example, shielded or unshielded twisted pair cables can be used in addition to any other appropriate type of cables, such as those that can support different data and video protocols (e.g., Serial ATA, Infiniband, PCI Express, DisplayPort I/O protocols, gigabit Ethernet, etc.).

Differential signaling is advantageously used according to certain embodiments to provide enhanced noise immunity via common-mode noise rejection, for example, among other benefits. As used herein, the term "differential" is used to describe a pair of conducting lines 111 (e.g., length matched conducting lines) being used to carry differential, e.g., complementary signals. The paired lines may in some cases be separately shielded, but nonetheless used to communicate a differential signal. For instance, as is described further herein, a pair of separately shielded micro coaxial cables can be used to transmit a differential signal. Such signal lines may or may not be balanced with respect to one another, depending on the embodiment.

While certain embodiments advantageously incorporate and are described for the purposes of illustration as implementing differential signaling, the techniques herein are compatible with and can be incorporated into systems that use single-ended signaling. For example, an individual signal line or singled-ended signal can be compared to an un-paired ground or other reference voltage.

In various implementations, the cable 110 of FIG. 2A and/or the cable 115 of FIG. 2B can be configured to transport data rates greater than 10 Gbit/s (e.g., 20 Gbit/s, 25 Gbit/s, 28 Gbit/s, 32 Gbit/s, 40 Gbit/s, 50 Gbit/s, 56 Gbit/s, 64 Gbit/s, 100 Gbit/s, 112 Gbit/s, 128 Gbit/s, 200 Gbit/s, 224 Gbit/s, 256 Gbit/s, 400 Gbit/s, and 448 Gbit/s or greater than any of these amounts, or rates between any of the foregoing values, etc.). In various implementations, the cable can have a length between about 0.5 m to about 10 m, for example, a length of about 2 m, about 3 m, about 4 m, about 5 m, about 6 m, about 7 m, about 9 m, or a length between the foregoing values, etc. In other implementations, the cable has a length greater than 10 m, for example, a length of about 10-15 m, about 15-20 m, about 20-30 m, about 30-50 m, about 50-100 m, or lengths between the foregoing, etc. In some embodiments, the cable 110 has a length of greater than 100 m. Thus, the length of the cable 110 of FIG. 2A and/or the cable 115 of FIG. 2B can depend on a variety of factors, including, for example, application, communication speed, signaling protocols, and/or operating environment.

In various implementations, the cable 110 of FIG. 2A and/or the cable 115 of FIG. 2B can be configured to support communication between the first electronic device 101a and the second electronic device 101b in either simplex mode, half-duplex mode or full-duplex mode. For example, the cable can include at least two channels/lanes, and each channel/lane can include a first paired differential cable for communication in a first direction and a second paired differential cable for communication in a second direction. A paired differential cable as discussed herein includes a pair of wires, each wire configured to transport a signal that that is equal or substantially equal in amplitude but opposite in polarity or phase. Accordingly, a differential paired cable can transport a differential signal including a p-channel and an n-channel, the p-channel and the n-channel being equal in amplitude but opposite in polarity or phase.

In addition to the paired differential lines, various implementations of cables can include power lines configured to supply power from one of the electronic devices 101a and 101b to the another electronic device. A cable can also include additional data or signal lines to transmit and receive data, control lines to transmit and receive control or handshake signals and one or more ground lines, etc., all of which may be used for transmitting data at substantially lower data rates than the paired differential lines.

Figure 3A:
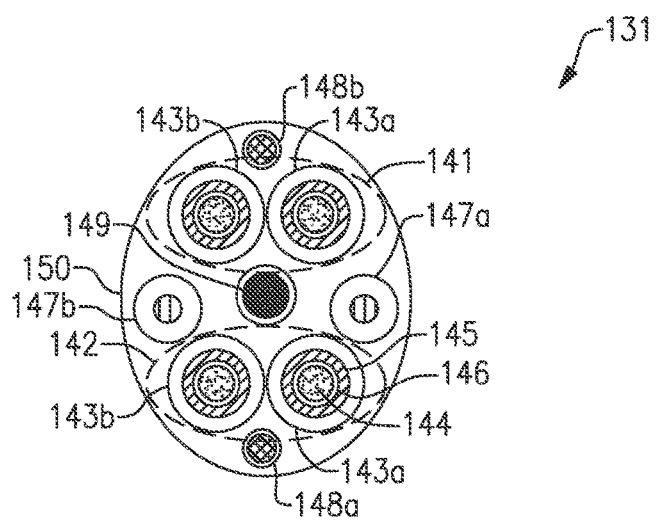
FIG. 3A illustrates a cross-sectional view of one embodiment of a cable.
Figure 3C:
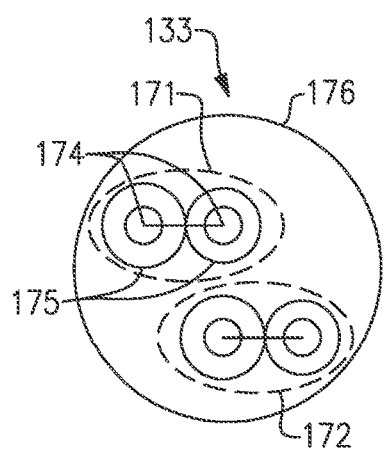
FIG. 3C illustrates a cross-sectional view of another embodiment of a cable.
Figure 3B:
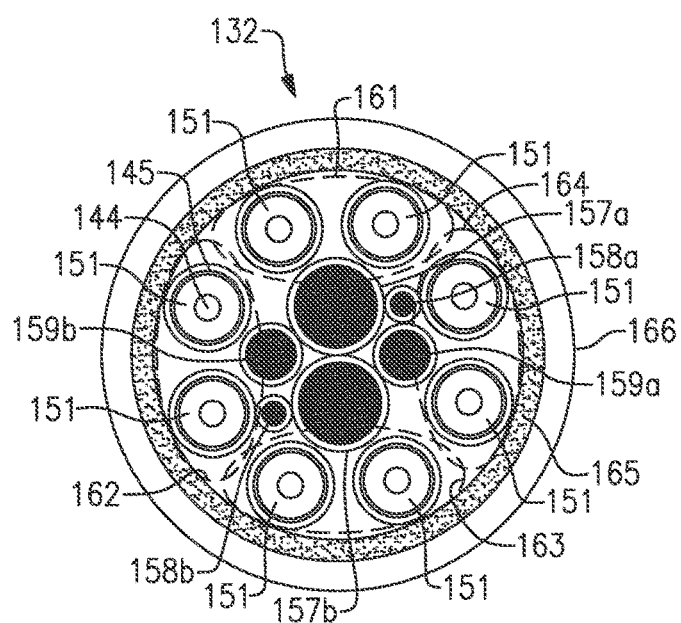
FIG. 3B illustrates a cross-sectional view of another embodiment of a cable.

FIGS. 3A-3C illustrate cross-sectional views of different implementations of a cable. The cross-sections can correspond to implementations of the cable 110 of FIG. 2A and/or the cable 115 of FIG. 2B. The cables shown in FIGS. 3A-3C are capable of transporting differential signals.

FIG. 3A illustrates a cross-sectional view of one embodiment of a cable 131.

The illustrated cable 131 includes a first pair of conducting lines 141 and a second pair of conducting lines 142. Each of the pairs of conducting lines 141-142 can be configured for differential signal transmission. For instance, the individual conducting lines in the pair can be implemented coaxially in certain embodiments. In the illustrated embodiment, each pair of conducting lines 141-142 includes a first micro coaxial cable 143a and a second micro coaxial cable 143b. In the depicted embodiment, each of the micro coaxial cables includes an inner conductor 144 and an outer conductor 145. An insulating material or a dielectric 146 is disposed between the inner conductor 144 and the outer conductor 145. In various implementations, the insulating material or dielectric 146 can include a polymer or a fluoroplastic material.

In the illustrated configuration, the cable 131 further includes a pair of power lines including a first power line 147a and a second power line 147b. Additionally, the cable 131 includes a pair of control lines including a first control line 148a and a second control line 148b. Furthermore, the cable 131 further includes a ground line 149.

In various implementations, one or more of the first pair of conducting lines 141, the second pair of conducting lines 142, the pair of power lines 147a-147b, the pair of control lines 148a-148b, and the ground line 149 are at least partially insulated. For example, in the illustrated configuration, a jacket 150 has been used to enclose the first pair of conducting lines 141, the second pair of conducting lines 142, the pair of power lines 147a-147b, the pair of control lines 148a-148b, and the ground line 149. The jacket 150 can be implemented in a variety of ways, and can include, for example, a polymer, fluoroplastic, and/or PVC. In certain configurations, a micro coaxial cable includes inner and outer conductors (for example, the micro coaxial cable 143a includes the inner conductor 144 and the outer conductor 145) implemented using a fine gauge wire. In some embodiments, the first and second micro coaxial cables 143a, 143b share a common ground reference.

In certain configurations, a cable includes at least one logical channel in each direction. For example, in the embodiment shown in FIG. 3A, the upper pair 141 of micro coaxial cables can be used to transmit a first differential signal in a first direction, forming a first logical channel, and the lower pair 142 of micro coaxial cables can be used to transmit a second differential signal in the opposite direction, forming a second logical channel. The first direction can correspond to an egress/transmit direction and the second direction can correspond to an ingress/receive direction, or vice versa.

Although FIG. 3A illustrates an embodiment of a cable that includes a specific configuration of signal and power lines, other embodiments are possible, including, for example, cables that include different numbers of logical channels and/or physical wires.

For example, FIG. 3B illustrates a cross-sectional view of another embodiment of a cable 132. The cable 132 includes eight individual conducting lines 151, which can be, for example, micro coaxial cables. As depicted by the dashed lines, according to some embodiments, each of the conducting lines 151 can be paired with another of the conducting lines 151 to form a differential pair, and a single corresponding logical channel. For example, the cable 132 can include a first pair of conducting lines 161, a second pair of conducting lines 162, a third pair of conducting lines 163, and a fourth pair of conducting lines 164.

Thus, the illustrated embodiment can include four logical channels (e.g., two in each direction) each represented by a corresponding pair of the conducting lines 151. As shown in FIG. 3B, each conducting line 151 can include an inner conductor 144 surrounded by an outer conductor 145. In various implementations, a dielectric can be disposed between the inner conductor 144 and the outer conductor 145, as was described earlier with respect to FIG. 3A. In various implementations, one or more of the conducting lines 151 can include insulation and/or a shield. The implementation depicted in FIG. 3B further includes a pair of insulated power lines including a first power line 157a and a second power line 157b, a pair of insulated control lines including a first control line 158a and a second control line 158b, and a pair of insulated ground lines including a first ground line 159a and a second ground line 159b. The pairs of the conducting lines 161-164, the pair of insulated power lines 157a-157b, the pair of insulated control lines 158a-158b, and the pair of ground lines 159a-159b can be shielded by a shield 165 and enclosed in a jacket 166. In certain configurations, the shield can be implemented as a braided shield, and the jacket 166 can include a polymer, fluoroplastic and/or PVC. However, other configurations are possible.

Micro coaxial cables can exhibit relatively stable and reliable data transmission, support relatively high speeds, and have a relatively low-profile form factor as compared to other types of cabling. Other types of coaxial cables can have similar advantages and can be used in certain embodiments. For example, a cable can include twinaxial cables ("Twinax"), where each Twinax cable includes two inner conductors instead of a single inner conductor. In such cases, the two inner conductors can be configured to implement differential signaling.

In some other implementations, shielded or unshielded twisted pair cabling can be used.

FIG. 3C illustrates a cross-sectional view of another embodiment of a cable 133. The illustrated cable 133 includes two twisted pairs of conducting lines including a first twisted pair 171 and a second twisted pair 172. Each of the twisted pairs 171-172 includes a pair of conductors 174, such as copper conductors. The pair of conductors 174 can be surrounded by an insulating material 175. In various embodiments, each of the twisted pairs 171-172 can be shielded by a shield, such as a shield similar to the shield 165 of FIG. 3B. In other configurations, the twisted pairs 171-172 can be unshielded.

In some implementations, the two twisted pairs 171-172 of cables can be enclosed in a jacket 176, such as a polymer, fluoroplastic and/or a PVC jacket.

In certain implementations, the cable 133 illustrated in FIG. 3C can include power lines, ground lines and/or control lines as discussed above with reference to FIGS. 3A-3B. Additionally, although the cable 133 is illustrated as including two twisted pairs, the cable 133 can be modified to include more or fewer twisted pairs.

Depending on the embodiment, the cables 131-133 of FIGS. 3A-3C can include a wide variety of cable types. For example, a cable can include any of the following types of cables, without limitation: Category ("Cat") 5, Cat5e, Cat6, Cat6a, Class F, and Class Fa.

Figure 4A:
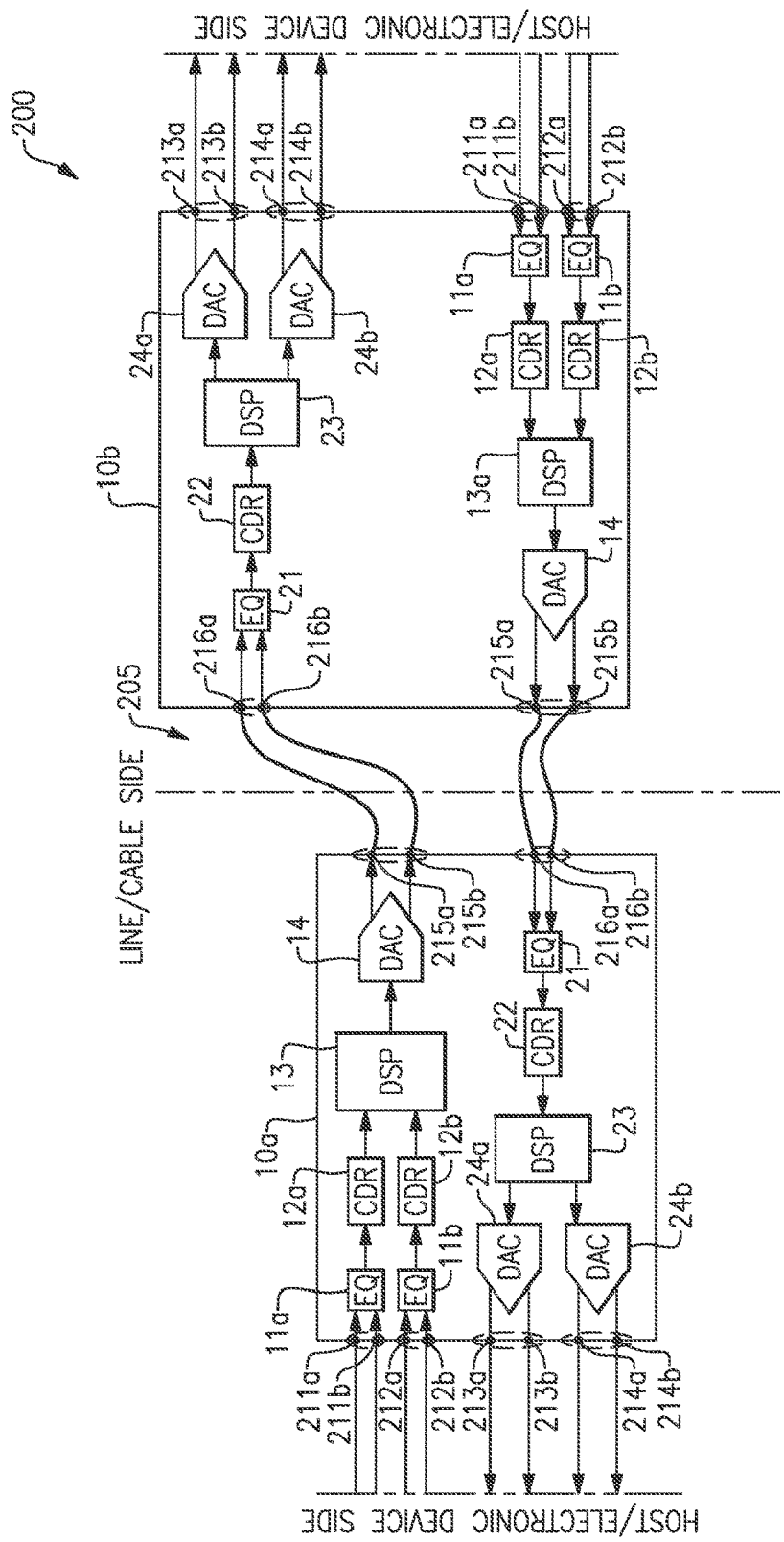
FIG. 4A illustrates an example of a communication system including a transceiver connected to another similar transceiver by a cable.

FIG. 4A illustrates an example of a communication system 200 including a first transceiver 10a connected to another similar transceiver 10b by a cable 205. The first and second transceivers 10a, 10b are implemented in a manner similar to that of the transceiver 10 of FIG. 1A, with differential signaling used on the host and line sides of the transceivers.

Although the communication system 200 of FIG. 2A is shown as including transceivers similar to the transceiver 10 of FIG. 1A, other configurations are possible. For example, any of the transceivers shown in FIGS. 1A-1D can communicate with one another over a cable.

As shown in FIG. 4A, the first and second transceivers 10a, 10b have a host side for facing an electronic device and a line side for facing the cable 205. For example, with reference back to FIG. 2A, the first transceiver 10a can communicate with a first electronic device 101a and the second transceiver 10b can communicate with a second electronic device 101b. Thus, the transceivers 10a, 10b each include an egress path configured to transport signals from an electronic device towards the cable 205 and an ingress path configured to transport signals from the cable 205 to the electronic device. For example, the first transceiver 10a includes an egress path for transmitting signals from a first electronic device to the cable 205 and an ingress path for providing signals received over the cable 205 to the first electronic device. Similarly, the second transceiver 10b includes an egress path for transmitting signals from a second electronic device to the cable 205 and an ingress path for providing signals received over the cable 205 to the second electronic device.

The transceivers 10a, 10b depicted in FIG. 4A each include a first pair of input interfaces 211a-211b and a second pair of input interfaces 212a-212b on the electronic device or host side of the egress path. Each pair of input interfaces 211a-211b, 212a-212b is configured to receive a differential signal including a p-channel and an n-channel from an electronic device. In various implementations, the differential signal received from the electronic device can have a data rate between about 400 Mbits/s and about 32 Gbit/s. However, other configurations are possible.

In certain configurations, the differential signal received from an electronic device by a transceiver can be, for example, an NRZ or other binary coded signal. However, other modulation formats are possible, including, but not limited to, PAM-4, 8 level PAM (PAM-8), 16 level PAM (PAM-16), and/or duobinary modulation. In certain configurations, the differential signals received by a transceiver on the host side can be a baseband signal.

As shown in FIG. 4A, the transceivers 10a, 10b each include a first pair of output interfaces 213a-213b and a second pair of output interfaces 214a-214b on the electronic device side of ingress path. Each pair of output interfaces 213a-213b, 214a-214b is configured to transmit a differential signal including a p-channel and n-channel to an electronic device connected to the host side. In some embodiments, the pairs of output interfaces each transmit a differential signal utilizing the same data rate and encoding scheme as the pairs of input interfaces on the electronic device side of the egress path. For instance, each differential signal can be a baseband signal and can have a data rate of between about 400 Mbits/s and about 32 Gbit/s.

In certain configurations, a transceiver sends data to an electronic device on the host side using differential signals transmitted using an NRZ or other binary coded signal. However, other modulation formats are possible.

Although the implementation depicted in FIG. 2B illustrates two pairs of input and output interfaces on the host side, the teachings herein are applicable to transceivers having more than two pairs of input and/or output interfaces. For example, the transceivers 10a, 10b in one embodiment have four pairs of input and output interfaces, although other numbers are possible including three, eight, twelve or sixteen pairs of input and output interfaces, for example.

The first and second transceivers 10a, 10b depicted in FIG. 4A each further include a pair of output interfaces 215a-215b on the cable or line side of the egress path. The pair of output interfaces 215a-215b is configured to output a differential signal including a p-channel and an n-channel to the cable 205. The differential signal output from the output interfaces 215a-215b of a particular transceiver is transmitted through the cable 205 to another transceiver connected to the other end of the cable 205, which in turn is connected to another electronic, computing, storage or peripheral device.

In the illustrated configuration, the output differential signal from the pair of output interfaces 215a-215b can be generated by multiplexing the input differential signals received at the input interfaces 211a-211b, 212a-212b. Accordingly, the data rate of the differential signal output from the output interfaces 215a-215b can be higher than a data rate of either of the input differential signals received at the first pair of input interfaces 211a-211b or the second pair of input interfaces 212a-212b.

In various implementations, the differential signal output from the output interfaces 215a-215b can have a data rate between about 800 Mbits/s and about 128 Gbit/s. In one embodiment, the differential signal output from the output interfaces 215a-215b is a PAM-4 modulated signal. However, other modulation formats can be used, including, for example, NRZ, PAM-8, PAM-16, duobinary modulation, PSK, and/or DSPK. In various implementations, the differential signal output from the output interfaces 215a-215b can be a baseband signal.

As shown in FIG. 4A, the first and second transceivers 10a, 10b each further include a pair of input interfaces 216a-216b on the cable side of the ingress path that are configured to accept or receive a differential signal including a p-channel and an n-channel from the cable 205. The differential signal received at the pair of input interfaces 216a-216b is a multiplexed signal from another transceiver connected to the other end of the cable 205. The transceiver can be configured to de-multiplex the differential signal received at the pair of input interfaces 216a-216b and transmit it as outgoing differential signals from the pair of output interfaces 213a-213b, 214a-214b to an electronic device connected on the host side. Accordingly, the differential signal received at the pair of input interfaces 216a-216b can have a data rate higher than the data rate of differential signals outputted from the pair of output interfaces 213a-213b or the pair of output interfaces 214a-214b.

In various implementations, the differential signal received at the input interfaces 216a-216b can have a data rate between about 800 Mbits/s and about 128 Gbit/s. In one embodiment, the differential signal received at the input interfaces 216a-216b is a PAM-4 modulated signal. However, other modulation formats can be used, including, for example, NRZ, PAM-8, PAM-16, duobinary modulation, PSK, and/or DSPK. In various implementations, the differential signal received at the input interfaces 216a-216b can be a baseband signal.

Additional details of the communication system 200 can be similar to those described earlier.

Figure 4B:
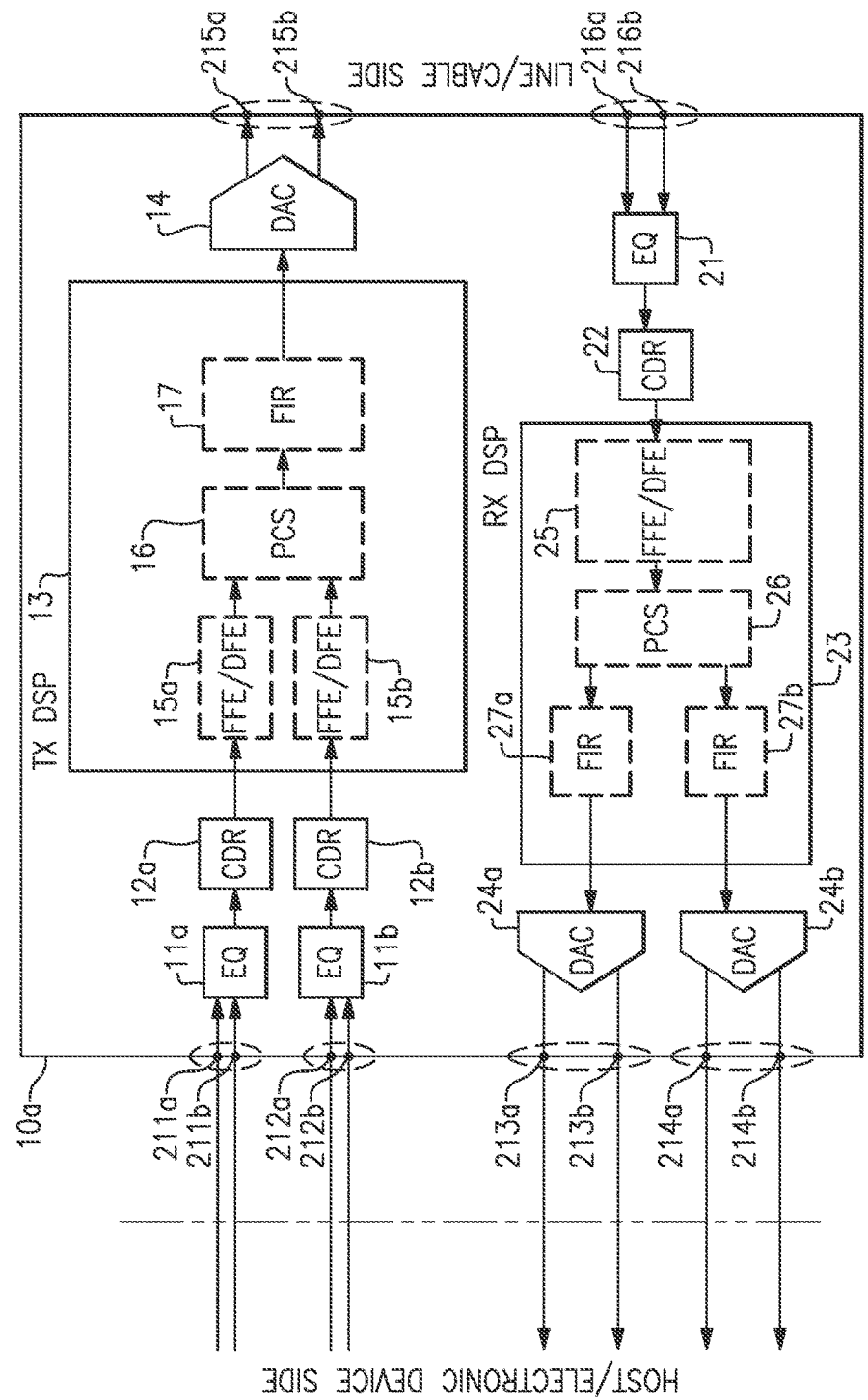
FIG. 4B illustrates a portion of the communication system of FIG. 4A.

FIG. 4B illustrates a portion of the communication system 200 of FIG. 4A including the first transceiver system 10a.

As shown in FIG. 4B, the first transceiver 10a includes, along the egress path from the electronic device side to the cable side, a pair of equalizers 11a-11b, a pair of CDR circuits 12a, 12b, a DSP 13, and a DAC 14. The equalizers 11a-11b can compensate for cable loss, and in some cases is configured to perform one or more other functions, such as balancing the amplitude and/or frequency characteristics between the p- and n-channels.

The CDR circuits 12a-12b can digitize the incoming signals as well as to implement timing recovery to recover a clock and a data signal from the incoming differential signals. Embodiments of the CDR circuits 12a-12b are described in greater detail below. The presence of the clock and data recovery circuits 12a-12b in the transceiver 10a allows the transceiver 10a to operate without requiring a high quality external reference clock. This can result in reduced complexity, cost savings, lower power consumption, and/or other benefits and advantages.

As is described in detail herein, in some embodiments, the CDR circuits 12a-12b recover the clock and data signals in the digital domain. To recover clock and data signals digitally, the CDR circuits 12a-12b can include analog to digital converters (ADCs). For example, a dedicated ADC can be used to recover the clock signal, and can have a lower number of bits than a separate data ADC used to recover a data signal. Use of separate ADCs in clock and data recovery paths advantageously allows a CDR circuit to recover a clock signal faster than a conventional analog clock recovery circuit. Thus, the CDR circuits described herein can exhibit reduced latency. For example, in various implementations, a CDR circuit can perform timing recovery, such as recovering timing information from the incoming data stream, within a few tens or hundreds of nanoseconds. In one embodiment, the latency of the CDR is about 4 ns, and the CDR has a time constant of about 10 ns.

In some arrangements, the recovered digital clock and data signals from the CDR circuits 12a-12b are input to the DSP 13 for further processing. The DSP 13 can include one or more digital filters (e.g., a finite impulse response (FIR) filter), one or more delay blocks, a feed-forward equalizer (FFE) and/or decision feedback equalizer (DFE) and/or one or more first-in-first-out (FIFO) buffers and can generally be configured to condition and multiplex the digital data signal to a multiplexed signal at a higher bit-rate than the bit-rate of the incoming differential signals. The DSP 13 can include one or more FIR filters (e.g., a five tap FIR filter with tap coefficients S5.3, S7.3, S8.3, S7.3, S5.3) to generate symbol sequence for the multiplexed signal corresponding to a desired modulation format.

The DSP 13 can also include a mapper that determines the signal components for the multiplexed signal according to the desired modulation format. In one preferred implementation, the transceiver is configured to output the multiplexed signal as a 4-level pulse amplitude modulation (PAM-4) encoded differential signal. However, any other suitable modulation format such as for example, NRZ, duobinary, DPSK, PSK, etc. can be used in other implementations. The output of the DSP 13 is converted to an analog signal by the DAC 14 before being output to the cable 205 shown in FIG. 4A.

While not shown explicitly, certain portions of the egress path can include multiple parallel instantiations of their respective componentry, respectively. For example, parallel instantiations of componentry can be included for each of the parallel egress signal paths, for instance, in a manner similar to the transceivers described further below. As indicated, the DSP 13 may implement a multiplexing function, and in such cases may generally only include parallel instantiations of componentry up until the point of multiplexing, which can occur in a physical coding sublayer (PCS) of the DSP 13 in certain embodiments.

As shown in FIG. 4B, the first transceiver 10a further includes, along the ingress path from the cable side to the electronic device side, an equalizer 21, a CDR circuit 22, a DSP 23, and a pair of DACs 24a, 24b. The equalizer 21 can be configured to compensate for losses occurring during transmission over the cable, and can also be configured to perform other functions, such as balancing the amplitude and/or frequency characteristics between the p- and n-channels of the incoming differential signal. The equalizers 21 can comprise analog equalizing filters, for example.

In some embodiments, the CDR circuit 22 is configured to digitize the incoming signals as well as to implement timing recovery to recover a clock and a data signal from the incoming differential signals. The CDR circuit 22 can be similar to the CDR circuits 11a, 11b in certain configurations. However, other implementations are possible. In one embodiment, the CDR circuit 22 recovers clock and data signals in the digital domain. To recover clock and data signals digitally, in some arrangements, the CDR circuit 22 includes analog to digital converters (ADCs).

In some implementations, the digital clock and data signals from the CDR 22 are input to the DSP 23 for further processing. The DSP 23 can include one or more digital filters, such as a finite impulse response (FIR) filter, one or more delay blocks, a feed-forward equalizer (FFE) and/or a decision feedback equalizer (DFE), a thresholder, and/or one or more first-in-first-out (FIFO) circuits that are configured to condition and de-multiplex the digital data signal to a plurality of de-multiplexed signal at a lower bit-rate than the bit-rate of the incoming differential signals.

In various implementations, the DSP 23 can also include one or more FIR filters and de-mapper to determine the signal components for the de-multiplexed data signal according to the desired modulation format. In some embodiments, the transceiver is configured to output the de-multiplexed signal as a differential signal encoded as NRZ format. However, any other suitable modulation format can be used in other implementations. The output of the DSP 23 is converted to an analog signal by the DACs 24a, 24b before being transmitted to the electronic device.

In the illustrated configuration, the DSP 13 of the egress path includes a first feed-forward equalizer and/or decision feedback equalizer (FFE/DFE) block 15a, a second FFE/DFE block 15b, a PCS block 16, and a finite impulse response (FIR) filter 17. Additionally, in the illustrated configuration, the DSP 23 in the ingress path includes an FFE/DFE block 25, a PCS block 26, a first FIR filter 27a, and a second FIR filter 27b. Thus, the DSP 23 can include componentry implementing similar functionality to the componentry in the egress path.

FIG. 4B also illustrates that the transceiver 10a can include parallel instances of certain componentry, allowing for the processing of separate channels independently. For example, there are generally multiple instances of the DSP 13 componentry that reside in the egress path prior to the multiplexing function performed by the PCS block 16. In the illustrated configuration, the transceiver 10a includes multiple instances of the equalizers 11a-11b, the CDR circuits 12a-12b, and the FFE/DFE blocks 15a-15b. Similarly, there can be multiple instances of the DSP 23 componentry that reside in the ingress path subsequent to the de-multiplexing function performed by the PCS block 26. In the illustrated configuration, the transceiver 10a includes multiple instances of the FIR filters 27a, 27b and the DACs 24a, 24b.

Referring to the DSP 13 componentry in the egress path, the FFE/DFE blocks 15a-15b can implement one or more digital filters configured to equalize the incoming signal and compensate for channel effects including pre-and post-cursor ISI. The filters can include an FFE and/or a DFE, for example.

The PCS block 16 performs one or more processing functions on the incoming data streams that can include, without limitation, framing, scrambling, error correction, and/or mapping. The PCS block 16 can implement a multiplexing function in which the PCS block 16 combines a first number of incoming data channels into a smaller number of outgoing data channels. The multiplexing can be achieved using an encoding scheme, for instance, in which the PCS block 16 maps incoming data having a first coding scheme into a second coding scheme having a higher resolution. For instance, in one embodiment, the PCS block 16 receives multiple data channels (e.g., 2, 4, or more data channels) encoded using a two level encoding scheme (e.g., NRZ) and maps the data channels into a single outgoing PAM-4 data channel.

The FIR filter 17 can include one or more finite impulse response (FIR) filters, and is generally configured to receive the multiplexed signal, condition the signal, and forward the processed signal to the DAC 14. For example, FIR filters can be used to perform emphasis on the signal to compensate for channel losses. Although illustrated as including the FIR filters, the DSP 13 can include additional processing componentry that can be used to further process signals. For example, the DSP 13 can be used to perform a de-emphasis function, e.g., to compensate for losses in the channel that are larger at certain (e.g., higher) frequencies.

The DSP 23 in the ingress path can include componentry that is similar to the DSP 13 in the egress path. However, because the data stream received from the line by the ingress path is already multiplexed and is transmitted over a different physical channel than the signals received on the egress path, the DSP 23 componentry in the ingress path can differ in certain ways from the DSP 13 componentry in the egress path. For instance, because the incoming data stream(s) is multiplexed, there may be a reduced number of instances of the FFE/DFE block 25 as compared to the DSP 13 componentry in the egress path. In the illustrated embodiment, the data is multiplexed to a single logical channel, and there is only one instance of the FFE/DFE block 25 in the ingress path.

Moreover, the PCS block 26 in the ingress path is configured to de-multiplex the incoming data channel(s), generally undoing the multiplexing function performed in the egress path. For instance, where NRZ and PAM-4 coding are used on the host and line side, respectively, the PCS block 26 maps the received PAM-4 signal to two or more NRZ data channels. To handle the de-multiplexed output of the PCS block 26, there may be multiple instances of the FIR filters 27a-27b and/or additional signal processing componentry—e.g., one corresponding to each data channel. In contrast to the FIR filters 27a-27b of the DSP 23 that handle de-multiplexed data, the FIR filter 17 of the DSP 13 handles multiplexed data.

Additional details of the transceiver 10a can be similar to those described earlier.

Figure 5:
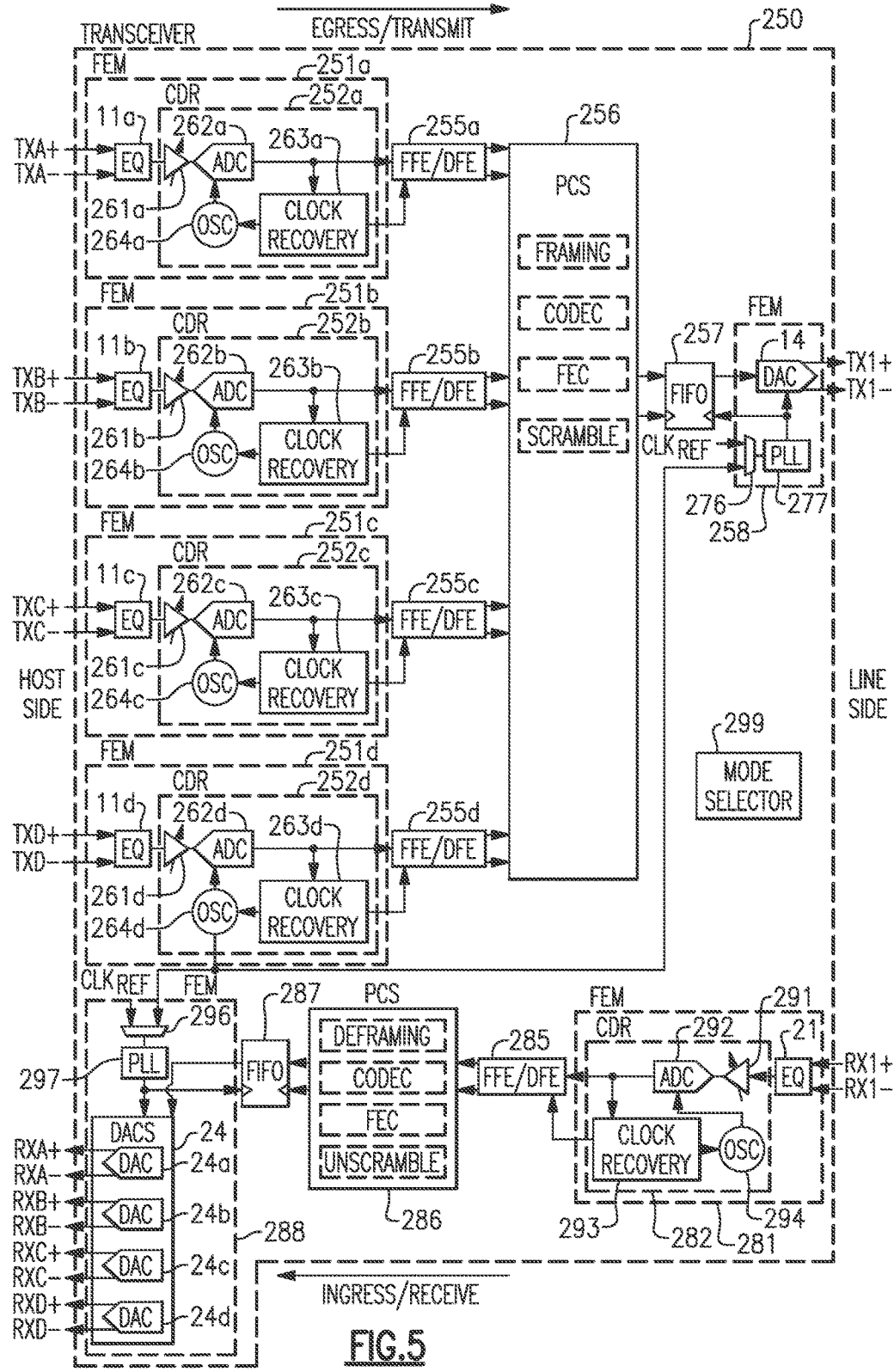
FIG. 5 is a schematic diagram of another embodiment of a transceiver.

FIG. 5 is a schematic diagram of another embodiment of a transceiver 250. The transceiver 250 includes a first transmit path host-side front-end module (FEM) 251a, a second transmit path host-side FEM 251b, a third transmit path host-side FEM 251c, a fourth transmit path host-side FEM 251d, a first transmit path FFE/DFE 255a, a second transmit path FFE/DFE 255b, a third transmit path FFE/DFE 255c, a fourth transmit path FFE/DFE 255d, a transmit path PCS block 256, a transmit path first in first out (FIFO) buffer 257, a transmit path line-side FEM 258, a receive path line-side FEM 281, a receive path FFE DFE 285, a receive path PCS block 286, a receive path FIFO buffer 287, and a receive path host-side FEM 288.

As shown in FIG. 5, the first transmit path host-side FEM 251a includes a first transmit path equalizer 11a and a first transmit path CDR circuit 252a, which includes a first automatic gain controller or thresholder 261a, a first ADC 262a, a first clock recovery circuit 263a, and a first controllable oscillator 264a. Additionally, the second transmit path host-side FEM 251b includes a second transmit path equalizer 11b and a second transmit path CDR circuit 252b, which includes a second thresholder 261b, a second ADC 262b, a second clock recovery circuit 263b, and a second controllable oscillator 264b. Furthermore, the third transmit path host-side FEM 251c includes a third transmit path equalizer 11c and a third transmit path CDR circuit 252c, which includes a third thresholder 261c, a third ADC 262c, a third clock recovery circuit 263c, and a third controllable oscillator 264c. Additionally, the fourth transmit path host-side FEM 251d includes a fourth transmit path equalizer 11d and a fourth transmit path CDR circuit 252d, which includes a fourth thresholder 261d, a fourth ADC 262d, a fourth clock recovery circuit 263d, and a fourth controllable oscillator 264d.

The illustrated transmit path line-side FEM 258 includes a transmit path DAC 14, a multiplexer 276 and a phase-locked loop (PLL) 277. Additionally, the receive path line-side FEM 281 of FIG. 5 includes a receive path equalizer 21 and a receive path CDR circuit 282, which includes a thresholder 291, an ADC 292, a clock recovery circuit 293, and a controllable oscillator 294. Furthermore, the illustrated receive path host-side FEM 288 includes a multiplexor 296, a PLL 297, and a plurality of receive path DACs 24 including a first receive path DAC 24a, a second receive path DAC 24b, a third receive path DAC 24c, and a fourth receive path DAC 24d.

The transceiver 250 can be included in a communication link. For example, the transceiver 250 can be included in the communication systems depicted in FIGS. 2A and 2B. Certain details of the transceiver 250 can be similar to those described earlier.

As shown in FIG. 5, the transceiver 250 has a host side facing an electronic device, and a line side facing a cable. In the illustrated configuration, the transceiver 250 includes four pairs of input interfaces disposed on the host side of the egress path. Each pair of input interfaces can be configured to receive a differential signal including a p- and an n-channel from the electronic device to which it is connected. For example, in the illustrated configuration, the first transmit path equalizer 11a receives a first host side differential transmit signal TXA+, TXA−, the second transmit path equalizer 11b receives a second differential transmit signal TXB+, TXB−, the third transmit path equalizer 11c receives a third differential transmit signal TXC+, TXC−, and the fourth transmit path equalizer 11d receives a fourth differential transmit signal TXD+, TXD−.

In various implementations, the differential signal input to each pair of input interfaces on the host side can have a data rate between about 400 Mbits/s to about 32 Gbit/s. The differential signals input to each pair of input interfaces on the electronic device side carry NRZ modulated data in some embodiments. In other cases, other modulation formats other than NRZ can be used such as, for example, duobinary, PAM, DPSK, PSK, etc.

The transmit path PCS block 256 can be used to multiplex the plurality of input differential signals and generate a multiplexed differential signal that is provided as a differential output on the cable side of the egress path. In various implementations, the multiplexed differential signal can have a data rate between about 800 Mbits/s and about 128 Gbit/s. In certain embodiments, the multiplexed differential signal has a PAM-4 modulation format, although other formats are possible (e.g., NRZ, PAM-8, PAM-16, duobinary, PSK, DPSK, etc.).

In the illustrated configuration, the transceiver 250 includes four pairs of output interfaces disposed on the host side of the ingress path. In some embodiments, each pair of output interfaces is configured to output a differential signal including a p- and an n-channel to the electronic device to which it is connected. For example, in the illustrated configuration, the first receive path DAC 24a generates a first host side differential receive signal RXA+, RXA−, the second receive path DAC 24b generates a second host side differential receive signal RXB+, RXB−, the third receive path DAC 24c generates a third host side differential receive signal RXC+, RXC−, and the fourth receive path DAC 24d generates a fourth host side differential receive signal RXD+, RXD−.

In various implementations, the differential signal output from each pair of the output interfaces on the host side can have a data rate between about 400 Mbits/s to about 32 Gbit/s. In various implementations, the differential signals output from each pair of output interfaces on the electronic device side can include NRZ modulated data. In certain embodiments, the multiplexed differential signal has a PAM-4 modulation format, although other formats are possible (e.g., NRZ, PAM-8, PAM-16, duobinary, PSK, DPSK, etc.).

Although FIG. 5 illustrates a configuration in which a transceiver receives four differential transmit signals on the host side and generates four differential receive signals on the host side, the teachings herein are applicable to configurations in which a transceiver receives more of fewer transmit signals on the host side and/or generates more or fewer receive signals on the host side.

The receive path PCS block 286 can be used to de-multiplex the input multiplexed differential signals received from the cable side input interfaces along the ingress path into the plurality of output differential signals transmitted to the host/electronic device side along the ingress path. In various implementations, the input multiplexed differential signal can have a data rate between about 800 Mbits/s and about 128 Gbit/s. The differential signals input to each pair of input interfaces on the electronic device side carry NRZ modulated data in some embodiments. In other cases, other modulation formats other than NRZ can be used such as, for example, duobinary, PAM, DPSK, PSK, etc.

As shown in FIG. 5, four transmit path or egress host-side FEMs 251a-251d have been included in the transceiver 250. Each of the egress host-side FEMs 251a-251d is coupled to one of the four pairs of input interfaces and configured to receive an input differential signal from the pair of input interfaces to which it is coupled.

In the illustrated configuration, the first CDR circuit 252a includes the first transmit path thresholder 261a, which can be used to control a gain or signal level of an equalized signal generated by the first transmit path equalizer 11a. The first transmit path thresholder 261a can aid in providing gain control in a variety of applications. The first ADC 262a can be used to convert an analog output of the first transmit path thresholder 261a into a digital output signal, which can correspond to digital data recovered from the first host side differential transit data signal TXA+, TXA−. The first clock recovery circuit 263a can be used to analyze the digital data generated by the first ADC 262a to control the clock signal generated by the first controllable oscillator 264a. The first clock recovery circuit 263a can be used to control the first controllable oscillator 264a to align a sampling clock signal of the ADC 262a to a unit interval of the first host side differential transit data signal TXA+, TXA−. The second to fourth CDR circuits 252b-252d can operate in a manner similar to that of the first CDR circuit 252a.

Although the transceiver 250 of FIG. 5 illustrates a particular configuration of CDR circuits, the teachings herein are applicable to other configurations of CDR circuits. For example, as will be discussed further herein, a CDR circuit can include separate ADCs for data and timing recovery. Accordingly, in certain configurations, one or more of the CDR circuits of FIG. 5 can include a data recovery ADC and a separate clock recovery ADC.

Each of the transmit path host-side FEMs 251a-251d outputs a digital data signal and a digital clock signal recovered from respective input differential signals applied to the FEMs. In various implementations, the ADC 262a can be omitted in favor of including a first or data recovery ADC for digitizing the data signal and a second or clock recovery ADC dedicated to clock recovery. In certain configurations, the first ADC can have at least 3 bits, and the second ADC has a lower number of bits, e.g., at least 2 bits. In one embodiment, the first ADC is a 7-bit ADC, and the second ADC is a 2-bit ADC.

As shown in FIG. 5, the first transmit path FFE/DFE 255a receives a first recovered data signal and a first recovered clock signal from the first transmit path host-side FEM 251a. Additionally, the second transmit path FFE/DFE 255b receives a second recovered data signal and a second recovered clock signal from the second transmit path host-side FEM 251b. Furthermore, the third transmit path FFE/DFE 255c receives a third recovered data signal and a third recovered clock signal from the third transmit path host-side FEM 251c. Additionally, the fourth transmit path FFE/DFE 255d receives a fourth recovered data signal and a fourth recovered clock signal from the fourth transmit path host-side FEM 251d.

The recovered data and clock signals from the transmit path host-side FEMs 251a-251d can be conditioned using the FFE/DFEs 255a-255d, which can include one or more feed forward equalizers (FFEs) and/or decision feedback equalizers (DFEs). The FFE/DFEs 255a-255d can be configured to reduce the amount of signal distortion resulting from ISI or other signal impairments.

As shown in FIG. 5, the equalized recovered clock and data signals from the FFE/DFEs 255a-255d are provided to the transmit path PCS block 256, which performs a multiplexing function. For instance, in one embodiment, the transmit path PCS block 256 in a first operational mode translates two 20 Gbit/s NRZ data streams into a PAM-4 40 Gbit/s stream and in a second operational mode translates four 10 Gbps NRZ streams into a PAM-4 40 Gbit/s stream. The transmit path PCS block 256 can be configured to implement a variety of functions including framing, error correction (e.g., forward error correction), scrambling, etc.

For example, the transmit path PCS block 256 can be configured to perform one or more of the following: align the frames of the incoming data signals to be multiplexed; encode the incoming data signals and/or the multiplexed data signals using error-correcting codes to control errors in the transported data; scramble the incoming data signals and/or the multiplexed data signals for encryption purposes, etc. As shown in FIG. 5, the transmit path PCS block 256 can provide a multiplexed data signal and a clock signal to the transmit path FIFO buffer 257. Additionally, an output of the transmit path FIFO buffer 257 is provided to the transmit path line-side FEM 258.

The illustrated transmit path line-side FEM 258 includes the multiplexor 276, which can be used to select a clock input to the PLL 277 by selecting between a reference clock signal $CLK_{REF}$ and a clock outputted from one of the transmit path host-side FEMs, such as the fourth transmit path host-side FEM 251d. The PLL 277 can be used to generate a DAC clock signal for controlling the transmit path DAC 14 based on the clock signal selected by the multiplexor 276. In particular, the PLL 277 can control timing of transmissions of the transmit path DAC 14 along a cable by locking the phase and frequency of the DAC clock signal to the clock signal selected by the multiplexor 276. The DAC clock signal is also provided to the transmit path FIFO buffer 257 to control data buffering operations, such as controlling timing of data outputted from the buffer.

Including the multiplexor 276 can enhance the flexibility of the transceiver 250 by permitting timing of transmissions along the cable to be selectively controlled using either the reference clock signal $CLK_{REF}$ or a clock signal recovered from an input data stream on the host-side. In certain configurations, the reference clock signal $CLK_{REF}$ is a free-running clock signal.

In the illustrated embodiment, the transceiver 250 includes an ingress or receive path line-side FEM 281 that receives a line side differential receive signal RX1+, RX1−, which can correspond to a multiplexed differential signal transmitted by another transceiver attached to the other end of the cable.

The receive path line-side FEM 281 includes the receive path equalizer 21 and the receive path CDR circuit 282. The receive path CDR circuit 282 includes the thresholder 291, the ADC 292, the clock recovery circuit 293, and the controllable oscillator 294, and can operate in a manner similar to that described earlier. Although the receive path CDR circuit 282 is illustrated as including a single ADC, in certain configurations the receive path CDR circuit 282 can include separate ADCs for data and timing recovery in a manner similar to that described further below.

As shown in FIG. 5, the receive path line-side FEM 281 is configured to output a digital data signal and a digital clock signal recovered from the line side differential receive signal RX1+, RX1−. Although illustrated as including one ADC 292, in certain configurations the receive path line-side FEM 281 can include a first ADC for digitizing the data signal and a second ADC dedicated to clock recovery. In certain implementations, the first ADC can have at least 3 bits, and the second ADC can have a lower number of bits, e.g., at least 2 bits.

In the illustrated configuration, the receive path FFE/DFE 285 receives a recovered data signal and a recovered clock signal from the receive path line-side FEM 281. In a manner similar to that discussed above, the FFE/DFE 285 can reduce signal distortion resulting from ISI or other signal impairments.

The digital data and clock signal output from the receive path FFE/DFE 285 is de-multiplexed by the receive path PCS block 286. The receive path PCS block 286 can also perform functions that include de-framing, error correction (e.g., forward error correction), un-scrambling, etc.

As shown in FIG. 5, the receive path PCS block 286 can provide a multiplexed data signal and a clock signal to the receive path FIFO buffer 287. Additionally, an output of the receive path FIFO buffer 287 is provided to the receive path host-side FEM 288.

The illustrated receive path host-side FEM 288 includes the multiplexor 296, which can be used to select a clock input to the PLL 297 by selecting between a reference clock signal $CLK_{REF}$ and a clock outputted from one of the transmit path host-side FEMs, such as the fourth transmit path host-side FEM 251d. The PLL 297 can be used to generate one or more DAC clock signals for controlling the receive path DACs 24a-24d based on the clock signal selected by the multiplexor 296. As shown in FIG. 5, the PLL 297 also provides one or more DAC clock signals to the receive path FIFO buffer 287 to control data buffering operations.

Various implementations of the transceiver 250 discussed herein can include a mode selector 299 which can allow configuration of the transceiver for different modes of operation. The mode selector 299 can allow selection between multiplexing incoming differential signals coming from all of the inputs on the electronic device/host side or a subset of the incoming differential signals. For example, to transport a differential signals having a data rate 4B (e.g., 40 Gbit/s) over the cable 110, the mode selector 299 can allow selection between multiplexing two incoming differential signals having a data rate 2B (e.g., 20 Gbit/s) or multiplexing four incoming differential signals having a data rate B (e.g., 10 Gbit/s). In some cases, the mode selector 299 can automatically select the operation mode based on the electronic device to which it is connected.

The transceivers herein can be configured as a full-duplex multiplexer and re-timer with integrated signal conditioning capabilities for various cables capable of communicating data according to various protocols (e.g., Thunderbolt Gen1, Thunderbolt Gen2, SFP+ and/or QSFP capable cables). Implementations of transceivers can be configured to be backward compatible with existing interface standards (e.g., Thunderbolt Gen1, Thunderbolt Gen2, SFP+ and/or QSFP). The transceivers can be implemented as monolithic devices, which include, for example, integrated digital signal processors, ADCs and DACs. The ADCs and DACs are capable of processing signals in a wide range of data rates and encoded with different modulation formats including NRZ modulation and 4-level pulse amplitude modulated (PAM-4) modulation format.

Various implementations of the transceiver can serve as a fully rate and channel adaptive transceiver for a wide range of signals from the electronic devices. Various implementations of the transceivers also include adaptive and configurable signal conditioning features such as an integrated continuous time linear equalizer (CTLE), output pre-emphasis, self-adaptive digital equalization, by-passable forward error correction (FEC).

The transceivers herein can include an integrated serial port interface (SPI) management interface that can provide control over modes of operation, and access to built-in testing and monitoring components for diagnostic purposes. In certain embodiments, a transceiver can achieve error free or substantially error free operation over channels with up to 30 dB insertion loss thereby rendering it suitable for use with both twisted pair cables with a length of about 2 m and micro coaxial cables with a length of about 4 m. However, the transceivers herein can be configured to operate with different cable lengths. Various implementations of the transceivers have electronic device side interfaces that are capable of adaptive operation over high loss PCB channels permitting flexibility in board and connector design for low cost solutions. Furthermore, the use of ADCs and DACs enables to lower the amount of power consumed in various implementations of the transceiver. For example, the power consumed by various implementations of the transceiver can be lowered to about 750 mW for full-duplex 40 Gbit/s operation.

Example Method of Multiplexing and De-Multiplexing Analog Differential Signals

As discussed above, in certain configurations a transceiver can receive at least two pairs of differential input signals (e.g., 2, 4, 8, 16 or more pairs) from an electronic device (for example, the electronic device 101a of FIG. 2A) along an egress path. Additionally, the transceiver can multiplex the two or more pairs of differential input signals to generate a serialized or multiplexed differential signal for transmission over a cable to another transceiver connected to the other end of the cable. By multiplexing the input signals, the transceiver can transport large amounts of data quickly, reliably and cost effectively with a fewer number of wires and/or cables. The multiplexed differential signal can operate at a higher bit-rate relative to an individual bit-rate of the incoming differential signals received on the host side of the transceiver.

The multiplexing function can advantageously reduce cabling costs and complexity. For example, multiplexing by a factor of 2:1 can allow replacement of two high speed line or wire pairs in each direction with one wire or line pair in each direction. As discussed above, the transceiver can recover clock and data signals from the at least two input differential signals using CDR circuits prior to multiplexing. Additionally, the input differential signals can be processed in other ways, such as by conditioning and/or equalization.

The transceiver can also receive an input multiplexed differential signal transmitted along the ingress path through the cable from another transceiver connected to the other end of the cable. The transceiver can recovers a clock signal and a data signal from the multiplexed differential signal using a CDR circuit. Additionally, the transceiver may provide equalization and/or conditioning of the recovered multiplexed data signals prior to de-multiplexing. The de-multiplexed data is converted into a plurality of analog differential signals and transmitted to the electronic device. One method of multiplexing and de-multiplexing is described below with reference to FIGS. 6A and 6B.

Figure 6A:
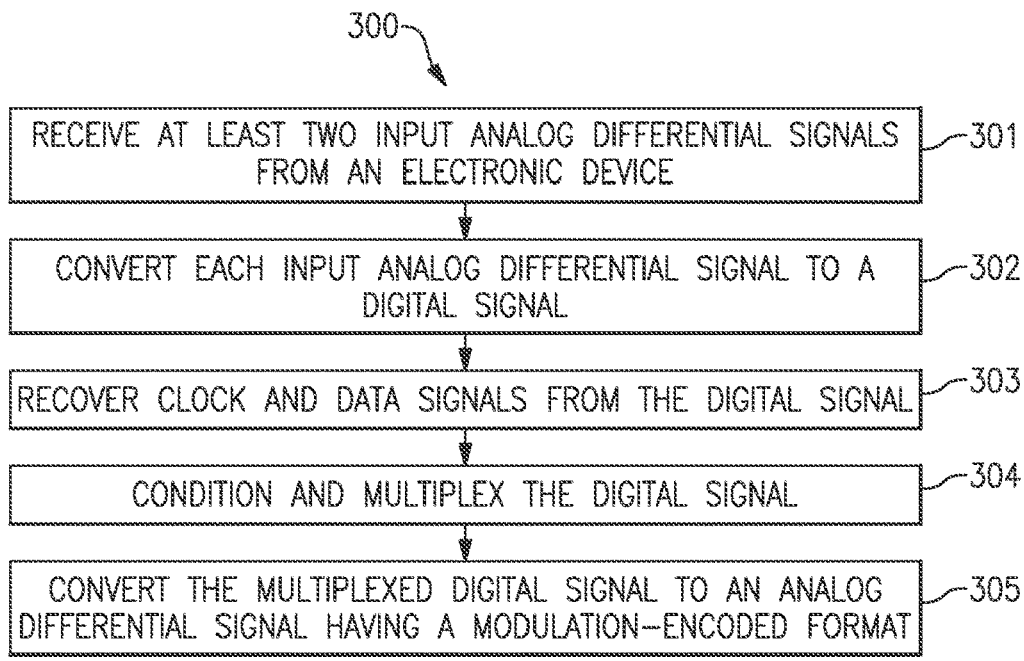
FIG. 6A is a flowchart that illustrates an example method of multiplexing at least two electrical input signals received from an electronic device.

FIG. 6A is a flowchart that illustrates an example method 300 of multiplexing at least two input analog differential signals received from an electronic device to a multiplexed analog differential signals. The method 300 includes receiving at least two input analog differential signals from an electronic device, as shown in block 301. The method 300 further includes converting each input analog differential signal to a digital signal, as shown in block 302. An analog to digital converter (ADC) can be used to convert the input analog differential signal to a digital signal. The method 300 further includes recovering digital clock and digital data signals from the converted digital signal, as shown in block 303. In various implementations, a first ADC is used to digitize the received data signal, and a second, lower resolution ADC is used for clock recovery. For instance, the second ADC may be at least a 2-bit ADC and the first ADC may be at least a 3-bit ADC. In various implementations the first ADC is at least a 6-bit ADC or is at least a 7-bit ADC. The method 300 further includes conditioning and multiplexing the digital data signal, as shown in block 304. The conditioning and multiplexing the data signal can be performed in the digital domain using digital signal processing. Programmable chip sets, physical coding sub-layer (PCS) blocks, FPGAs, FIR filters can be used to condition and multiplex the digital data signal. As discussed above, conditioning the data signals can include equalizing the data signals to reduce the effects of ISI, framing, error correction, scrambling, etc. The method 300 includes converting the multiplexed digital signal to an analog differential signal having a suitable modulation format at a higher data rate than the input analog differential signal and output the multiplexed analog differential signal into a cable, as shown in block 305. The multiplexed analog differential signal can be an M-level pulse PAM signal (e.g., a 4-level PAM signal), an NRZ modulated signal or a signal with any other suitable modulation format.

Figure 6B:
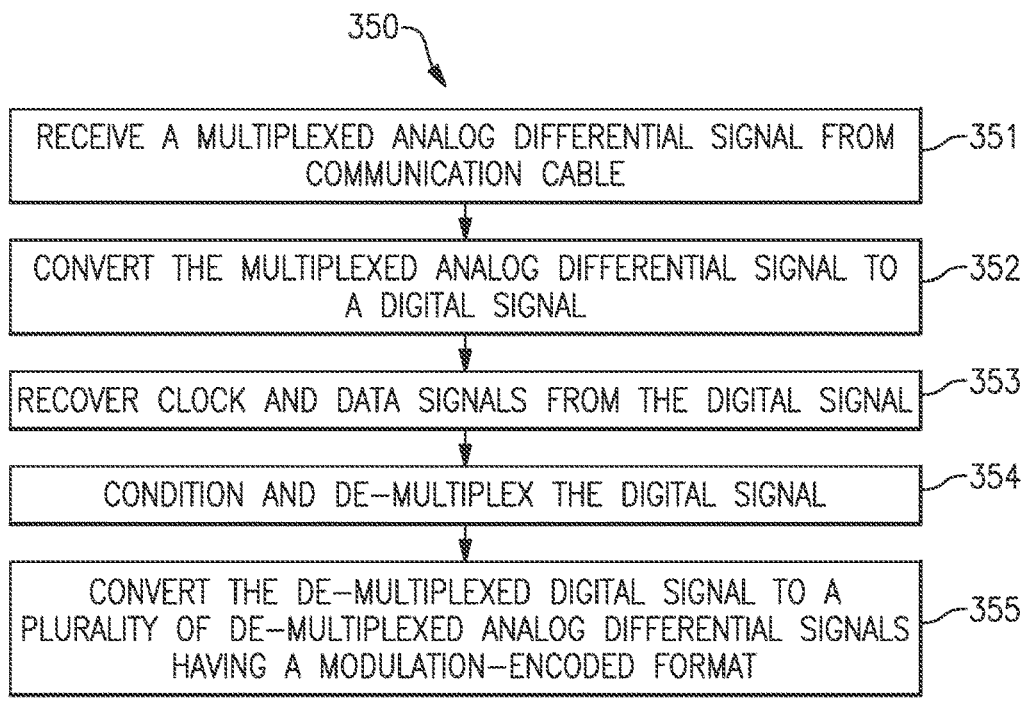
FIG. 6B is a flowchart that illustrates an example method of de-multiplexing electrical signals.

FIG. 6B is a flowchart that illustrates an example method 350 of de-multiplexing a multiplexed analog differential signal to at least two analog differential signals that are output to an electronic device. The method 350 includes receiving a multiplexed analog differential signal from a cable (e.g., a paired differential micro coaxial cable), as shown in block 351. The method further includes converting the multiplexed analog differential signal to a digital signal, as shown in block 352. An ADC stage can be used to convert the multiplexed analog differential signal to a digital signal, and can also be used to perform timing recovery. The method 350 further includes recovering digital clock and digital data signals from the converted digital signal, as shown in block 353. In various implementations, the ADC stage can include a first ADC used to convert the data signal, and a second ADC dedicated to timing recovery, where the second ADC is at least a 2-bit ADC and the second ADC is at least a 3-bit ADC. In various implementations the recovered first ADC is at least a 6-bit ADC or is at least a 7-bit ADC. The method 350 further includes conditioning and de-multiplexing the digital data signal, as shown in block 354. The conditioning and de-multiplexing of the data signal can be performed in the digital domain using digital signal processing. In various implementations, programmable chip sets, FPGAs, PCS blocks, FIR filters can be used to condition and de-multiplex the digital data signal. As discussed above, conditioning the data signals can include equalizing the data signals to reduce the effects of ISI, de-framing, error correction, unscrambling, etc. The method 350 further includes converting the de-multiplexed digital signal to a plurality of de-multiplexed analog differential signals having a suitable modulation format at a lower data rate than the incoming signals and transmitting the de-multiplexed signals to an electronic device, as shown in block 355.

Example NRZ and 4-Level PAM Signals

In an NRZ modulated signal, binary data is represented by two voltage levels. A first voltage level (e.g., +1 V) is used to represent 1's in the binary data and a second voltage level (e.g., −1V) is used to represent 0's in the binary data.

Figure 7A:
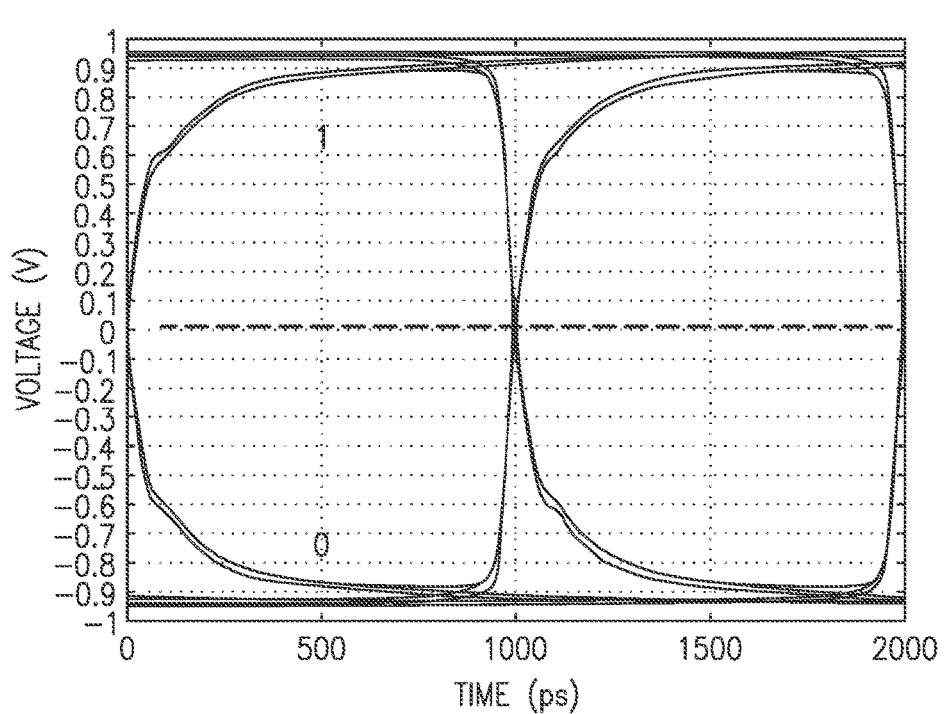
FIG. 7A illustrates an eye-diagram for an NRZ modulated data signal.

FIG. 7A illustrates an eye-diagram 361 for an NRZ modulated data signal. The pulses in an NRZ modulated signal have more energy than pulses in a return-to-zero (RZ) modulated signal. Accordingly, NRZ modulated signals can have a higher signal-to-noise ratio as compared to RZ modulated signals. Moreover, NRZ signals can be processed with relatively lower complexity logic and less circuitry than RZ systems, allowing for reduced cost implementations that consume relatively less amounts of power.

In some implementations, the multiplexed differential signals output from the transceiver into a cable can be a 4-level pulse amplitude modulated (PAM-4) signal. In a PAM-4 modulation scheme two bits of binary data (a symbol) are assigned one of four possible signaling voltage levels. For example, the symbol 00 is represented by a first voltage level (e.g., −0.3V), the symbol 01 is represented by a second voltage level (e.g., −1V), the symbol 10 is represented by a third voltage level (e.g., +1V) and the symbol 11 is represented by a fourth voltage level (e.g., +0.3V).

Figure 7B:
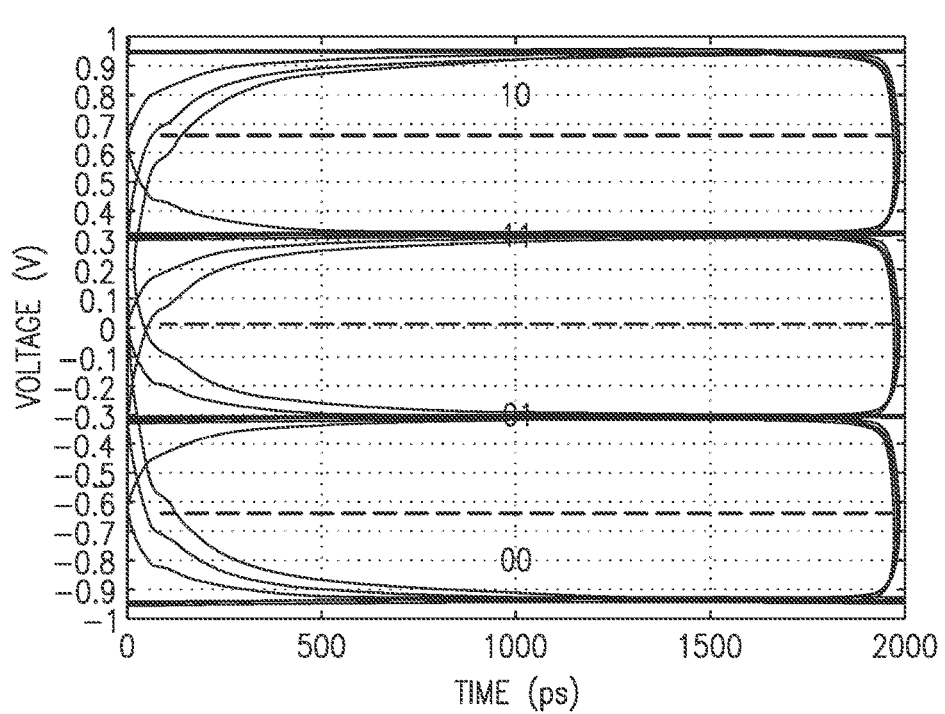
FIG. 7B illustrates an eye-diagram for a PAM-4 modulated data signal.

FIG. 7B illustrates an eye-diagram 362 for a PAM-4 modulated data signal in which the symbol 00 is represented by a voltage level of about −1V, the symbol 01 is represented by a voltage level of about −0.3V, the symbol 11 is represented by a voltage level of about +0.3V and the symbol 10 is represented by a voltage level of about +1V. Since a PAM-4 signal transmits two bits per symbol, it is capable of transporting more data than an NRZ signal at the same baud rate (e.g., number of symbols/second).

Examples of Clock and Data Recovery Circuits Using Separate Clock and Data Recovery ADCs In certain configurations, a clock and data recovery (CDR) circuit with separate data recovery and clock recovery paths is provided. The CDR circuit includes a first or data recovery ADC, a second or clock recovery ADC, a timing control circuit, and a clock generation unit. Additionally, the data recovery ADC has a higher resolution than the clock recovery ADC, such that the digital output of the data recovery ADC has a higher resolution than the digital output of the clock recovery ADC. The CDR circuit receives an input signal, and the data recovery ADC samples the voltage of the input signal to generate a first or higher resolution digital output signal corresponding to a digital representation of the sample. Additionally, the clock recovery ADC samples the input signal to generate a second or lower resolution digital output signal, which the timing control circuit processes to generate a clock control signal. Additionally, the timing control circuit provides the clock control signal to the clock generation to control timing of analog-to-digital conversion operations of the data recovery ADC and the clock recovery ADC.

By including separate data recovery and clock recovery paths, the CDR circuit can operate with enhanced performance. For example, the data recovery ADC has a higher resolution than the clock recovery ADC, which allows for a digital data signal to be recovered from the input signal with higher accuracy. Although high resolution ADCs typically have a longer latency that a lower resolution ADC of similar circuit topology, the data recovery ADC operates outside of a clock recovery loop of the CDR circuit. Thus, the latency of the data recovery ADC should not impact the timing performance of the CDR circuit.

Accordingly, the CDR circuits herein can provide high resolution data recovery while maintaining a relatively fast lock time. Additionally, the CDR circuits herein can operate without a tradeoff between loop dynamics of a clock recovery loop and data resolution of recovered data. In contrast, certain conventional CDR circuits can exhibit a tradeoff between recovered data resolution and a delay or latency in locking the CDR circuit to an input signal.

Furthermore, a resolution of the data recovery ADC may be controlled or configured without impacting the CDR circuit's clock recovery loop. For example, in certain applications, it may be desirable for the data recovery ADC to have a resolution that is configurable, for instance, by an end-user. For example, a transceiver may include a serial peripheral interface (SPI) or other interface that can be used to configure the data recovery ADC to a resolution suitable for a particular application that the transceiver is being used in. In such configurations, changing the resolution of the data recovery ADC should not impact clock recovery speed, loop stability, and/or the ability of the CDR circuit to lock to the input signal. Furthermore the data recovered by the data recovery ADC can be filtered, equalized, and/or otherwise processed without interfering with clock recovery. Thus, the CDR circuits herein can operate with high flexibility and/or configurability without needing to compensate the CDR circuit's clock recovery loop for different data recovery modes, resolutions, and/or settings.

In certain configurations, the timing control circuit is implemented using digital logic circuitry, and thus operates without analog components. For example, in one embodiment, the timing control circuit generates the clock control signal based on the second digital output signal entirely in the digital domain. Implementing the timing control circuit digitally can provide a number of advantages, including, for example, lower cost, lower power consumption, and/or faster locking. For example, in some existing data transfer standards and protocols, the clock recovery bandwidth used is about (data rate)/1667. Thus, at relatively low data rates of, for example, about 10 Gbit/s, the clock recovery bandwidth is about 6 MHz, and an analog clock recovery circuit may be suitable. However, as data rates increase (for example, to 20 Gbit/s or more), implementing an analog clock recovery circuit becomes increasingly difficult and costly.

In some embodiments, the CDR circuit is included in a transceiver, such that the transceiver achieves relatively fast clock recovery with reduced latency. For example, the CDR circuits can operate in ingress paths and/or egress paths of the transceivers described herein. In one embodiment, a CDR circuit provides clock and data recovery to an input signal provide to the transceiver from a host device. In another embodiment, a CDR circuit provides clock and data recovery to an input signal received over a cable from another transceiver.

However, it is noted that implementations of the clock and data recovery circuits described herein are not limited for use in a networking transceiver, but can be generally used in other applications that require clock and data recovery circuits. For example, CDR circuits can be used in, for instance, telecommunication systems, optical networks, and chip-to-chip communications. It is also noted that implementations of the clock and data recovery circuits described herein are not limited for data rates greater than 10 Gbit/s but can be used at lower data rates as well. For example, the implementations of the clock and data recovery circuit described herein can be used at data rates, such as those ranging from about 100 Mbits/s to about 128 Gbit/s.

Figure 8:
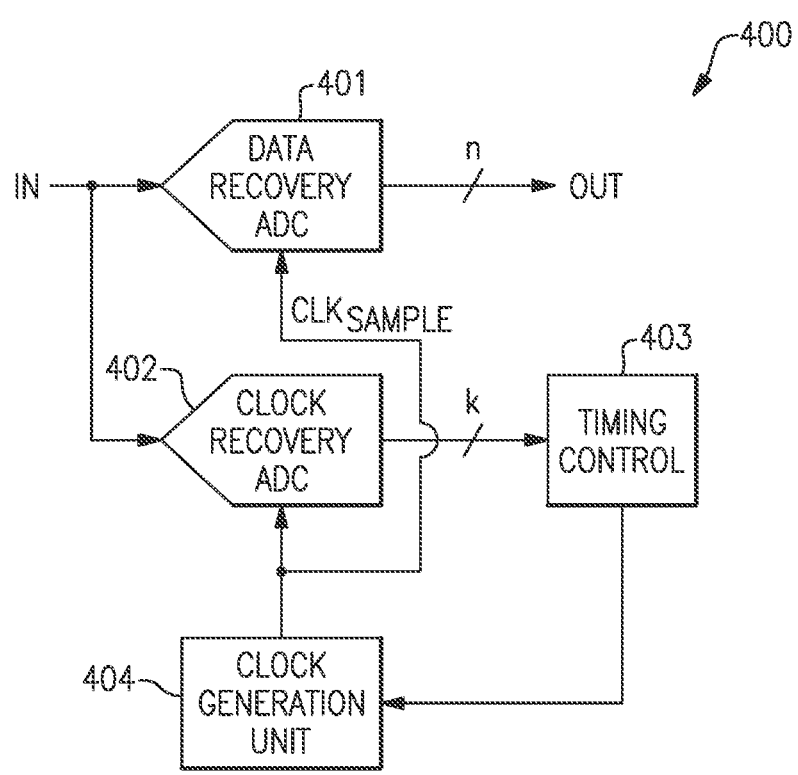
FIG. 8 is a schematic diagram of one embodiment of a clock and data recovery (CDR) circuit.

FIG. 8 is a schematic diagram of one embodiment of a CDR circuit 400. The CDR circuit includes a first or data recovery ADC 401, a second or clock recovery ADC 402, a timing control circuit 403, and a clock generation unit 404. The CDR circuit 400 receives an input signal IN and generates an output signal OUT.

The input signal or stream IN can include serial data bits that transition at a data rate. At a given data rate, the input signal IN has a unit interval (UI), or minimum time interval between transitions of the input signal IN.

As shown in FIG. 8, the data recovery ADC 401 receives the input signal IN and a sampling clock signal $CLK_{SAMPLE}$, and generates the output signal OUT. In response to a transition of the sampling clock signal $CLK_{SAMPLE}$, the data recovery ADC 401 controls a digital value of the output signal OUT based on analog voltage level of the input signal IN. In certain configurations, the data recovery ADC 401 can be configured to provide analog-to-digital conversion in response to rising edges of the sampling clock signal $CLK_{SAMPLE}$ or in response to falling edges of the sampling clock signal $CLK_{SAMPLE}$. In such configurations, the CDR circuit 400 can lock a frequency of the sampling clock signal $CLK_{SAMPLE}$ to a baud rate of the input signal IN. However, other configurations are possible, such as implementations in which the data recovery ADC 401 provides analog-to-digital conversion in response to both rising and falling edges of the sampling clock signal $CLK_{SAMPLE}$.

The clock recovery ADC 402 receives the input signal IN and the sampling clock signal $CLK_{SAMPLE}$, and provides a lower resolution digital output signal to the timing control circuit 403. The lower resolution digital output signal generated by the clock recovery ADC 402 has a lower resolution than the digital output signal generated by the data recovery ADC 401. The timing control circuit 403 processes the lower resolution digital output signal to generate a clock control signal, which is provided as an input to the clock generation unit 404.

The timing control circuit 403 controls the clock generation unit 404 using the clock control signal, such as by controlling the phase and/or frequency of the sampling clock signal $CLK_{SAMPLE}$. For example, the timing control circuit 403 can process the lower resolution digital output signal so as to shift the sampling clock signal $CLK_{SAMPLE}$ earlier or later in time to align the clock signal $CLK_{SAMPLE}$ relative to the unit interval of the input signal IN.

In the illustrated configuration, a resolution of the data recovery ADC 401 is greater than a resolution of the clock recovery ADC 402. For example, the output signal OUT from the data recovery ADC 401 can include n bits and the digital output signal from the clock recovery ADC 402 can include k bits, where n is greater than k. In one embodiment, n is selected to be in the range of 3 bits to 7 bits and k is selected to be in the range of 2 bits to 5 bits, where n is greater than k. Although one example of bit widths has been provided, different bit widths can be used depending on, for example, application, data rates, and/or signaling protocols.

The timing control circuit 403 can be implemented in a wide variety of ways. In certain configurations, the timing control circuit 403 is implemented using digital logic circuitry, and operates without analog components, such as charge-pumps and analog loop filters. In such configurations, the clock control signal provided to the clock generation unit 404 comprises a digital clock control signal. Implementing the timing control circuit 403 using digital circuitry can enhance loop stability, speed-up locking, and/or lower power consumption relative to an analog configuration. In one embodiment, the timing control circuit 403 comprises a Mueller-Muller phase detector.

The clock generation unit 404 can be implemented in a variety of ways, including for example, as a digitally controlled oscillator (DCO) or numerically controlled oscillator (NCO). In the illustrated configuration, the sampling clock signal $CLK_{SAMPLE}$ is provided to both the data recovery ADC 401 and the clock recovery ADC 402. Thus, the clock generation unit 404 controls the data recovery ADC 401 and the clock recovery ADC 402 using a common or shared clock signal in this embodiment. However, the teachings herein are also applicable to configurations in which the data recovery ADC 401 and the clock recovery ADC 402 are controlled using separate clock signals, including, for example, clock signals of different frequencies and/or phase offsets relative to one another.

Figure 9A:
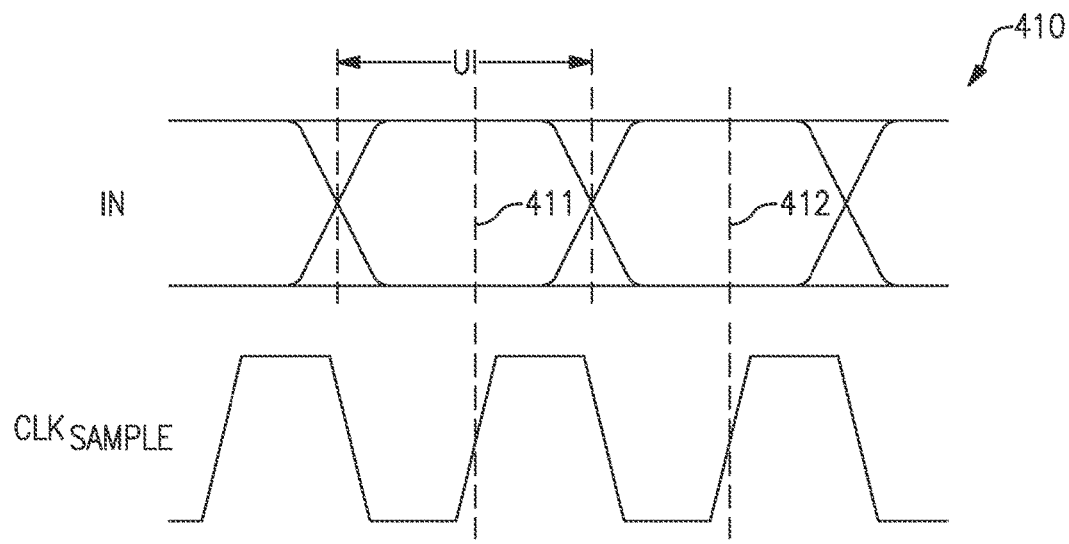
FIG. 9A is one example of a timing diagram for the CDR circuit of FIG. 8.

FIG. 9A is one example of a timing diagram 410 for the CDR circuit 400 of FIG. 8. The timing diagram 410 includes a first plot of the input signal IN of FIG. 8 and a second plot of the sampling clock signal $CLK_{SAMPLE}$ of FIG. 8. The timing diagram 410 has been annotated to illustrate sampling times of a first analog-to-digital conversion sample 411 and a second analog-to-digital conversion sample 412, as well as a unit interval (UI) of the input signal IN. As shown in FIG. 9A, samples used for analog-to-digital conversion operations can be taken from near the center of the UI when the CDR circuit is locked to the input signal IN.

The timing diagram 410 illustrates a configuration in which ADCs provide analog-to-digital conversion on rising edges of the sampling clock signal $CLK_{SAMPLE}$. However, other configurations are possible, including, for example, implementations in which the ADCs operate in response to falling edges of sampling clock signal $CLK_{SAMPLE}$.

In the illustrated configuration, the CDR circuit 400 has been used to lock to an input signal that is in an NRZ format. However, the CDR circuits herein can be used to provide clock and data recovery to input signals of other formats.

Figure 9B:
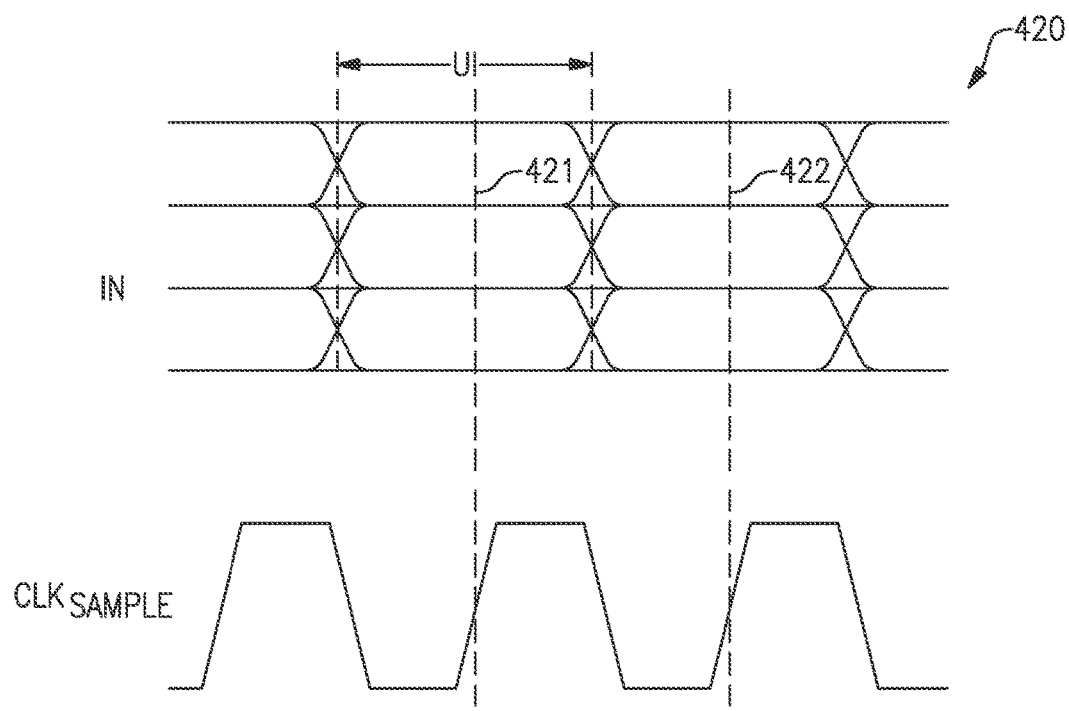
FIG. 9B is another example of a timing diagram for the CDR circuit of FIG. 8.

FIG. 9B is another example of a timing diagram 420 for the CDR circuit of FIG. 8. The timing diagram 420 includes a first plot of the input signal IN of FIG. 8 and a second plot of the sampling clock signal $CLK_{SAMPLE}$ of FIG. 8. The timing diagram 420 has been annotated to illustrate sampling times of a first analog-to-digital conversion sample 421 and a second analog-to-digital conversion sample 422, as well as a unit interval (UI) of the input signal IN. As shown in FIG. 9B, samples used for analog-to-digital conversion operations can be taken from near the center of the UI when the CDR circuit is locked to the input signal IN.

The timing diagram 420 illustrates a configuration in which ADCs provide analog-to-digital conversion on rising edges of the sampling clock signal $CLK_{SAMPLE}$. However, other configurations are possible, including, for example, implementations in which the ADCs operate in response to falling edges of sampling clock signal $CLK_{SAMPLE}$.

In the illustrated configuration, the CDR circuit 400 has been used to lock to an input signal that is in a PAM-4 format. However, the CDR circuits herein can be used to provide clock and data recovery to input signals of other formats.

Figure 10:
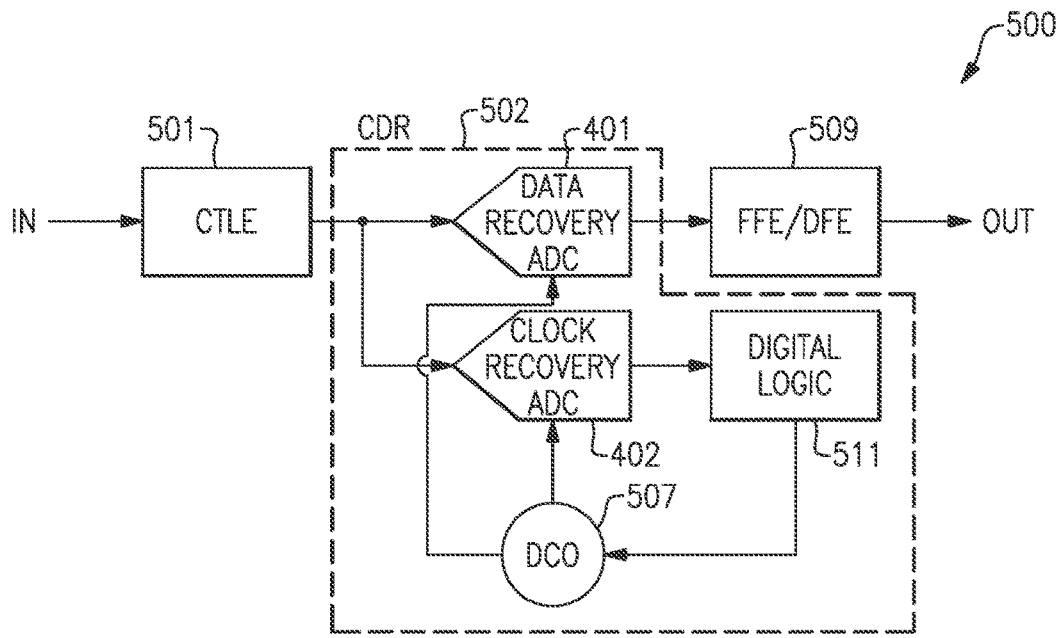
FIG. 10 illustrates a schematic of an implementation of a clock and data recovery system with digital clock recovery according to one embodiment.

FIG. 10 illustrates a schematic of an implementation of a clock and data recovery (CDR) system 500. The CDR system 500 includes a continuous time linear equalizer (CTLE) 501, a CDR circuit 502, and an FFE/DFE 509. The CDR circuit 502 includes the data recovery ADC 401 and clock recovery ADC 402, which can be as described earlier. The CDR circuit 502 further includes a digital logic circuit or digital timing control circuit 511 and a digitally controlled oscillator (DCO) 507.

The CDR system 500 can be used in a wide variety of systems. For instance, the CDR system 500 may be incorporated in any of the transceivers described herein, such as those shown and described with respect to FIGS. 1A-2B and 4A-5, for example. The CDR system 500 is configured to receive an input analog signal through an input interface. In some implementations, the input signal IN can be a differential signal including a p-channel and an n-channel. In other implementations, the input signal IN may not be a differential signal, and may instead be a single-ended signal. The input signal IN can be an NRZ modulated signal or PAM-4 signal, although other formats are possible including, for example, any of those described herein. In various implementations, the input analog signal IN can have a data rate between about 100 Mbits/s to about 300 Gbit/s.

In the illustrated configuration, the input signal IN is equalized to compensate for distortions using the CTLE 501. The CTLE 501 can include an analog filter configured to compensate for certain signal losses caused by the channel.

The equalized output of the CTLE 501 can be provided as an input to the data recovery ADC 401 and as an input to the clock recovery ADC 402. Thus the illustrated CDR system 500 includes separate data recovery and clock recovery paths. A first or data recovery path includes the first ADC 401 that recovers a digital data signal from the input signal. Additionally, a second or clock recovery path includes the second ADC 402 that generate a timing recovery signal from the input signal. In certain configurations, the timing recovery signal and digital data signal both correspond to digital representations of an analog voltage of the input signal, but the timing recovery signal has a lower bit resolution relative to the digital data signal.

In various implementations, one or more thresholders or automatic gain controllers (AGCs) (not shown in this figure) can be disposed in the first and/or second paths. For example, the transceiver 250 of FIG. 5 illustrates examples of thresholders that can be included in CDR circuits of a transceiver. The CDR system 500 further includes the digital controlled oscillator (DCO) 507, which generates sampling clock signals used to control analog-to-digital conversion operations of the ADCs 401-402. Although FIG. 10 illustrates a configuration in which the data recovery ADC 401 and the clock recovery ADC 402 receive separate clock signals, the teachings herein are also applicable to configurations in which the data recovery ADC 401 and the clock recovery ADC 402 operate using a common or shared clock signal.

In the illustrated configuration, the DCO 507 is disposed in a feed-back path of the clock recovery path. The phase and/or frequency of the clock signals generated by the DCO 507 are controlled by the digital logic block 511. The digital logic block 511 can control the timing of the clock signals generated by the DCO 507 to align analog-to-digital conversion operations of the ADCs 401-402 relative to the unit interval of the input signal IN. In one embodiment, digital logic block 511 comprises a Mueller-Muller phase detector.

As shown in FIG. 10, the digital output from the data recovery ADC 401 is input to the FFE/DFE 509 for further conditioning before being provided as the output signal OUT. In various implementations, the FFE/DFE 509 includes a feed-forward equalizer (FFE), a decision feedback equalizer (DFE), or a combination thereof.

In certain configurations, a recovered clock signal from the CDR circuit 502 is also provided as an output to the CDR circuit 502. For instance, the CDR circuit 502 can provide a version (e.g., a divided down version) of the recovered clock and data to the CDR circuit 502 and/or other componentry of a transceiver. As an example, a divided down or other version of the recovered clock can additionally be sent for use as a reference to transmit componentry in the transceiver. As an example, the transceiver 250 of FIG. 5 illustrates a configuration in which a recovered clock signal is provided from a CDR circuit to other components of a transceiver.

In certain configurations, the ADCs 401 and 402 are configured to generate digital signals with about 2-8 bits, depending on the embodiment. Increasing the number of bits generated by the ADCs 401 and 402 can increase the resolution of the generated digital signals. However, increasing the number of bits can also increase the latency of the CDR system 500. Since, it is desirable for the data signal to have a higher resolution, the first ADC 401 is configured to generate a digital signal having at least 3 bits (e.g., at least 4, 5, 6, 7, 8, 16 bits or higher). In some embodiments, the first ADC 401 can be configured to generate a 7 bit digital signal. Since, it is desirable to have fast clock recovery with low latency the second ADC 402 has a lower number of bits than the first ADC 401 and can be dedicated to generating a signal for use in timing recovery. In various implementations the second ADC 402 is at least a 2-bit ADC (e.g., a 2-bit, 3-bit or 4-bit ADC). The number of bits of the second ADC 402 is selected based on the desired latency for the clock recovery system and the desired resolution or accuracy for the clock signal. For example, in various implementations, the CDR system 500 can perform timing recovery within a few tens or hundreds of nanoseconds. For instance, within a few tens or hundreds of nanoseconds, the CDR system 500 can recover timing information from the incoming data. In one embodiment, the latency of the CDR system 500 is about 4 ns, and the CDR system 500 has a time constant of about 10 ns. The timing or clock recovery ADC 402 and the data ADC 401 can be selected such that the clock recovery ADC 402 has a latency that is significantly less than that of the data recovery ADC 401, thereby improving timing recovery operation. The latency of the timing recovery ADC 402 can have a latency of about 3% to about 20% of the latency of the data ADC 401. For example, the latency of the timing recovery ADC 402 can be about 5%, about 7%, about 9%, about 11%, about 13%, about 15%, or about 18% of the latency of the data recover ADC 401, or some percentage between any of the foregoing values. In some embodiments, the latency of the timing recovery ADC 402 is about 1 ns and the latency of the data ADC 401 is about 11 ns. In various other implementations, the timing recovery ADC 402 can have a latency that is less than 3% of the latency of the data recovery ADC 401 or more than 20% of the latency of the data recovery ADC 401, e.g., about 1%, about 2%, between about 20%-30%, between about 30%-40%, or between about 40%-50%.

Figure 11:
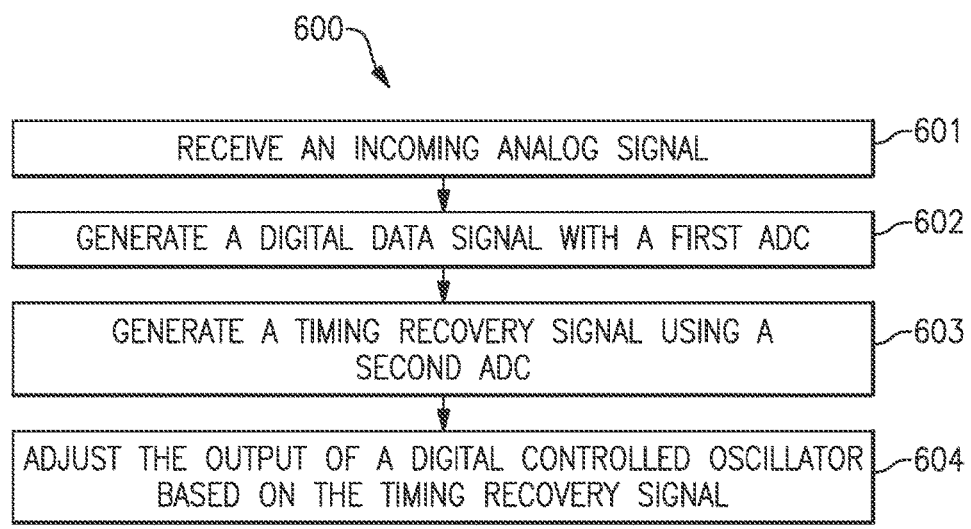
FIG. 11 is a flowchart that illustrates a method of digitally recovering clock and data using the clock and data recovery system depicted in FIG. 10.

FIG. 11 is a flowchart that illustrates a method 600 of digitally recovering clock and data using the clock and data recovery system 500 depicted in FIG. 10. The method 600 includes receiving an incoming analog signal, as shown in block 601. The method 600 further includes generating a digital data signal including at least 3 bits from the incoming analog signal, as shown in block 612. In various implementations, a first ADC can be used to generate the digital data signal, where the first ADC is at least a 3-bit ADC. The method 600 further includes using a second ADC having a lower number of bits than the first ADC to generate a signal for using in timing recovery, where the second ADC is at least a 2-bit ADC, as shown in block 603. The method 600 further includes adjusting the output of a DCO or other clock generation unit controlled by a logic controller based on the generated clock signal, as shown in block 604. In various implementations, the DCO can be disposed in a feed-back path to the second ADC. The method 600 can be implemented by any of the communication systems or transceivers described herein.

Examples of Systems to Detect and Correct Skew in Differential Signals

With reference back to FIGS. 2A-2B, multiple conducting lines can be used to communicate data between two transceivers. However, the presence of skew between the conducting lines can degrade the receiver performance and/or cause transmission errors. Thus, it is advantageous to detect and correct skew to improve the receiver performance and to increase the reliability of data transmission. Skew can be particularly pronounced in embodiments including parallel micro coaxial cables and/or implementations achieving higher data rates. Certain embodiments described herein advantageously provide efficient skew compensation under such conditions. While some of the embodiments that will be described address skew in systems incorporating differential signaling over paired transmission lines (e.g., paired micro coaxial cables transmitting complementary differential signals), it will be appreciated that these techniques can also be applied to other systems.

In certain configurations, a communication system includes a first transceiver and a second transceiver electrically connected to one another by a cable. The first transceiver includes a differential transmitter used to transmit a differential signal to a differential receiver of the second transceiver via the cable. The first transceiver further includes a skew adjustment circuit and a skew control circuit. The skew control circuit generates a skew control signal, which the skew adjustment circuit uses to control timing of transmissions of a first transmitter of the differential transmitter relative to timing of transmissions of a second transmitter of the differential transmitter. The differential receiver includes a skew detector that generates a skew indication signal indicating a skew between a non-inverted component of the received differential signal relative to an inverted component of the received differential signal. The second transceiver transmits the skew indication signal to the first transceiver, and the skew control circuit processes the skew indication signal to control the skew adjustment circuit to reduce or eliminate skew in the differential signal received at the differential receiver.

Compensating for skew on the transmitter side of a communication system can enhance the communication system's performance relative to a configuration in which skew is compensated for on the receiver side. For example, including a skew adjustment circuit at the input of a differential receiver can introduce noise, increase ISI, and/or otherwise degrade signal integrity. For instance, a differential receiver can include a variable delay element for delaying a non-inverted component of a differential signal relative to an inverted component of the differential signal to compensate for skew. However, the variable delay element may have insufficient bandwidth to delay differential signals transmitted at high data rates and/or may provide a different amount of delay to different frequency components of the differential signal. Thus, a communication system that compensates for skew at the receiver side may have poorer performance, higher complexity, and/or higher cost.

In certain configurations, the skew adjustment circuit can compensate for skew by controlling a time difference or delay between a first clock signal used to control transmissions of the first transmitter and a second clock signal used to control transmissions of the second transmitter. By controlling a delay of the first clock signal relative to the second clock signal, the skew adjustment circuit can control the timing of transmissions of the first and second transmitters to reduce or eliminate skew in the differential signal received by the differential receiver. In certain implementations, the skew adjustment control circuit can additionally or alternatively be used to control a delay of a first data signal provided to the first transmitter relative to a second data signal provided to the transmitter.

Providing skew adjustment in this manner can reduce or eliminate skew while avoiding a need to place a variable delay element in a signal path between an output of the differential transmitter and an input to the differential receiver. Avoiding variable delay elements in between the differential transmitter's output and the differential receiver's input can aid in maintaining the benefits of differential signaling over the cable. Thus, the first and second transceivers can communicate with lower common-mode noise and/or smaller systematic offsets or errors. In contrast, a communication system that includes variable delay elements between a differential transmitter's output and a differential receiver's input may not exhibit the benefits of differential signaling. Rather, when operating at high speeds, the communication system may undesirably exhibit performance comparable to communications using single-ended signaling.

In certain configurations, the skew adjustment circuit can include two or more adjustment circuits including a coarse adjustment circuit and a fine adjustment circuit. Additionally, the coarse adjustment circuit can compensate for skew of the differential transmitter by controlling a delay between a first clock signal used to control transmissions of the first transmitter and a second clock signal used to control transmissions of the second transmitter. Furthermore, the fine adjustment circuit can compensate for skew of the differential transmitter by controlling a delay between a first data signal provided as input to the first transmitter and a second data signal provided as input to the second transmitter. Compensating for skew using multiple skew adjustment circuits can enhance accuracy of skew adjustment and/or permit skew correction when the skew has a relatively large magnitude.

In certain configurations, skew is corrected or compensated for during a start-up sequence or channel negotiation between the first and second transceivers. For example, a training sequence can be transmitted from the differential transmitter of the first transceiver to the differential receiver of the second transceiver, and the differential receiver's skew detector can generate the skew indication signal based on skew observations of the received training sequence. In certain configurations, the skew control circuit provides skew adjustment incrementally. For example, the skew control circuit can initially set a value of skew control signal, and wait for the skew indication signal to indicate an impact of the skew control signal's value on skew before further updating or changing the value of the skew control signal. In certain configurations, the skew control circuit first determines a setting of the coarse skew adjustment circuit before determining a setting of the fine skew adjustment circuit.

Figure 12A:
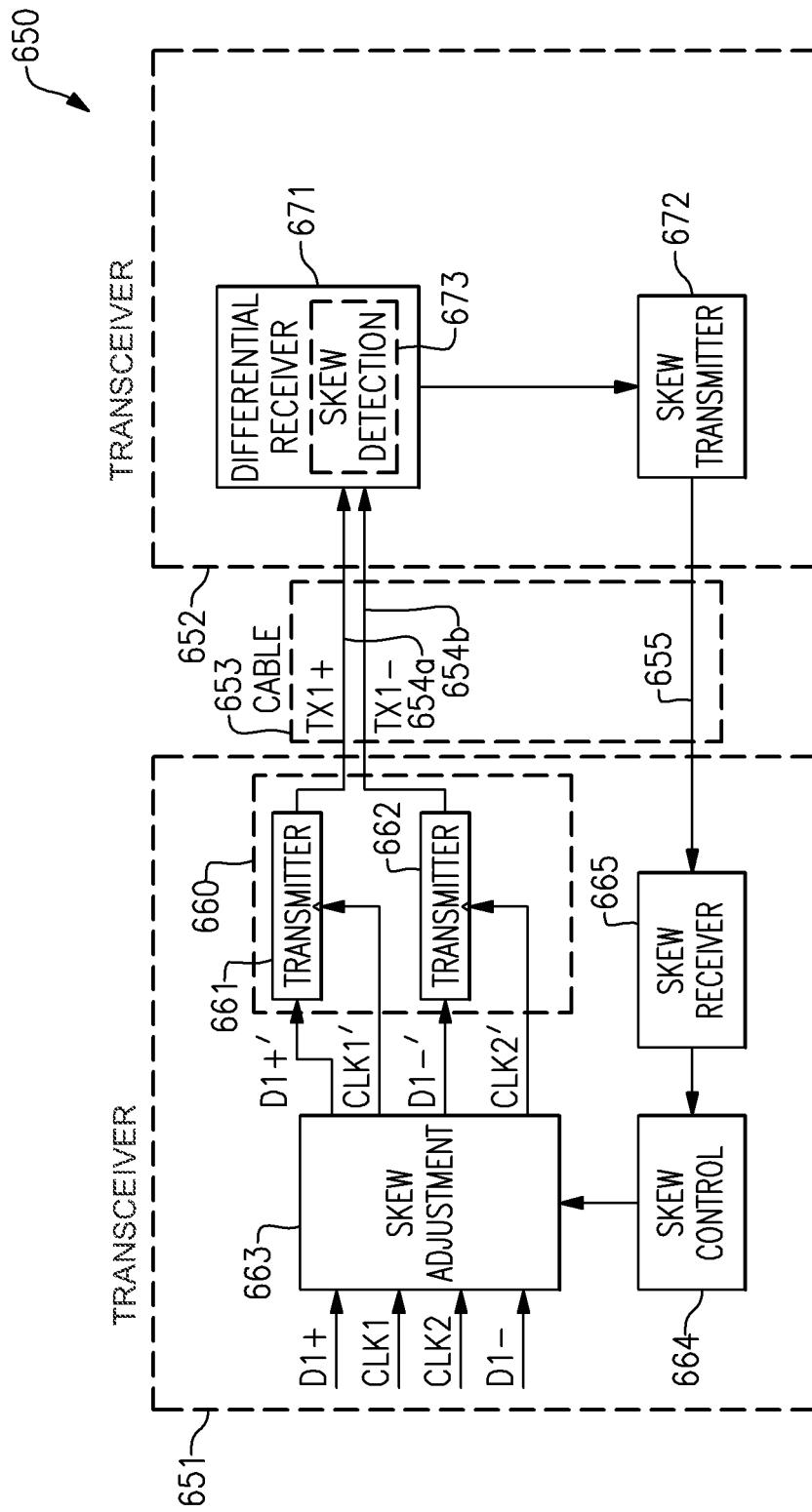
FIG. 12A is a schematic diagram of a communication system according to another embodiment.

FIG. 12A is a schematic diagram of a communication system 650 according to another embodiment. The communication system 650 includes a first transceiver 651 and a second transceiver 652 electrically connected to one another by a cable 653.

The first transceiver 651 includes a differential transmitter 660 that includes a first transmitter 661 and a second transmitter 662. The first transceiver 651 further includes a skew adjustment circuit 663, a skew control circuit 664, and a skew receiver 665. Additionally, the second transceiver 652 includes a differential receiver 671, and a skew transmitter 672. Although not illustrated in FIG. 12A for clarity of the figures, the first and second transceivers 651-652 can include additional structures, blocks, and/or circuitry. For example, in certain embodiments, the first and second transceivers can have a similar structure or topology to one another.

The skew adjustment circuit 663 receives a first or non-inverted data signal D1+, a first clock signal CLK1, a second or inverted data signal D1−, a second clock signal CLK2, and a skew control signal from the skew control circuit 664. Additionally, the skew adjustment circuit 663 generates a first or non-inverted skew adjusted data signal D1+', a first skew adjusted clock signal CLK1', a second or inverted skew adjusted data signal D1−', and a second skew adjusted clock signal CLK2'. The skew adjustment circuit 663 can generate the first and second skew adjusted data signals D1+', D1−' and/or the first and second skew adjusted clock signals CLK1', CLK2' based on an amount of skew adjustment indicated by the skew control signal generated by the skew control circuit 664.

For example, the skew adjustment circuit 663 can be used to control a time difference or delay between the first and second skew adjusted data signals D1+', D1−' relative to a time difference or delay between the first and second data signals D1+, D1−. Similarly, the skew adjustment circuit 663 can be used to control a delay between the first and second skew adjusted clock signals CLK1', CLK2' relative to a delay between the first and second clock signals CLK1, CLK2. As will be described in detail further below, the skew adjustment circuit 663 can be used to compensate for a skew of the differential transmitter 660 by controlling relative timing of transmissions of the first and second transmitters 661, 662.

Although FIG. 12A illustrates a scheme in which the skew adjustment circuit 663 compensates for skew based on generating both skew adjusted clock signals CLK1', CLK2' and skew adjusted data signals D1+', D1−', the teachings herein are also applicable to configurations in which a skew adjustment circuit generates only skew adjusted clock signals or skew adjusted data signals.

In the illustrated configuration, the first transmitter 661 receives the first skew adjusted data signal D1+' and the first skew adjusted clock signal CLK1', and generates a first or non-inverted component of a differential signal TX1+, TX1−. Additionally, the second transmitter 662 receives the second skew adjusted data signal D1−' and the second skew adjusted clock signal CLK2', and generates a second or inverted component of the differential signal TX1+, TX1−.

The first transceiver 651 transmits the differential signal TX1+, TX1− to the second transceiver 652 over the cable 653. Although the first transceiver 651 is illustrated as sending only one differential signal to the second transceiver 652, the first transceiver 651 can be configured to send additional differential and/or single-ended transmit signals to the second transceiver 652. Additionally, the first transceiver 651 can receive one or more differential and/or single-ended signals from the second transceiver 652.

As shown in FIG. 12A, the second transceiver 652 includes the differential receiver 671, which receives the differential signal TX1+, TX1− from the first transceiver 652. The differential receiver 671 includes a skew detector or skew detection circuit 673, which can be used to generate a skew indication signal based on an observed difference of skew between the non-inverted component of the differential signal TX1+, TX1− relative to the inverted component of the differential signal TX1+, TX1−. Additionally, the differential receiver 671 can send the skew indication signal to the skew transmitter 672 of the second transceiver 652, which in turn can transmit the skew indication signal to the skew receiver 665 of the first transceiver 661. Furthermore, the skew receiver 665 can provide the skew indication signal to the skew control circuit 664, which can process the skew indication signal to generate the skew adjustment signal for the skew adjustment circuit 663.

Although the skew transmitter 672 can be used to transmit the skew indication signal and the skew receiver 665 can be used to receive the skew indication signal, the skew transmitter 672 and/or the skew receiver 665 can be used for additional functions. For example, in one embodiment, the skew transmitter 672 and the skew receiver 665 are also used during channel negation or start-up to transmit control and/or mode information.

In the illustrated configuration, the differential signal TX1+, TX1− and the skew indication signal are transmitted in a common cable 653. For example, the non-inverted component of the differential signal TX1+, TX1− is transmitted on a first conducting line 654a, the inverted component of the differential signal TX1+, TX1− is transmitted on a second conducting line 654b, and the skew indication signal is transmitted on a third conducting line 655. In one embodiment, the first and second conducting lines 654a, 654b comprise a pair of micro coaxial cables, such as the first and second micro coaxial cables 143a-143b of the cable 131 of FIG. 3A, and the third conducting line 655 comprises a control line, such as the control line 148a of FIG. 3A. However, other configurations are possible, including, for example, implementations in which a differential signal and a skew indication signal are transmitted via separate cables or in other ways.

In certain configurations, the skew control circuit 664 compensates for skew of the differential transmitter 661 during a start-up sequence or channel negotiation between the first and second transceivers 651-652. For example, a training sequence can be transmitted from the differential transmitter 660 of the first transceiver 651 to the differential receiver 671 of the second transceiver 652, and the skew indication signal can be generated by the skew detector 673 based on skew observations associated with the received training sequence. In certain configurations, the skew control circuit 664 provides skew adjustment incrementally. For example, the skew control circuit 664 can initially set a value of skew control signal, and wait for an update to the skew indication signal before further adjusting the skew control signal.

Figure 12B:
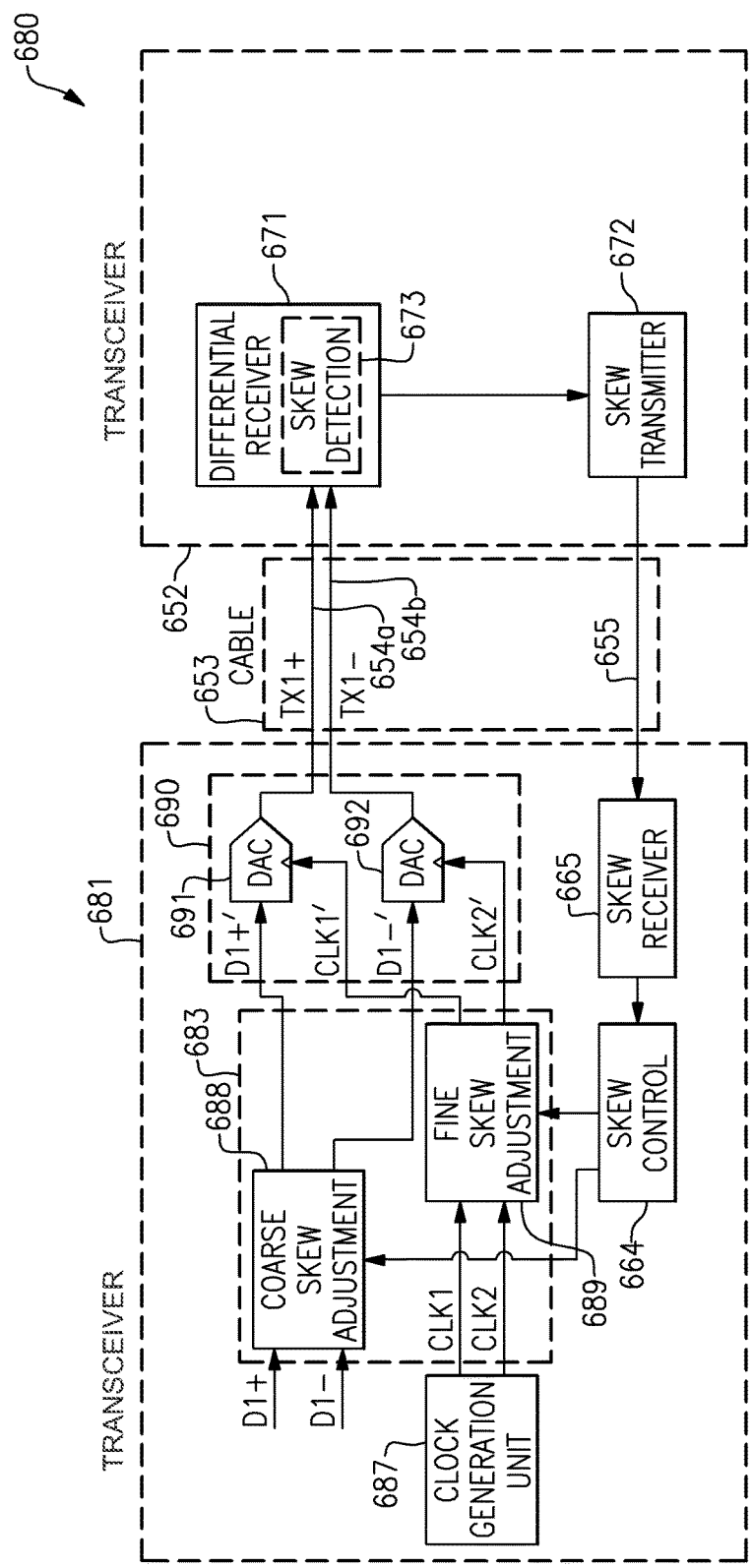
FIG. 12B is a schematic diagram of a communication system according to another embodiment.

FIG. 12B is a schematic diagram of a communication system 680 according to another embodiment. The communication system 680 includes a first transceiver 681 and a second transceiver 652 electrically connected to one another by a cable 653.

The communication system 680 of FIG. 12B is similar to the communication system 650 of FIG. 12A, except that the communication system 680 of FIG. 12B includes a different configuration of the first transceiver. For example, the first transceiver 681 includes a differential transmitter 690 that includes a first DAC 691 and a second DAC 692 used to transmit the differential signal TX1+, TX1− to the differential receiver 671 over the cable 653. Additionally, the first transceiver 681 includes a clock generation unit 687 and a skew adjustment circuit 683 that includes a coarse skew adjustment circuit 688 and a fine skew adjustment circuit 689. The first transceiver 681 further includes a skew control circuit 664 and a skew receiver 665.

As shown in FIG. 12B, the clock generation unit 687 generates a first clock signal CLK1 and a second clock signal CLK2, which are provided as inputs to the fine skew adjustment circuit 689. Additionally, the fine skew adjustment circuit generates a first skew adjusted clock signal CLK1' for controlling timing of the first DAC 691 and a second skew adjusted clock signal CLK2' for controlling timing of the second DAC 692. Furthermore, the skew control circuit 664 generates a fine phase adjustment signal, which is used to control a time difference or delay between the first skew adjusted clock signal CLK1' and the second skew adjusted clock signal CLK2'.

With continuing reference to FIG. 12B, the coarse skew adjustment circuit 688 receives the non-inverted data signal D1+ and the inverted data signal D1−. Additionally, the coarse skew adjustment circuit 688 generates a non-inverted skew adjusted data signal D1+' and an inverted skew adjusted signal D1-', which are provided as inputs to the first and second DACs 691, 692, respectively. Furthermore, the skew control circuit 664 generates a coarse phase adjustment signal, which is used to control a time difference or delay between the non-inverted skew adjusted data signal D1+' and the inverted skew adjusted data signal D1-'.

In certain configurations, the skew control circuit 664 corrects for skew during a start-up sequence or channel negotiation between the first transceiver 681 and the second transceiver 682. Additionally, the differential transmitter 690 transmits a training sequence to the differential receiver 671 during the start-up sequence or channel negotiation. Furthermore, the skew detector 673 observes at least one of a magnitude or polarity of skew of the differential signal received at the differential receiver 671, and generates the skew indication based on the skew observations. Additionally, the skew control circuit 664 incrementally adjusts the coarse skew adjustment signal until the skew observed by the skew detector 673 is at about the lowest observed skew value. Thereafter, the skew control circuit 664 incrementally adjusts the fine skew adjustment signal until the skew observed by the skew detector 673 is about the lowest observed skew value.

Additional details of the communication system 680 can be similar to those described earlier.

Figure 13A:
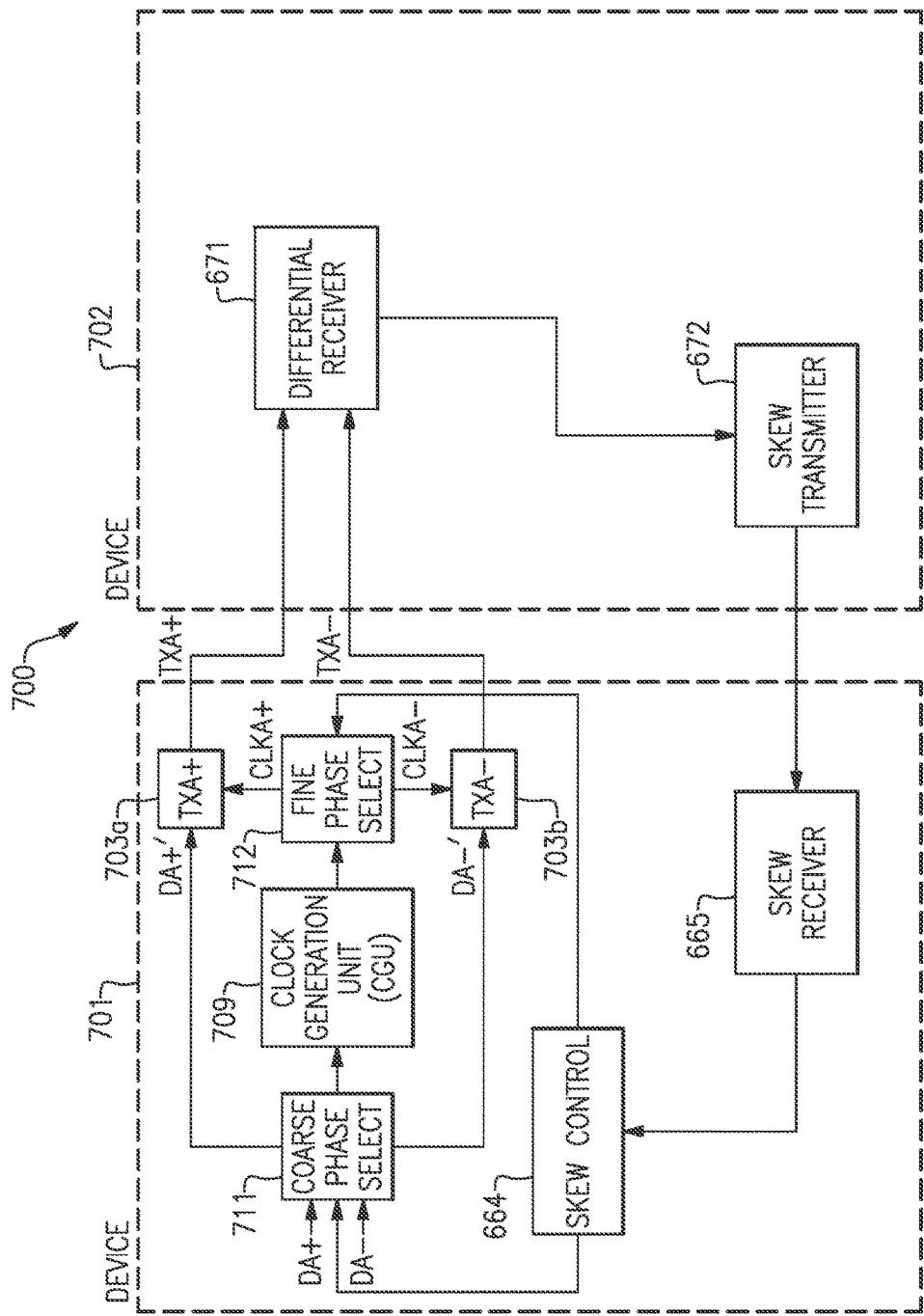
FIG. 13A illustrates an implementation of a communication system that can detect and correct skew between two physical channels.

FIG. 13A illustrates an implementation of a communication system 700 that can detect and correct skew between two channels, where each channel communicates a corresponding component of a differential signal. The communication system 700 includes a first electronic device 701 and a second electronic device 702. In various implementations, the first electronic device 701 and/or the second electronic device 702 can comprise any of the transceivers discussed herein, such as the transceivers discussed above with respect to FIGS. 1A-1D and 4B-5, for example. The first and second electronic devices 701 and 702 can be connected by a transmission cable, for example, the cable 110 of FIG. 2A or the cable 115 of FIG. 2B.

The first electronic device 701 includes a pair of transmitters 703a and 703b that collectively operate as a differential transmitter. The first transmitter 703a generates a first or non-inverted transmit signal TXA+ and the second transmitter generates a second or inverted transmit signal TXA−. The first and second transmits signals TXA+, TXA− operate as a differential transmit signal that is transmitted from the first electronic device 701 to the second electronic device 702 over a cable. The first electronic device 701 further includes a receiver unit or skew receiver 665, a skew control unit or circuit 664, a coarse phase select unit 711, a clock generation unit 709, and a fine phase select unit 712. The transmitters 703a and 703b are controlled based on a clock signal generated by a clock generation unit 709. The fine phase select unit 712 adjusts the clock signal generated by the clock generation unit 709 to generate separate clock signals for the first and second transmitters 703a-703b. For example, as shown in FIG. 13A, the first transmitter 703a receives a first skew adjusted clock signal CLKA+ from the fine phase select unit 712 and the second transmitter 703b receives a second skew adjusted clock signal CLKA− from the fine phase select unit 712.

In response to the feedback output provided by the skew control system 664, the clock signal generated by the clock generation unit 709 can be phase adjusted in fine increments by the fine phase select unit 712. In certain configurations, the clock signal generated by the clock generation unit 709 is phase adjusted in coarse increments by the coarse phase select 711. However, other configurations are possible, such as implementations in which the coarse phase select 711 provides coarse phase adjustment by controlling a relative delay between data signals provided as inputs to the transmitters 703a-703b.

In one embodiment, the coarse phase select unit 711 provides phase adjustment in increments of entire clock or symbol cycles (e.g., 1, 2, 5, 10, 100 or more cycles), while the fine phase select unit 712 provides phase adjustment in increments of less than one clock or symbol cycle. The fine phase select unit 712 can provide adjustment in increments of about ¼ of a symbol cycle, for example. In some implementations, the clock generation unit 709 generates multiple possible clock signals having different phases (e.g., each differing by ¼ or ⅛ symbol), and the skew control signal controls the fine phase select unit 711 to select the appropriate clock phase. In another embodiment, the clock generation unit 709 provides a single clock, and this clock can be delayed by some incremental amount to perform the fine phase select function.

Thus, skew correction is performed at the transmit side by adjusting timing of transmissions of the transmitters 703a-703b, such as by controlling the relative phases of the transmitters. In this manner, skew correction can be achieved with much less complexity than if skew correction were performed at the receive side.

In some embodiments, the device 701 can be a transceiver such any of the transceivers described herein. Additionally, in some embodiments, the clock generation unit 709 can form a portion of the egress line-side front end module shown in FIG. 5. However, other configurations are possible.

In certain configurations, the clock generation unit 709 can receive a coarse adjustment signal form the coarse phase select unit 711 to coarsely adjust or shift the relative phase difference between the clock signals driving the transmitters 703a and 703b. However, other configurations are possible, such as implementations in which the coarse phase select unit 711 is used to provide a relative delay or phase difference between data signals DA+', DA−' provided as inputs to the transceivers 703a-703b. As shown in FIG. 13A, the fine phase select unit 712 can receive one or more clock signals provided by the clock generation unit 709, and can perform fine phase adjustments to the clock signals. As shown in FIG. 13A, the fine phase select unit 712 generates the first skew adjusted clock signal for controlling the first transmitter 703a and the second skew adjusted clock signal for controlling the second transmitter 703b.

The skew control system 664 accepts an input from the receiver 665 and sends an output to the system to provide coarse and/or fine skew adjustments.

The second electronic device 702 includes a differential receiver 671 configured to receive the differential signal transmitted from the first electronic device 701 and a skew transmitter 672 configured to transmit data (e.g., data indicative of skew) to the skew receiver 665 in the first electronic device 701. In the illustrated implementation, the skew transmitter 672 is not a differential transmitter and the skew receiver 665 is not a differential receiver. For example, in certain embodiments, another wire(s) within the cable other than the high-speed differential channel is used to communicate skew information between the two devices 701, 702. For instance, the skew information can be transmitted using a relatively low speed link between the two devices 701, 702, allowing for simplified, robust transmission of the skew information. This can be useful when it is desirable to send skew information during the start-up/negotiation phase, or when the high-speed link between the two devices 701, 702 is otherwise not yet negotiated or fully operational.

In certain configurations, the link between the transmitter 672 of the second device 702 and the receiver 665 of the first device 701 can have a maximum data rate of significantly less than the maximum data rate of the high-speed link between the transmitters 703a, 703b of the first device 701 and the receiver 671 of the second device 702. For instance, the maximum data rate of the high speed link can be between about 5 Gbit/s and 60 Gbit/s, while the maximum data rate of the link between the transmitter 672 of the second device 702 and the receiver 665 of the first device 701 can be less than about 1 Gbit/s, for example, between about 100 Mbits/s and 200 Mbits/s. In some cases, the transmitter 672 is a differential transmitter and/or the receiver 665 is a differential receiver, and a differential line is used to transmit the skew information to the device 701. In various implementations, the pair of differential transmitters 703a and 703b can include one or more DACs and the differential receiver 671 can include one or more ADCs.

An example algorithm for detecting and correcting for skew will now be described. The algorithm can be implemented by the skew control system 664, for example. The device 701 transmits a pre-determined (or known) data pattern to the receiver 671 over each transmitter 703a and 703b, such as a data pattern that is known to the receiver 671. For calibration purposes, the device 701 can additionally insert a relatively large amount of known delay between the data pattern sent via the first transmitter 703a and the data pattern sent via second transmitter 703b.

The receiver 671 of the second device 702 is configured to receive the differential signal and determine an existence of a skew between the received signals. Since, the transmitted pattern is known to the receiver 671, the device 702 can identify receipt of the data pattern on each of the differential inputs and determine some characteristic of the skew, such as the existence, direction, or amount of skew. For instance, in one embodiment, the second device 702 determines a direction of the skew, and the transmitter 672 of the second device 702 forwards information indicating the skew's direction to the first device 701. The second device 702 may forward an indication that the known data pattern received from the first transmitter 703a is currently earlier or later in time than the known data pattern received from the second transmitter 703b, for example.

The receiver 665 of the first device 701 receives the skew direction information and provides the received information to the skew control system 664. The skew control system 664 provides control signals that adjust or shift the relative phase difference between the clock signals driving the pair of differential transmitters 703a and 703b to correct for skew. In this manner skew between the two channels of a differential signal are corrected at the transmitter side. For instance, if the skew direction information indicates that the data pattern transmitted via the first transmitter 703a is being received earlier in time than the data pattern transmitted via the second transmitter 703b, the skew control system 664 instructs the coarse phase select unit 711 to adjust the relative phases of the first and second transmitters 703a, 703b by a coarse amount (e.g., a certain number of symbol cycles), such that data driven by the first transmitter 703a is effectively delayed by the phase adjustment amount as compared to the data driven by the second transmitter 703b.

This process can be repeated iteratively, and during this iterative process the granularity of the phase adjustment steps can become increasingly fine as the skew becomes smaller and smaller. For instance, the skew control system 664 can instruct the coarse phase select unit 711 and/or fine phase select unit 712 to adjust the relative phases of the first and second transmitters 703a, 703b by a first amount during a first number (n) of iterations, by a second smaller amount during the next n iterations, and so on. In addition, the known delay that was initially inserted for calibration purposes can be reduced down to zero or some other small amount over the course of the phase adjustment process.

At some point in the execution of the example algorithm, as the skew adjustment continues in the initial direction to counteract the initially detected delay between the two data patterns, the amount of phase adjustment inserted by the first device 701 can overshoot, such that the difference in delay changes direction. The second device 702 detects the resulting change in direction, and transmits an indication as to the new direction via the transmitter 672. The skew control system 664 will in turn instruct the coarse 711 and/or fine phase select units 712 to adjust the relative phase of the transmitters 703a, 703b in the opposite direction. This process can also be performed iteratively, until the difference is eliminated, or is determined to be a sufficiently small amount, as specified by the algorithm implemented by skew control system 664.

Other implementations are possible. For instance, a delay can be used to adjust or shift the relative phase difference between the clock signals instead of using a coarse/fine adjustment system shown in FIG. 13A.

This method of detecting and correcting skew is not limited to two devices or a pair of differential signals, or to devices that implement differential signaling. For instance, such skew detection and correction can be scaled to a large number of devices (e.g., 1000's of devices) and a large number of signals (e.g., 1000's of differential or other signals).

FIG. 13A illustrates de-skew of a signal being transmitted from device 701 to device 702. It is to be understood, however, that a similar de-skew function can be performed for a signal being transmitted from device 702 to device 701. Thus, although, in the illustrated implementation only select, different components are shown for the first and second electronic devices 701 and 702 for the purposes of illustrating the skew detection and correction for a signal going in only one direction (701→702), the first and second electronic devices 701 and 702 can be identical to each other in other implementations. For example, the first electronic device 701 can include a differential receiver configured to calculate skew and a transmitter configured to transmit the calculated skew as described with reference to the second electronic device 702. Similarly, the second electronic device 702 can include a differential transmitter similar to the pair of differential transmitters 703a and 703b, a skew control system similar to the skew control system 664, a system to adjust or shift the relative phase difference between the clock signals and a receiver similar to receiver 665.

Figure 13B:
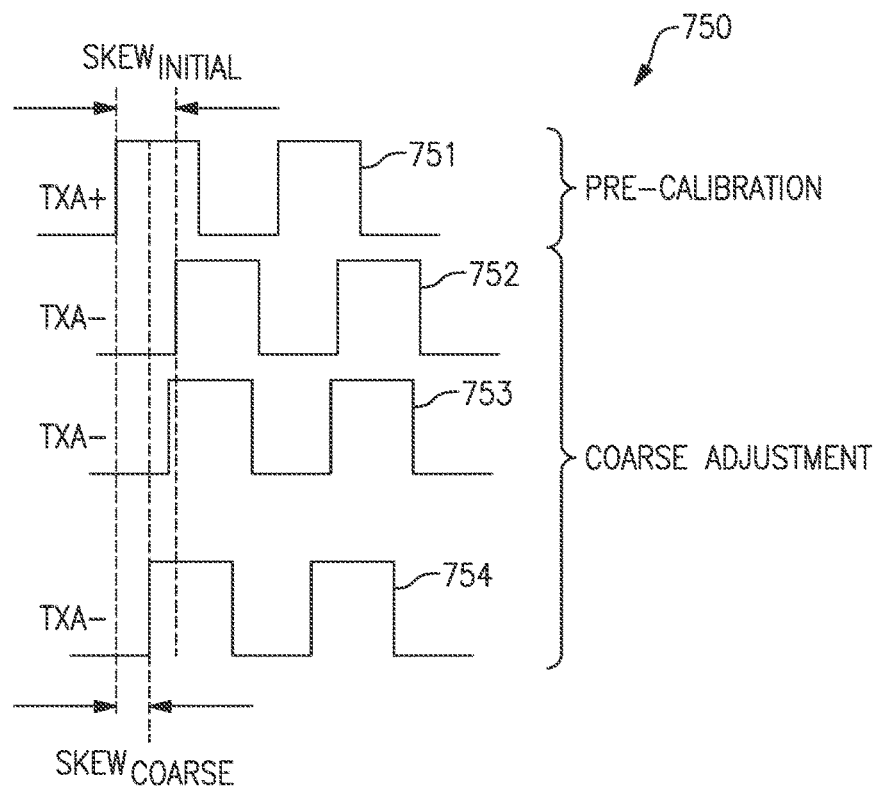
FIG. 13B illustrates one example of a timing diagram of coarse skew adjustment for the communication system of FIG. 13A.

FIG. 13B illustrates one example of a timing diagram 750 of coarse skew adjustment for the communication system 700 of FIG. 13A. The timing diagram 750 includes a first plot 751 of the non-inverted transmit signal TXA+ and a second plot 752 of the inverted transmit signal TXA− as received by the differential receiver 671 of FIG. 13A. As shown in FIG. 13B, the differential transmit signal TXA+, TXA− has an initial skew ($SKEW_{INITIAL}$) when the differential transmit signal is received at the input of the differential receiver 671.

In the illustrated configuration, the coarse phase select unit 711 generates the non-inverted transmit signal TXA+ and the inverted transmit signal TXA− as square wave signals that can have, for example, a frequency of less than 1 GHz. The illustrated square wave signals illustrated one example of a test or training sequence that can be used for skew observing skew at the differential receiver 671. However, other configurations are possible.

The skew between the non-inverted transmit signal TXA+ and the inverted transmit signal TXA− can be observed by the differential receiver 671, which can provide a skew indication signal to the skew control circuit 664 via the skew transmitter 672 and skew receiver 665. The timing diagram 750 further includes a third plot 753, which corresponds to a first coarsely adjusted inverted transmit signal TXA−. The first coarsely adjusted inverted transmit signal TXA− transmit signal can be adjusted by the skew control circuit 664 based on the skew indication signal generated by the differential receiver 671.

After the inverted transmit signal TXA− is adjusted as shown by the third plot 753, the differential receiver 671 can be used to determine the skew of the received differential transmit signal TXA+, TXA− after the first coarse adjustment. The differential receiver 671 can change a value of the skew indication signal based on the observed skew, and provide the updated skew indication signal to the skew control circuit 664, which can further control the coarse skew adjustment provided by the coarse phase select unit 711. For example, FIG. 13B further includes a fourth plot 754, corresponding to a second coarsely adjusted inverted transmit signal TXA−.

The process can be repeated until the skew observed by the differential receiver 671 is within a desired coarse skew tolerance, for instance, less than 1 unit interval (UI) of the square wave signals. At the end of the coarse skew adjustment, the observed skew by the differential receiver 671 corresponds to a coarsely compensated skew ($SKEW_{COARSE}$), which is less than the initial skew. Although the illustrated example shows the inverted transmit signal TXA− as being adjusted twice by the skew control circuit 664, the skew control circuit 664 can provide coarse skew adjustment more or fewer times. Additionally, although FIG. 13B illustrates the inverted transmit signal TXA− as being shifted in time by the coarse phase select unit 711, other configurations are possible, such as implementations in which the non-inverted transmit signal TXA+ is shifted in time by the coarse phase select unit 711.

Figure 13C:
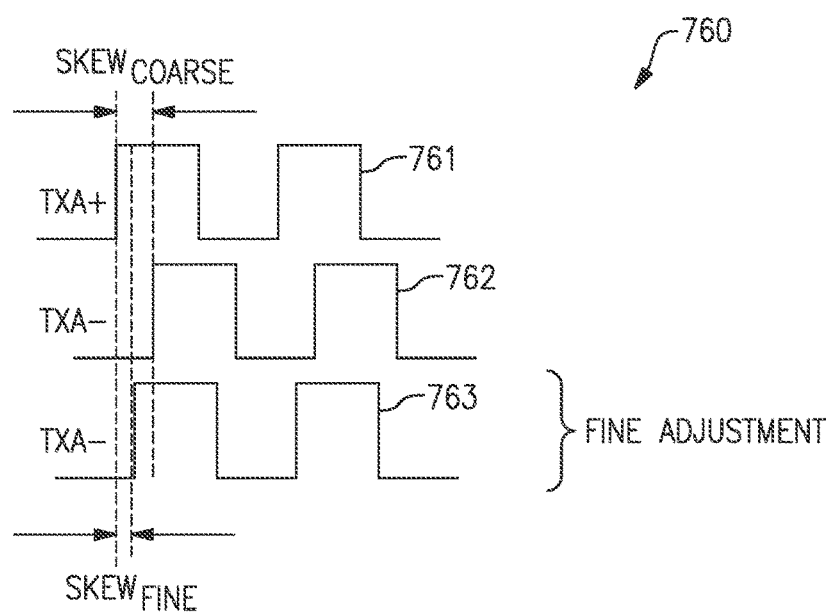
FIG. 13C illustrates one example of a timing diagram of fine skew adjustment for the communication system of FIG. 13A.

FIG. 13C illustrates one example of a timing diagram 760 of fine skew adjustment for the communication system 700 of FIG. 13A. The timing diagram 760 includes a first plot 761 of a non-inverted transmit signal TXA+ and a second plot 762 of an inverted transmit signal TXA−, which have been adjusted by coarse skew adjustment to have a coarsely adjusted skew ($SKEW_{COARSE}$). Thus, in this example, fine skew adjustment occurs after coarse skew adjustment.

The skew between the non-inverted transmit signal TXA+ and the inverted transmit signal TXA− can be observed by the differential receiver 671, which can provide a skew indication signal to the skew control circuit 664 via the skew transmitter 672 and skew receiver 665. The timing diagram 750 further includes a third plot 763, which corresponds to a first finely adjusted inverted transmit signal TXA−. The first finely adjusted inverted transmit signal TXA− transmit signal is generated based on a fine adjustment provided by the fine phase select unit 712.

In a manner similar to that described earlier with respect to coarse skew adjustment, the skew control circuit 664 can adjust a fine skew adjustment provided by the fine phase select unit 712 one or more times. For example, the fine skew adjustments can be incremented until the skew observed by the differential receiver 671 is within a desired fine skew tolerance, for instance, less than ½ unit interval (UI) of the square wave signals. In certain configurations, fine skew adjustment is provided by selecting phases of clock signals provided to the transmitters 703a-703b to control timing of transmissions.

At the end of the fine skew adjustment, the observed skew by the differential receiver 671 corresponds to a finely compensated skew ($SKEW_{FINE}$), which is less than the initial skew and coarsely compensated skew. Although the illustrated example shows the inverted transmit signal TXA− as being adjusted once by the skew control circuit 664, the skew control circuit 664 can provide additional fine skew adjustments. Additionally, although FIG. 13C illustrates the inverted transmit signal TXA− as being shifted in time by the fine phase select unit 712, other configurations are possible, such as implementations in which the non-inverted transmit signal TXA+ is shifted in time by the fine phase select unit 712.

Figure 14:
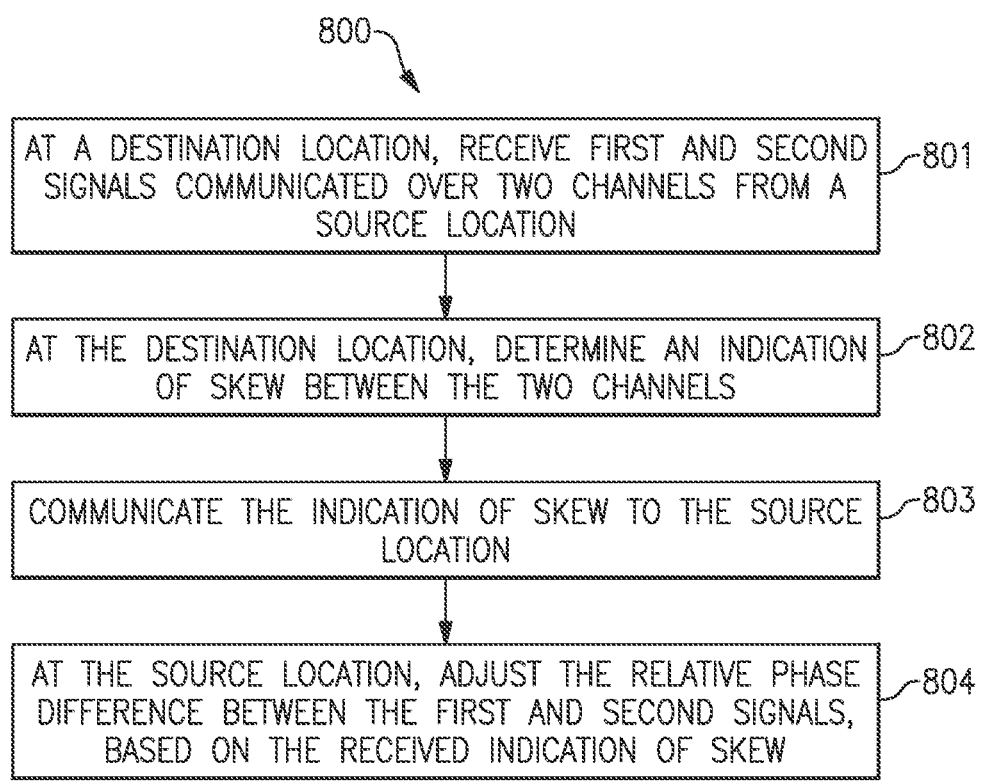
FIG. 14 is a flowchart that illustrates a method of detecting and correcting skew between two physical channels.

FIG. 14 is a flowchart that illustrates a method 800 of detecting and correcting skew between two channels of a differential signal. The method 800 includes receiving a differential signal transmitted from a differential transmitter at a source location by a differential receiver at a destination location, as shown in block 801. The method 800 further includes determining an indication of skew, such as calculating a time difference between the two channels of the differential signal, as shown in block 802. The time difference or other indication of skew can be determined at the destination location by the differential receiver. As discussed above, the calculated time difference or other observation provides a measure of the skew between the two channels of the differential signal. The method 800 further includes communicating the skew to the source location, as shown in block 803. In various implementations, a non-differential transmitter can be used to communicate the time difference to the source location. The method 800 further includes adjusting the relative phase difference between the clock signals that drive the differential transmitter at the source location, as shown in block 804. Control signals from a skew control system can be used to adjust the relative phase difference between the clock signals that drive the differential transmitter at the source location. The control signals from the skew control system can be generated based on the calculated time difference received from the destination location.

Examples of Start-Up Sequences/Channel Negotiations

An objective of the various implementations of the systems and methods described herein is to establish high-speed point-to-point links between different electronic devices, computing devices, storage devices and peripheral devices.

Referring back to FIGS. 2A-2B, in certain configurations, the first and second transceivers 107a, 107b can operate at relatively high data rates, including rates of greater than 10 Gbit/s, greater than 20 Gbit/s, or in some embodiments, at least about 40 Gbit/s. Moreover, various aspects embodiments described, while enabling communications at these speeds, can also significantly increase the sophistication involved in establishing the link between the transceivers 107a, 107b on either end of the link or cable. For instance, to facilitate communication at higher bit-rates and over desired cable lengths, various implementations of the transceivers 107a, 107b can implement a combination of some or all of the following, without limitation: multiplexing (e.g., via PAM encoding with 4, 8, 16, 64, or more levels, or some other encoding format), channel de-skew (e.g., transmitter-based de-skew), clock and data recovery (e.g., ADC-based timing recovery), channel acquisition via filter adaptation, and the like.

Thus, the transceivers 107a, 107b can be configured to execute an automated negotiation process with the corresponding transceiver on the other end of the link in order to establish a successful link. As will be described, the negotiation process can involve a number of incremental steps beginning with rudimentary, low speed communication, and culminating in a fully functional data transmission mode.

Figure 15:
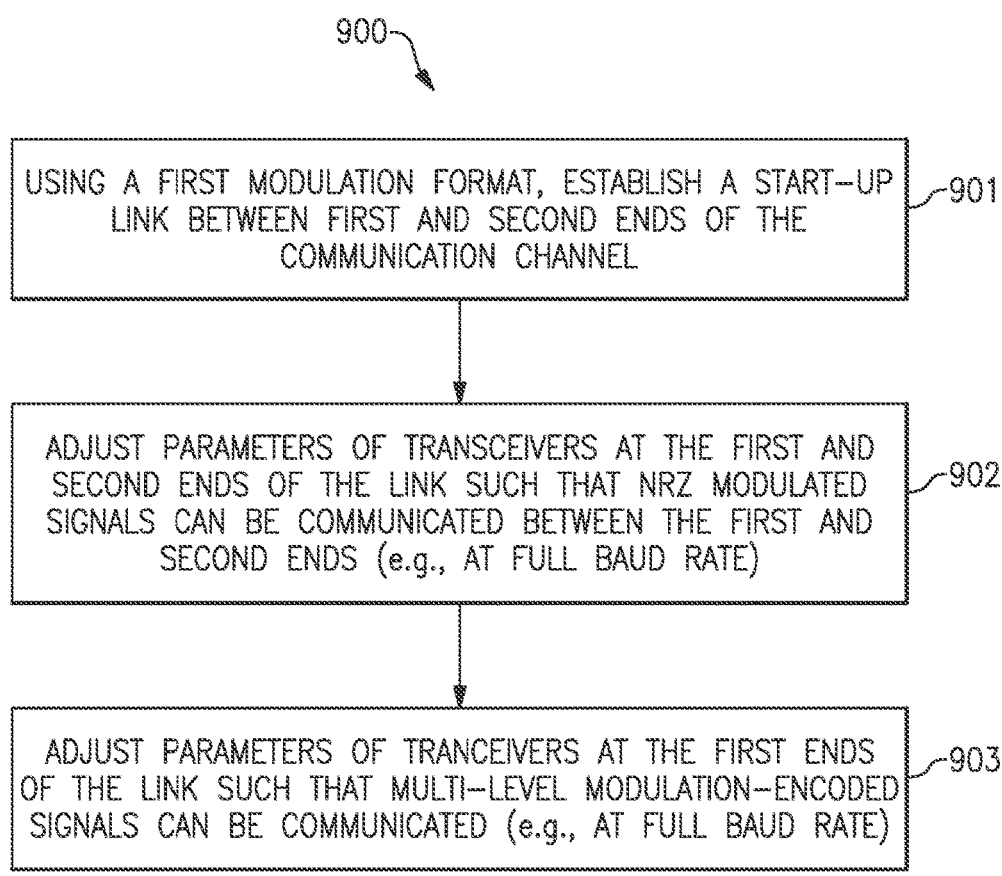
FIG. 15 is a flowchart that illustrates a method of establishing a high-speed communication link between a first electronic device and a second electronic device.

FIG. 15 is a flowchart that illustrates a method 900 of establishing a high-speed communication link between a first electronic device and a second electronic device. The method of establishing a high-speed communication link between a first electronic device and a second electronic device can comprise three phases: (a) a start-up phase; (b) a full speed training phase; and (c) a full functional training phase. In various implementations, the three phases can be completed and the high-speed communication link between a first electronic device and a second electronic device can be established within a few milliseconds (e.g., within 5-6 milliseconds).

Start-Up Phase

The start-up phase includes establishing a start-up communication channel using a data signal with simplified modulation format (e.g. a Manchester coded data signal) between a first and a second electronic device, as shown in block 901. The first and the second electronic device can be connected by a communication link comprising a pair of transceivers (for the first and second transceivers 107a-107b shown in FIGS. 2A-2B) and a cable (for example, the cable 110 of FIG. 2A or the cable 115 of FIG. 2B). The start-up communication channel can transmit and receive data at a lower data rate than the data rate at which data will be transmitted and received when fully functional. For example, the start-up communication channel can transmit and receive data at a data rate of about 100 Mbits/s as compared to transmitting and receiving data at data rates greater than 10 Gbit/s when fully function. In the start-up phase, initial information can be exchanged between the first and the second electronic devices. In various implementations, the initial information exchanged between the first and the second electronic devices can be similar to the information exchanged when setting up a communication link with other existing protocols (e.g., Ethernet). A basic channel test may be performed in the start-up phase to determine the channel parameters such as, for example, loss, noise, dispersion, non-linearity, etc. The start-up communication channel can use a simple modulation format such as Manchester coding which is a defined protocol for establishing the start-up communication channel and for testing and diagnostic purposes.

In various implementations, the start-up phase can include additional operating mode negotiation. For example, either or both of the transceivers or other devices in the link may be capable of operating in at different data rates (e.g., one or more of 100 Mbits/s, 1 Gbit/s, 10 Gbit/s, 20 Gbit/s, 25 Gbit/s, 30 Gbit/s, 35 Gbit/s, and 40 Gbit/s), and during the operating mode negotiation the two sides can determine a negotiated data rate. The protocol for determining the negotiated rate can vary, and in one embodiment the protocol specifies that the negotiated rate will correspond to the maximum data rate of the transceiver having the lowest maximum rate (e.g., 20 Gbit/s if the transceivers have maximum rates of 20 Gbit/s and 40 Gbit/s respectively).

Other parameters can be determined during the operating mode negotiation instead of or in addition to data rate. For instance, the number of active host-side or line-side channels may be negotiated. In one embodiment, for example, one or more of the transceivers in the link are similar to the transceiver 250 shown in FIG. 5, and have single differential line side channels in each direction capable of 40 Gbit/s transmission. However, on the host-side, the transceivers are capable of operation utilizing either two 20 Gbit/s differential channels in each direction or four 10 Gbit/s differential channels in each direction, depending on the operational mode. The number of operational host-side channels can be determined in the start-up phase of the negotiation process in such cases.

The start-up phase can additionally include a de-skew function to compensate for skew arising between signals, e.g., between differential signals travelling over paired micro coaxial lines in the cable. Moreover, the de-skew function can be implemented in the line-side transmitter via a feedback mechanism, rather than in the line-side receiver, significantly reducing complexity. The de-skew function can be the one of those described herein, for example, with respect to FIGS. 12A-14.

Full Speed Training Phase

In the full training phase, the communication channel is configured to transmit and receive data at the baud rate at which the communication channel will operate when fully functional. The transmitted and received signals in this phase are modulated using a simplified format (e.g., NRZ) and not a multi-level modulation format. In this phase, the parameters of the components in the transceivers connected to the first and second electronic devices are adjusted such that NRZ modulated signals at the full baud rate can be transmitted and received at an error rate that is below or equal to a threshold error value, as shown in block 902. The parameters that are adjusted in this phase can include phase of the recovered clock, the shape of the transmitted pulse, levels for the thresholder/automatic gain controller in the receiver, operating parameters for the equalizers, etc. In various implementations, an in-band communication channel can be added to the transmitted data stream. The in-band communication channel can be used to communicate between the first and second electronic devices. In those implementations in which an in-band communication channel is added, a framer can be used to extract the in-band channel.

Full Functional Training Phase

In the full functional training phase, the communication channel is configured to transmit and receive data at the baud rate at which the communication channel will operate when fully functional and using multi-level modulation format. In this phase, the parameters of the components in the transceivers at the first and second electronic devices are further adjusted such that signals modulated using a multi-level modulation format at the full baud rate can be transmitted and received at an error rate that is below or equal to a threshold error value, as shown in block 903. The parameters that are adjusted in this phase can include phase of the recovered clock, the shape of the transmitted pulse, levels for the thresholder/automatic gain controller in the receiver, operating parameters for the equalizers, etc. In various implementations, the in-band communication channel can be retained to communicate between the first and second electronic devices.

Examples of Cables and Data Center Implementations

Figure 16:
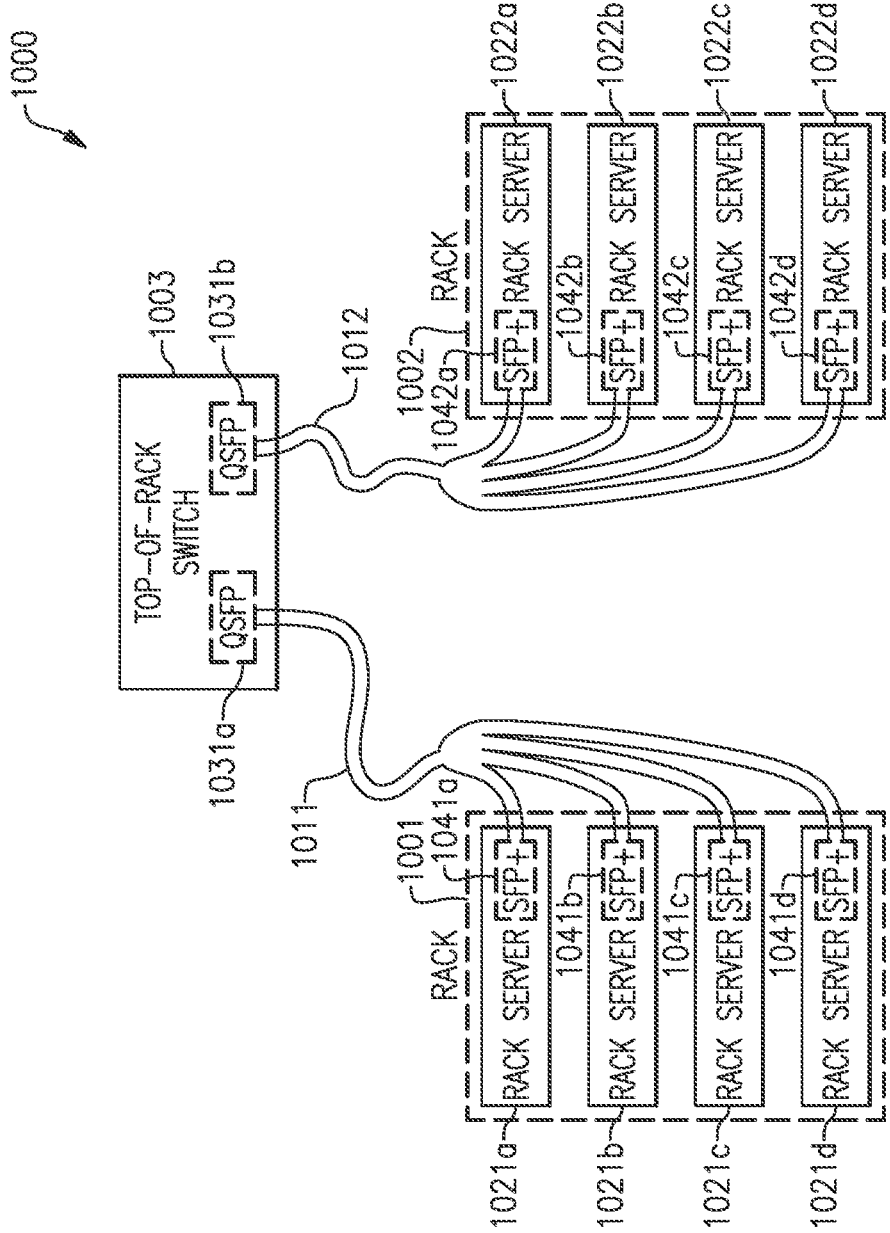
FIG. 16 is a schematic diagram of a data center system according to one embodiment.

FIG. 16 is a schematic diagram of a data center system 1000 according to one embodiment. The data center system 1000 includes a first rack 1001, a second rack 1002, a top-of-rack switch 1003, a first breakout cable 1011, and a second breakout cable 1012. Although FIG. 16 illustrates the top-of-rack switch 1003 as being connected to two racks using two breakout cables, the teachings herein are applicable to configurations including more or fewer racks and/or more or fewer breakout cables.

The top-of-rack switch 1003 includes a first quad small form-factor pluggable (QSFP) port 1031a and a second QSFP port 1031b. Additionally, the first rack 1001 includes a first server 1021a including a first enhanced small form-factor pluggable (SFP+) port 1041a, a second server 1021b including a second SFP+ port 1041b, a third server 1021c including a third SFP+ port 1041c, and a fourth server 1021d including a fourth SFP+ port 1041d. Additionally, the second rack 1002 includes a first server 1022a including a first SFP+ port 1042a, a second server 1022b including a second SFP+ port 1042b, a third server 1022c including a third SFP+ port 1042c, and a fourth server 1022d including a fourth SFP+ port 1042d.

Although FIG. 16 illustrates the racks 1001-1002 as each including four servers, the racks 1001-1002 can include more or fewer servers. Additionally, the teachings herein are applicable to configurations in which two or more racks include a different number of servers.

The breakout cables 1011-1012 have been used to electrically connect the QSFP ports of the top-of-rack switch 1003 to the SFP+ ports of the servers. For example, the first breakout cable 1011 electrically couples the first QSFP port 1031a to the first SFP+ port 1041a of the first rack's first server 1021a, electrically couples the first QSFP port 1031a to the second SFP+ port 1041b of the first rack's second server 1021b, electrically couples the first QSFP port 1031a to the third SFP+ port 1041c of the first rack's third server 1021c, and electrically couples the first QSFP port 1031a to the fourth SFP+ port 1041d of the first rack's fourth server 1021d. Similarly, the second breakout cable 1012 electrically couples the second QSFP port 1031b to the first SFP+ port 1042a of the second rack's first server 1022a, electrically couples the second QSFP port 1031b to the second SFP+ port 1042b of the second rack's second server 1022b, electrically couples the second QSFP port 1031b to the third SFP+ port 1042c of the second rack's third server 1022c, and electrically couples the second QSFP port 1031b to the fourth SFP+ port 1042d of the second rack's fourth server 1022d.

Although FIG. 16 illustrates an example in which a breakout cable has been used to electrically connect a top-of-rack switch's QFSP port to several SFP+ ports of a rack of servers, the teachings herein are applicable to configurations in which breakout cables are used in connection with other kinds of ports.

In another embodiment, a breakout cable is used to connect a QSFP28 port of a top-of-rack switch to two Q8FP ports of an end-of-row switch in a server rack. In another embodiment, a breakout cable is used to connect a QSFP28 port of a top-of-rack switch to eight SFP+ ports associated with servers of a server rack. Although two additional examples have been provided, the teachings herein are applicable to a wide range of ports and configurations.

Figure 17A:
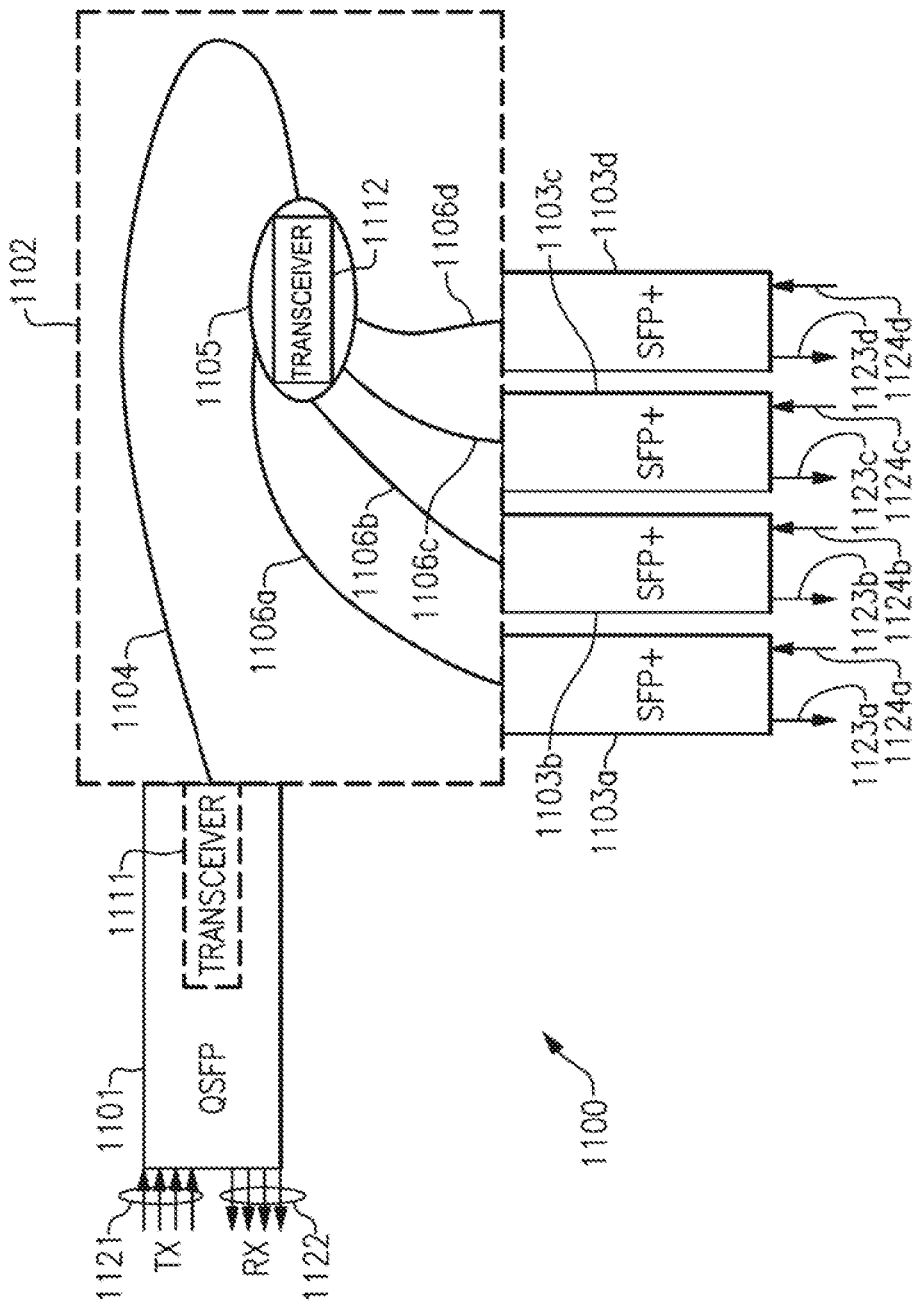
FIG. 17A is a schematic diagram of a breakout cable according to one embodiment.

FIG. 17A is a schematic diagram of a breakout cable 1100 according to one embodiment. The breakout cable 1100 illustrates one embodiment of the breakout cables 1011, 1012 of FIG. 16.

The breakout cable 1100 includes a QSFP interface 1101 including a first transceiver 1111. The breakout cable 1100 further includes a first SFP+ interface 1103a, a second SFP+ interface 1103b, a third SFP+ interface 1103c, and a fourth SFP+ interface 1103d. The breakout cable 1100 further includes cabling 1102, which includes a primary cable or main trunk 1104, a breakout hub 1105, a first secondary cable 1106a, a second secondary cable 1106b, a third secondary cable 1106c, and a fourth secondary cable 1106d. As shown in FIG. 17A, the breakout hub 1105 includes a second transceiver 1112. Although FIG. 17A illustrates a configuration with four secondary cables, more or fewer secondary cables can be included depending on the application the breakout cable is used for.

The QSFP interface 1101 includes a host-side QSFP transmit interface 1121 which can be used to receive signals from a top-of-rack switch or other host for transmission over the cabling 1102 to the second transceiver 1112. The QSFP interface 1101 further includes a host-side QSFP receive interface 1122 which can be used to send signals to the top-of-rack switch or other host that are received over the cabling 1102 from the second transceiver 1112.

In the illustrated configuration, the first transceiver 1111 multiplexes transmit signals received from the host-side QSFP transmit interface 1121 for transmission over the primary cable 1104 to the second transceiver 1112. Additionally, the first transceiver 1111 receives a multiplexed signal from the second transceiver 1112 over the primary cable 1104, and de-multiplexes the received signal to generate receive signals on the host-side QSFP receive interface 1122. Thus, the primary cable 1104 is used to for transmission of multiplexed signals between the first and second transceivers 1111, 1112.

In one embodiment, the first transceiver 1111 has an implementation similar to the transceiver 40 of FIG. 1C, and the first transceiver 1111 provides a 4:2 multiplexing or parallel-to-serial SerDes operation to data transmitted over the primary cable 1104 and provides a 2:4 de-multiplexing or serial-to-parallel SerDes operation to data received over the primary cable 1104. In another embodiment, the first transceiver 1111 has an implementation similar to the transceiver 40 of FIG. 1C with the DAC 14b, the FIR 17B, the equalizer 21b, the CDR circuit 22b, and the FFE/DFE 25b omitted, and the first transceiver 1111 provides a 4:1 multiplexing operation to data transmitted over the primary cable 1104 and provides a 1:4 de-multiplexing operation to data received over the primary cable 1104. Although two example transceiver implementations have been described, other configurations are possible.

In the illustrated configuration, the second transceiver 1112 is electrically connected to the SFP+ interfaces 1103a-1103d via the secondary cables 1106a-1106d. As shown in FIG. 17A, the first SFP+ interface 1103a includes a first host-side SFP+ receive interface 1123a and a first host-side SFP+ transmit interface 1124a, which can be used to send or receive signals from a rack server or other host. Additionally, the second SFP+ interface 1103b includes a second host-side SFP+ receive interface 1123b and a second host-side SFP+ transmit interface 1124b, the third SFP+ interface 1103c includes a third host-side SFP+ receive interface 1123c and a third host-side SFP+ transmit interface 1124c, and the fourth SFP+ interface 1103d includes a fourth host-side SFP+ receive interface 1123d and a fourth host-side SFP+ transmit interface 1124d.

The second transceiver 1112 can be used to transmit or receive host-side data to hosts electrically connected to the SFP+ interfaces 1103a-1103d. In one embodiment, the second transceiver 1112 has an implementation similar to the transceiver 40 of FIG. 1C and provides 4:2 multiplexing operations and 2:4 de-multiplexing operations for transmissions over the primary cable 1104. In another embodiment, the second transceiver 1112 has an implementation similar to the transceiver 40 of FIG. 1C with the DAC 14b, the FIR 17B, the equalizer 21b, the CDR circuit 22b, and the FFE/DFE 25b omitted, and the second transceiver 1111 provides 4:1 multiplexing operations and 1:4 de-multiplexing operations for transmissions over the primary cable 1104. In such a configuration, the first transmit signal TXA+, TXA− can be received over the first host-side SFP+ transmit interface 1124a, the second transmit signal TXB+, TXB− can be received over the second host-side SFP+ transmit interface 1124b, the third transmit signal TXC+, TXC− can be received over the third host-side SFP+ transmit interface 1124c, the fourth transmit signal TXD+, TXD− can be received over the fourth host-side SFP+ transmit interface 1124d, the first receive signal RXA+, RXA− can be sent over the first host-side SFP+ receive interface 1123a, the second receive signal RXB+, RXB− can be sent over the second host-side SFP+ receive interface 1123b, the third receive signal RXC+, RXC− can be sent over the third host-side SFP+ receive interface 1123c, and the fourth receive signal RXD+, RXD− can be sent over the fourth host-side SFP+ receive interface 1123d.

Figure 17B:
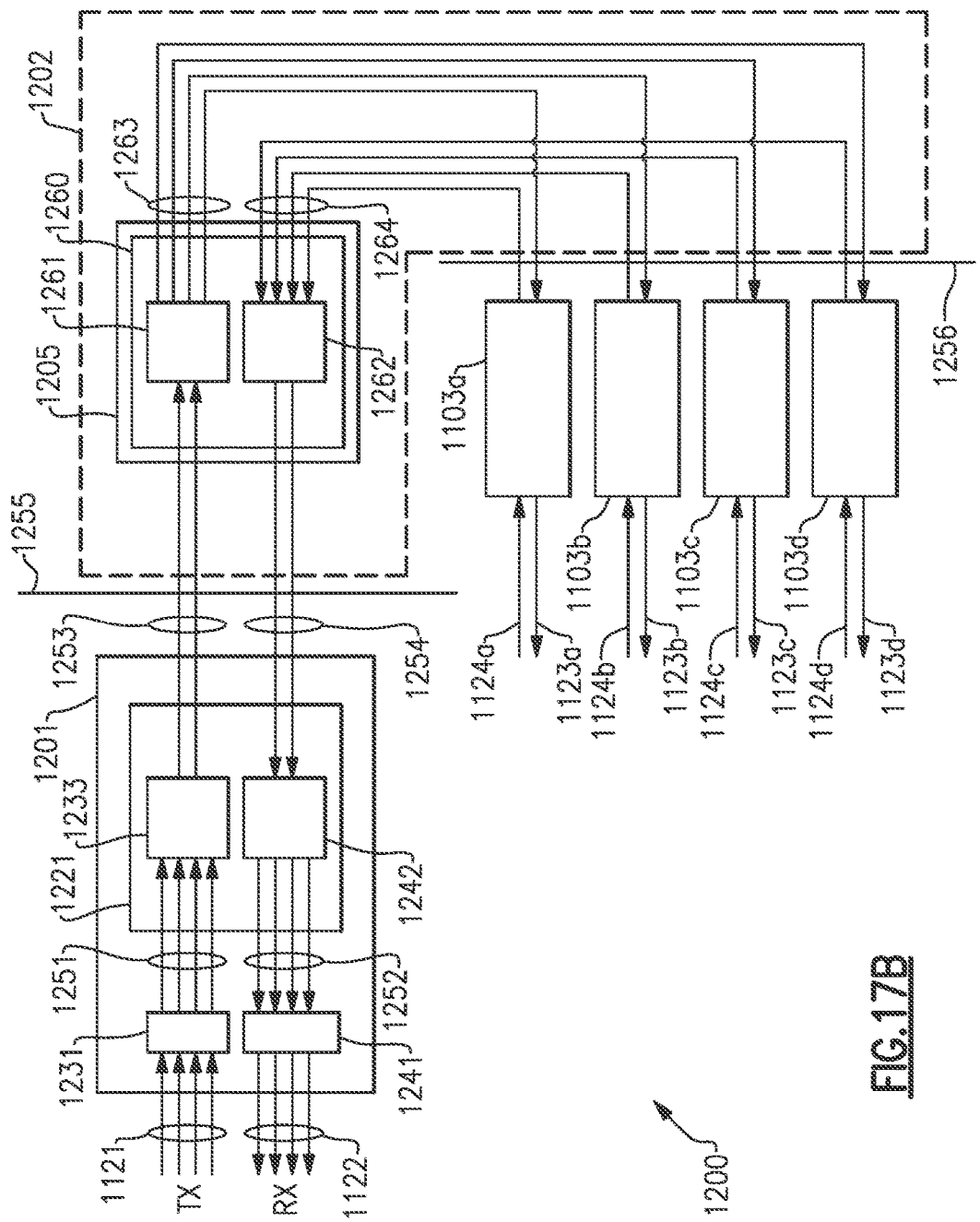
FIG. 17B is a schematic diagram of a breakout cable according to another embodiment.

FIG. 17B is a schematic diagram of a breakout cable 1200 according to another embodiment. The breakout cable 1200 illustrates one embodiment of the breakout cable 1100 of FIG. 17A.

The breakout cable 1200 includes a QSFP interface or pluggable module 1201, cabling 1202, a first SFP+ interface or pluggable module 1103a, a second SFP+ interface 1103b, a third SFP+ interface 1103c, and a fourth SFP+ interface 1103d.

In the illustrated configuration, the QSFP interface 1201 includes a host-side QSFP transmit interface 1121 for receiving transmit signals from a host, a host-side QSFP receive interface 1122 for sending receive signals to the host, a line-side transmit interface 1253 for sending transmit signals over the cabling 1202, and a line-side receive interface 1254 for receiving receive signals over the cabling 1202. In certain configurations, the host-side QSFP transmit interface 1121, the host-side QSFP receive interface 1122, the line-side transmit interface 1253, and the line-side receive interface 1254 operate differentially. Thus, each of the illustrated lines can represent a differential signal in certain configurations.

Additionally, the QSFP interface 1201 includes a first transceiver 1221, an egress block 1231, and an ingress block 1241. The egress block 1231 can receive transmit signals from the host over the host-side QSFP transmit interface 1121, and can process the transmit signals to provide processed signals as inputs to the first transceiver 1221. The egress block 1231 can provide a wide variety of functions, such as equalization and/or impedance matching. The ingress block 1241 can be used to process host-side receive signals from the first transceiver 1221 to generate receive signals on the host-side QSFP receive interface 1122. The ingress block 1241 can provide a wide variety of functions, such as impedance matching and/or driving.

In the illustrated configuration, the first transceiver 1221 includes a transmit-path DSP 1233, which is used to provide conditioning and multiplexing to signals received on the host-side to generate multiplexed signals for transmission over the cabling 1202. Additionally, the first transceiver 1221 further includes a receive-path DSP 1242, which is used to providing conditioning and demultiplexing to signals received over the cabling 1202.

As shown in FIG. 17B, the cabling 1202 includes a second transceiver 1260 in a breakout hub 1205 of the cabling 1202. Although not illustrated in FIG. 17B for clarity of the figures, the cabling 1202 can include a primary cable (for example, the primary cable 1104 of FIG. 17A) associated with communications over a first communications boundary 1255, and a plurality of secondary cables (for example, the secondary cables 1106a-1106d of FIG. 17A) associated with communications over a second communications boundary 1256. In the illustrated configuration, the second transceiver 1260 includes a receive-path DSP 1261 for conditioning and demultiplexing signals received from the first transceiver 1221, and for sending the demultiplexed signals to the SFP+ interfaces 1103a-1103d over the host-side receive interface 1263. Additionally, the second transceiver 1260 further includes a transmit path DSP 1262 for multiplexing signals received from the SFP+ interfaces 1103a-1103d over the host-side transmit interface 1264, and sending the multiplexed signals to the first transceiver 1221. In certain configurations, the second transceiver 1260 communicates differentially on the line-side and host-side. Thus, each of the illustrated lines can represent a differential signal in certain configurations.

Additional details of the breakout cable 1200 can be similar to those described earlier.

Figure 18:
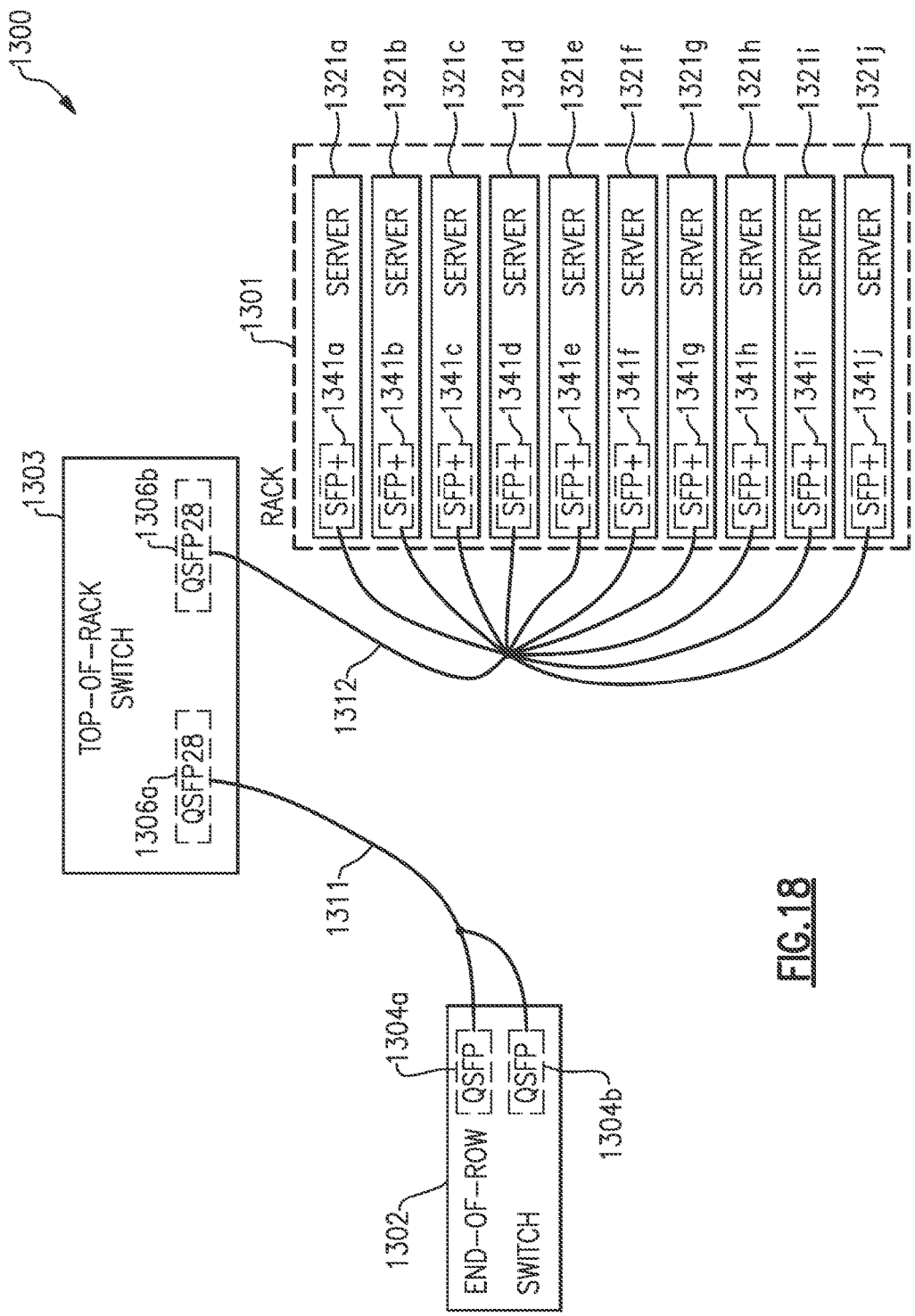
FIG. 18 is a schematic diagram of a data center system according to another embodiment.

FIG. 18 is a schematic diagram of a data center system 1300 according to another embodiment. The data center system 1300 includes a rack 1301, an end-of-row switch 1302, a top-of-rack switch 1303, a first breakout cable 1311, and a second breakout cable 1312. Although FIG. 18 illustrates the top-of-rack switch 1303 as being connected to one rack and one end-of-row switch, the teachings herein are applicable to a wide variety of configurations, including configurations with additional racks and/or end-of-row switches.

The top-of-rack switch 1303 includes a first QSFP28 port 1396a and a second QSFP28 port 1396b. Additionally, the rack 1301 includes first to tenth servers 1321a-1321j, which include first to tenth SFP+ ports 1341a-1341j, respectively. Furthermore, the end-of-row switch 1302 includes a first QSFP port 1304a and a second QSFP port 1304b.

In the illustrated configuration, the first breakout cable 1311 has been used to electrically connect the first QSFP28 port 1306a of the top-of-rack switch 1303 to the first and second QSFP ports 1304a-1304b of the end-of-row switch 1302. Additionally, the second breakout cable 1312 has been used to electrically connect the second QSFP28 port 1306b of the top-of-rack switch 1303 to the SFP+ ports 1341a-1341j of the servers 1321a-1321j.

The first and second breakout cables 1311, 1312 can include integrated transceivers in accordance with the teachings herein. Thus, the breakout cables 1311, 1312 can have thinner cable width and/or provided enhanced communications relative to conventional cabling. Although a specific example of ports and connections has been shown, the teachings herein are applicable to a wide range of ports and configurations.

The techniques described herein can be used to reduce cabling overhead in data center applications.

For example, with reference back to FIGS. 16-17A, a thickness of the primary cable 1104 can be reduced relative to a configuration in which cabling is used to transmit data from a top-of-rack switch to rack servers without multiplexing. For example, in a 40 Gigabit Ethernet (GE) server, existing copper cabling can use 8 pairs of wires in the main trunk or primary cable of the copper cabling (four pairs for transmit, four pairs for receive). Thick cabling can be undesirable, since large cables can be difficult to cool and/or difficult to route or manage. In contrast, the illustrated breakout cable 1100 can use two pairs (one pair for transmit, one for receive) of differential micro coaxial wires in the primary cable 1104 when 4:1 multiplexing and 1:4 de-multiplexing operations are employed for transmissions between the first and second transceivers 1111, 1112. Thus, the number of wires used to transmit data can be significantly reduced as compared to existing solutions. And, where each of the individual wires is grouped together into a single cable, such as in the breakout cable example, the overall cable thickness is greatly reduced. In addition, the transceivers described herein allow for reduced thickness in the individual wires included within a cable. For instance, as discussed, certain embodiments are compatible with micro coaxial cables, which have significantly reduced diameter as compared to twisted-pair copper wires. Moreover, micro coaxial cables have improved bend radius and reduced cost as compared to twisted-pair copper wires.

In one embodiment, a primary cable or main trunk of a breakout cable has a diameter less than about 4 mm and a length of up to about 5 m. In another embodiment, a primary cable of a breakout cable has a diameter less than about 6 mm and a length between about 5 m and about 10 m. In another embodiment, a primary cable of a breakout cable has a diameter less than about 9.5 mm and a length between about 10 m and about 15 m. Although various examples of breakout cable diameters and lengths have been provided, other configurations are possible.

The table provided below illustrates some additional example embodiments achievable using different active QFSP or SFP modules including the transceivers described herein. Each of the exemplary modules operate with a cable including two or more differential pairs of micro coaxial wires. The diameter (diam.) of each individual micro coaxial wire is specified using American wire gauge (AWG), cable diameters are specified in millimeters (mm), cable length is specified in meters (m), and power is specified in Watts (W). Cable diameters include the diameter of the outer casing of the cable, where the outer casing can contain the individual micro coaxial wires. The cables can in some cases also include additional componentry including one or more separate control wires, power lines, ground lines, shielding material, and the like. For instance, in some embodiments, the examples provided below are similar to the cables 131, 132 provided in FIGS. 3A and 3B, as applicable.

| I/F Type | Data Rate | Host Side | Line Side | # of Micro Coax Pairs in Cable | Diam. of Each Micro Coax Wire (AWG) | Cable Diam. (mm) | Cable Length (m) | Power (W) |
| --- | --- | --- | --- | --- | --- | --- | --- | --- |
| QSFP | 40 Gbit/s | 4 × 10 Gbit/s (NRZ) | 1 × 40 Gbit/s (PAM4) | 2 | between about AWG 38 and about AWG 30 | ≤ about 5 mm | up to about 5 m | ≤1 W |
| QSFP | 40 Gbit/s | 4 × 10 Gbit/s (NRZ) | 1 × 40 Gbit/s (PAM4) | 2 | AWG 34 | 3.2 mm | 3 m | ≤1 W |
| QSFP | 40 Gbit/s | 4 × 10 Gbit/s (NRZ) | 1 × 40 Gbit/s (PAM4) | 2 | between about AWG 34 and about AWG 26 | ≤ about 5.5 mm | up to about 7 m | ≤1 W |
| QSFP | 40 Gbit/s | 4 × 10 Gbit/s (NRZ) | 1 × 40 Gbit/s (PAM4) | 2 | AWG 30 | 3.7 mm | 5 m | ≤1 W |
| QSFP | 40 Gbit/s | 4 × 10 Gbit/s (NRZ) | 1 × 40 Gbit/s (PAM4) | 2 | between about AWG 32 and about AWG 22 | ≤ about 8 mm | up to about 10 m | ≤1 W |
| QSFP | 40 Gbit/s | 4 × 10 Gbit/s (NRZ) | 1 × 40 Gbit/s (PAM4) | 2 | AWG 26 | 5.2 mm | 7 m | ≤1 W |
| QSFP | 40 Gbit/s | 4 × 10 Gbit/s (NRZ) | 1 × 40 Gbit/s (PAM4) | 2 | between about AWG 26 and about AWG 18 | ≤ about 9 mm | up to about 15 m | ≤1 W |
| QSFP | 40 Gbit/s | 4 × 10 Gbit/s (NRZ) | 1 × 40 Gbit/s (PAM4) | 2 | AWG 22 | about 6.3 mm | 10 m | ≤1 W |

-continued

| I/F Type | Data Rate | Host Side | Line Side | # of Micro Coax Pairs in Cable | Diam. of Each Micro Coax Wire (AWG) | Cable Diam. (mm) | Cable Length (m) | Power (W) |
|---|---|---|---|---|---|---|---|---|
| QSFP | 40 Gbit/s | 4 × 10 Gbit/s (NRZ) | 1 × 40 Gbit/s (PAM4) | 2 | between about AWG 24 and about AWG 16 | ≤ about 11 mm | up to about 20 m | ≤1 W |
| QSFP | 40 Gbit/s | 4 × 10 Gbit/s (NRZ) | 1 × 40 Gbit/s (PAM4) | 2 | AWG 22 | 9.5 mm | 15 m | ≤1 W |
| SFP+ | 40 Gbit/s | 2 × 20 Gbit/s (NRZ) | 1 × 40 Gbit/s (PAM4) | 2 | between about AWG 38 and about AWG 28 | ≤ about 5 mm | up to about 5 m | ≤1 W |
| SFP+ | 40 Gbit/s | 2 × 20 Gbit/s (NRZ) | 1 × 40 Gbit/s (PAM4) | 2 | AWG 34 | 3.2 mm | 3 m | ≤1 W |
| SFP+ | 40 Gbit/s | 2 × 20 Gbit/s (NRZ) | 1 × 40 Gbit/s (PAM4) | 2 | between about AWG 30 and about AWG 20 | ≤ about 7 mm | up to about 10 m | ≤1 W |
| SFP+ | 40 Gbit/s | 2 × 20 Gbit/s (NRZ) | 1 × 40 Gbit/s (PAM4) | 2 | AWG 26 | 5.2 mm | 7 m | ≤1 W |
| QSFP28 | 112 Gbit/s | 4 × 28 Gbit/s (NRZ) | 2 × 56 Gbit/s (PAM4) | 4 | between about AWG 38 and about AWG 28 | ≤ about 5.5 mm | up to about 4 m | ≤2 W |
| QSFP28 | 112 Gbit/s | 4 × 28 Gbit/s (NRZ) | 2 × 56 Gbit/s (PAM4) | 4 | AWG 34 | 4 mm | 3 m | ≤2 W |
| QSFP28 | 112 Gbit/s | 4 × 28 Gbit/s (NRZ) | 2 × 56 Gbit/s (PAM4) | 4 | between about AWG 38 and about AWG 28 | ≤ about 6.5 mm | up to about 5 m | ≤2 W |
| QSFP28 | 112 Gbit/s | 4 × 28 Gbit/s (NRZ) | 2 × 56 Gbit/s (PAM4) | 4 | AWG 32 | 4.7 mm | 4 m | ≤2 W |
| QSFP28 | 112 Gbit/s | 4 × 28 Gbit/s (NRZ) | 2 × 56 Gbit/s (PAM4) | 4 | between about AWG 36 and about AWG 26 | ≤ about 7 mm | up to about 7 m | ≤2 W |
| QSFP28 | 112 Gbit/s | 4 × 28 Gbit/s (NRZ) | 2 × 56 Gbit/s (PAM4) | 4 | AWG 30 | 4.8 mm | 5 m | ≤2 W |
| QSFP28 | 112 Gbit/s | 4 × 28 Gbit/s (NRZ) | 2 × 56 Gbit/s (PAM14) | 4 | between about AWG 32 and about AWG 22 | ≤ about 10 mm | up to about 9 m | ≤2 W |
| QSFP28 | 112 Gbit/s | 4 × 28 Gbit/s (NRZ) | 2 × 56 Gbit/s (PAM14) | 4 | AWG 24 | 8.9 mm | up to about 10 m | ≤2 W |

While the above embodiments can be implemented as the primary cable 1104 of a breakout cable similar to those of FIG. 16-17, other implementations are contemplated. For instance, according to some embodiments an active cable provides matching interfaces at both ends of the cable (e.g., QSFP28 to QSFP28, QSFP to QSFP, SFP+ to SFP+), rather than breaking out into multiple lower speed outputs at one end.

Certain Advantages; Terminology; Additional Embodiments

Various implementations of described in this disclosure can realize one or more of the following potential advantages. The systems and methods described herein can be used to establish high-speed point-to-point communication between two electronic devices over a lossy, noisy and/or dispersive channel. The systems and methods described herein can advantageously deliver digital and/or analog data at various bit-rates reliably in the presence of intersymbol interference (ISI) and other signal impairments caused due to a lossy, noisy, non-linear and/or dispersive channel. Various implementations of the digital clock and data recovery systems described herein include a first feedback path to recover a clock signal and a second feedback path to recover a data signal. Providing separate clock and data recovery paths can allow for simultaneous data recovery with high resolution and fast clock recovery with low latency. Additionally, the clock and data recovery systems described herein can be used to recover clock and data signals from data encoded in different modulation formats (e.g., NRZ or multi-level modulation format, such as, for example PAM-4, PAM-8, PAM-16, PAM-64, etc.). Furthermore, the systems and methods described herein are configured to reduce power consumption by virtue of being implemented with digital processing systems and digital logic controllers. Accordingly, the systems and methods described herein can provide fast (e.g., at data rates greater than 10 Gbit/s), reliable, high-speed communication between different electronic, computing, storage and peripheral devices by consuming lower power.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of electronic devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, e.g., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. Storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not only the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A transceiver integrated circuit (IC) for a communication system, wherein the transceiver IC comprises:
    a differential transmitter configured to generate a differential signal for transmission via an external cable, wherein the differential transmitter comprises:
        a first transmitter configured to generate a non-inverted component of the differential signal, wherein the first transmitter is configured to receive a first data signal and a first clock signal that controls timing of transmissions of the first transmitter; and
        a second transmitter configured to generate an inverted component of the differential signal, wherein the second transmitter is configured to receive a second data signal and a second clock signal that controls timing of transmissions of the second transmitter; and
    a skew adjustment circuit configured to provide a first amount of skew adjustment to the differential transmitter by adjusting a relative delay between the first data signal and the second data signal, and to provide a second amount of skew adjustment to the differential transmitter by adjusting a relative delay between the first clock signal and the second clock signal.

2. The transceiver IC of claim 1, wherein the first transmitter comprises a first digital-to-analog converter (DAC) configured to generate the non-inverted component of the differential signal based on converting the first data signal, and the second transmitter comprises a second DAC configured to generate the inverted component of the differential signal based on converting the second data signal.

3. The transceiver IC of claim 1, wherein the first amount of skew adjustment comprises a coarse adjustment and the second amount of skew adjustment comprises a fine adjustment having a finer resolution than the coarse adjustment, wherein the skew adjustment circuit is configured to provide the second amount of skew adjustment after the first amount of skew adjustment.

4. The transceiver IC of claim 1, wherein the transceiver IC further comprises a skew control circuit configured to receive a skew indication signal indicating a skew of the differential signal, and to control at least one of the first amount of skew adjustment and the second amount of skew adjustment provided by the skew adjustment circuit based on the skew indication signal.

5. The transceiver IC of claim 4, wherein the skew control circuit is further configured to incrementally control the at least one of the first amount of skew adjustment and the second amount of skew adjustment until the skew indication signal indicates that a direction of the skew has reversed.

6. The transceiver IC of claim 1, wherein the skew adjustment circuit comprises a clock generation unit configured to generate at least one clock signal having a clock cycle, and a first phase selection circuit configured to provide the first amount of skew adjustment by providing phase adjustment in full increments of the clock cycle.

7. The transceiver IC of claim 6, wherein the skew adjustment circuit further comprises a second phase selection circuit configured to provide the second amount of skew adjustment by providing phase adjustment in increments of less than the clock cycle.

8. A communication system comprising:
    a cable; and
    a first integrated circuit (IC) comprising:
        a differential transmitter configured to transmit a differential signal over the cable, wherein the differential transmitter comprises a first transmitter configured to generate a non-inverted component of the differential signal and a second transmitter configured to generate an inverted component of the differential signal, wherein the first transmitter is configured to receive a first data signal and a first clock signal that controls timing of transmissions of the first transmitter, and wherein the second transmitter is configured to receive a second data signal and a second clock signal that controls timing of transmissions of the second transmitter; and
        a skew adjustment circuit configured to provide a first amount of skew adjustment to the differential transmitter by adjusting a relative delay between the first data signal and the second data signal, and to provide a second amount of skew adjustment to the differential transmitter by adjusting a relative delay between the first clock signal and the second clock signal.

9. The communication system of claim 8, further comprising a second IC comprising a differential receiver configured to receive the differential signal from the cable.

10. The communication system of claim 9, wherein the second IC further comprises a skew detector configured to generate a skew indication signal indicating a skew between the non-inverted component and the inverted component of the differential signal, and a skew transmitter configured to transmit the skew indication signal to the first IC.

11. The communication system of claim 10, wherein the cable comprises a pair of micro coaxial lines configured to carry the differential signal and a control line configured to carry the skew indication signal.

12. The communication system of claim 8, wherein the first transmitter comprises a first digital-to-analog converter (DAC) configured to generate the non-inverted component of the differential signal based on converting the first data signal, and the second transmitter comprises a second DAC configured to generate the inverted component of the differential signal based on converting the second data signal.

13. The communication system of claim 8, wherein the first amount of skew adjustment comprises a coarse adjustment and the second amount of skew adjustment comprises a fine adjustment having a finer resolution than the coarse adjustment, wherein the skew adjustment circuit is configured to provide the second amount of skew adjustment after the first amount of skew adjustment.

14. The communication system of claim 8, wherein the first IC further comprises a skew control circuit configured to receive a skew indication signal indicating a skew of the differential signal, and to control at least one of the first amount of skew adjustment and the second amount of skew adjustment provided by the skew adjustment circuit based on the skew indication signal.

15. The communication system of claim 14, wherein the skew control circuit is further configured to incrementally control at at least one of the first amount of skew adjustment and the second amount of skew adjustment until the skew indication signal indicates that a direction of the skew has reversed.

16. The communication system of claim 8, wherein the skew adjustment circuit comprises a clock generation unit configured to generate at least one clock signal having a clock cycle, and a first phase selection circuit configured to provide the first amount of skew adjustment by providing phase adjustment in full increments of the clock cycle.

17. The communication system of claim 16, wherein the skew adjustment circuit further comprises a second phase selection circuit configured to provide the second amount of skew adjustment by providing phase adjustment in increments of less than the clock cycle.

18. A method of skew correction in a communication system, the method comprising:
  transmitting a non-inverted component of a differential signal over a cable using a first transmitter of a differential transmitter;
  transmitting an inverted component of the differential signal over the cable using a second transmitter of the differential transmitter;
  providing a first amount of skew adjustment to the differential transmitter by adjusting a relative delay between a first data signal inputted to the first transmitter and a second data signal inputted to the second transmitter; and
  providing a second amount of skew adjustment to the differential transmitter by adjusting a relative delay between a first clock signal for timing transmissions of the first transmitter and a second clock signal for timing transmissions of the second transmitter,
  wherein the first clock signal is inputted to the first transmitter and the second clock signal is inputted to the second transmitter.

19. The method of claim 18, further comprising receiving the differential signal at a differential receiver via the cable, observing a skew of the differential signal using a skew detector of the differential receiver, and controlling the first amount of skew adjustment and the second amount of skew adjustment based on the observed skew.

20. The method of claim 18, further comprising providing the second amount of skew adjustment after the first amount of skew adjustment, wherein the first amount of skew adjustment comprises a coarse adjustment and the second amount of skew adjustment comprises a fine adjustment having a finer resolution than the coarse adjustment.

* * * * *